United States Patent
Koezuka et al.

(10) Patent No.: US 9,991,392 B2
(45) Date of Patent: Jun. 5, 2018

(54) SEMICONDUCTOR DEVICE AND MANUFACTURING METHOD THEREOF

(71) Applicant: SEMICONDUCTOR ENERGY LABORATORY CO., LTD., Atsugi-shi, Kanagawa-ken (JP)

(72) Inventors: Junichi Koezuka, Tochigi (JP); Yukinori Shima, Gunma (JP); Masami Jintyou, Tochigi (JP); Takashi Hamochi, Tochigi (JP); Satoshi Higano, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 14/550,091

(22) Filed: Nov. 21, 2014

(65) Prior Publication Data

US 2015/0214376 A1    Jul. 30, 2015

(30) Foreign Application Priority Data

Dec. 3, 2013 (JP) ................................. 2013-250449

(51) Int. Cl.
*H01L 29/786* (2006.01)
*H01L 29/417* (2006.01)
(Continued)

(52) U.S. Cl.
CPC ........ *H01L 29/7869* (2013.01); *G02F 1/1368* (2013.01); *G02F 1/136286* (2013.01);
(Continued)

(58) Field of Classification Search
CPC . H01L 29/86; H01L 29/4958; H01L 21/3211; H01L 29/45; H01L 29/4908;
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   101740631 A   6/2010
CN   102598095 A   7/2012
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Caridad Everhart
(74) *Attorney, Agent, or Firm* — Fish & Richardson P.C.

(57) ABSTRACT

To provide a novel semiconductor device which includes a transistor and a metal film containing Cu for a wiring, a signal line, or the like. The semiconductor device includes a first wiring, a second wiring, a first transistor, and a second transistor. The first wiring is electrically connected to a source or a drain of the first transistor, and the second wiring is electrically connected to a gate of the second transistor. The first wiring and the second wiring each include a Cu—X alloy film (X is Mn, Ni, Cr, Fe, Co, Mo, Ta, or Ti). The Cu—X alloy film in the first wiring is connected to the Cu—X alloy film in the second wiring.

24 Claims, 43 Drawing Sheets

(51) Int. Cl.
*H01L 29/423* (2006.01)
*H01L 29/45* (2006.01)
*H01L 29/49* (2006.01)
*G02F 1/1368* (2006.01)
*H01L 23/532* (2006.01)
*G02F 1/1362* (2006.01)
*H01L 27/12* (2006.01)

(52) U.S. Cl.
CPC ...... *H01L 23/53233* (2013.01); *H01L 27/124* (2013.01); *H01L 27/1225* (2013.01); *H01L 29/41733* (2013.01); *H01L 29/42384* (2013.01); *H01L 29/45* (2013.01); *H01L 29/4908* (2013.01); *H01L 29/4966* (2013.01); *H01L 29/786* (2013.01); *G02F 2001/13629* (2013.01); *G02F 2001/136295* (2013.01); *H01L 2924/0002* (2013.01)

(58) Field of Classification Search
CPC ............ H01L 27/124; H01L 27/2252; H01L 27/1225; H01L 2924/0002; H01L 2924/00; H01L 2994/0002; H01L 20/45; H01L 45/2958; H01L 29/41732; H01L 29/7869; H01L 23/53233; G02F 1/1368; G02F 1/136286; G02F 2001/136295; G02F 1/2369; G02F 2001/13629
USPC .......................................................... 257/249
See application file for complete search history.

(56) References Cited

U.S. PATENT DOCUMENTS

| | | | |
|---|---|---|---|
| 5,952,677 A * | 9/1999 | Park | H01L 29/66765 257/352 |
| 6,255,706 B1 * | 7/2001 | Watanabe | H01L 29/458 257/350 |
| 6,294,274 B1 | 9/2001 | Kawazoe et al. | |
| 6,297,519 B1 * | 10/2001 | Fujikawa | H01L 29/458 257/59 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,319,216 B2 | 11/2012 | Akimoto et al. | |
| 8,405,086 B1 * | 3/2013 | Hou | G02F 1/136227 257/59 |
| 8,502,216 B2 | 8/2013 | Akimoto et al. | |
| 8,680,526 B2 | 3/2014 | Nakayama et al. | |
| 8,866,140 B2 | 10/2014 | Koike et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0275038 A1 * | 12/2005 | Shih | H01L 29/78633 257/382 |
| 2006/0006794 A1 | 1/2006 | Sakakura et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0096015 A1 * | 4/2008 | Yan | H01L 27/12 428/336 |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045399 A1 | 2/2009 | Kaji et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0045887 A1 | 2/2010 | Koike et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0117076 A1 | 5/2010 | Akimoto et al. | |
| 2010/0233847 A1 | 9/2010 | Ohara et al. | |
| 2010/0258806 A1 | 10/2010 | Nakayama et al. | |

(56) References Cited

U.S. PATENT DOCUMENTS

| | | | |
|---|---|---|---|
| 2010/0289020 A1* | 11/2010 | Yano | H01L 29/78603 257/43 |
| 2011/0003418 A1 | 1/2011 | Sakata et al. | |
| 2011/0024751 A1 | 2/2011 | Yamazaki et al. | |
| 2011/0032467 A1* | 2/2011 | Koike | C03C 17/3649 349/139 |
| 2011/0057170 A1* | 3/2011 | Tsai | H01L 27/3244 257/40 |
| 2011/0115839 A1 | 5/2011 | Takahashi et al. | |
| 2011/0121300 A1 | 5/2011 | Miyairi et al. | |
| 2011/0133181 A1 | 6/2011 | Yamazaki | |
| 2011/0136301 A1 | 6/2011 | Yamazaki et al. | |
| 2011/0147733 A1 | 6/2011 | Kao et al. | |
| 2011/0193077 A1 | 8/2011 | Yamazaki | |
| 2012/0104385 A1 | 5/2012 | Godo et al. | |
| 2012/0112181 A1* | 5/2012 | Lee | H01L 27/1225 257/43 |
| 2012/0112184 A1 | 5/2012 | Yamazaki et al. | |
| 2012/0132903 A1 | 5/2012 | Yamazaki et al. | |
| 2012/0161121 A1 | 6/2012 | Yamazaki | |
| 2012/0217500 A1* | 8/2012 | Park | H01L 29/45 257/59 |
| 2012/0319112 A1 | 12/2012 | Cho et al. | |
| 2013/0112972 A1* | 5/2013 | Koike | H01L 29/45 257/43 |
| 2013/0168671 A1 | 7/2013 | Koike et al. | |
| 2013/0207111 A1 | 8/2013 | Yamazaki | |
| 2013/0208205 A1 | 8/2013 | Misaki | |
| 2013/0267068 A1 | 10/2013 | Hanaoka et al. | |
| 2013/0299819 A1 | 11/2013 | Yamazaki et al. | |
| 2013/0299824 A1 | 11/2013 | Akimoto et al. | |
| 2013/0302938 A1 | 11/2013 | Sato et al. | |
| 2014/0070207 A1* | 3/2014 | Koike | H01L 29/7869 257/43 |
| 2014/0087517 A1 | 3/2014 | Akimoto et al. | |
| 2014/0175424 A1* | 6/2014 | Choi | H01L 21/77 257/43 |
| 2015/0076467 A1* | 3/2015 | Sasaki | H01L 21/31111 257/40 |
| 2015/0155313 A1 | 6/2015 | Yamazaki et al. | |
| 2015/0155362 A1 | 6/2015 | Nakazawa et al. | |
| 2015/0155363 A1 | 6/2015 | Nakazawa et al. | |
| 2015/0287836 A1* | 10/2015 | Lee | H01L 29/7869 257/59 |

FOREIGN PATENT DOCUMENTS

| | | |
|---|---|---|
| CN | 102832253 A | 12/2012 |
| CN | 102971857 A | 3/2013 |
| EP | 1737044 A | 12/2006 |
| EP | 2226847 A | 9/2010 |
| EP | 2535936 A | 12/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2008-282887 A | 11/2008 |
| JP | 2010-135772 A | 6/2010 |
| JP | 2010-245366 A | 10/2010 |
| JP | 2013-004958 A | 1/2013 |
| JP | 2013-054357 A | 3/2013 |
| JP | 5453663 | 3/2014 |
| KR | 2010-0051562 A | 5/2010 |
| KR | 2012-0103627 A | 9/2012 |
| KR | 2012-0138074 A | 12/2012 |
| TW | 201034191 | 9/2010 |
| TW | 201041145 | 11/2010 |
| TW | 201207798 | 2/2012 |
| WO | WO-2004/114391 | 12/2004 |
| WO | WO-2011/058885 | 5/2011 |
| WO | WO-2012/002573 | 1/2012 |
| WO | WO-2012/002574 | 1/2012 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

(56) References Cited

OTHER PUBLICATIONS

Hsieh.H et al., "P-29:Modeling of Amorphous Oxide Semiconductor Thin Film Transistors and Subgap Density of States", SID Digest '08 : SID International Symposiun Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YBFE2O4, and YB2FE3O7 Types of Structures for Compounds in The In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2008, pp. 191-193.

Li.C et al., "Modulated Structures of Homologous Compounds InMo3(ZnO)m (M=in,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review, B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262105-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/IB2014/066306) Dated Mar. 10, 2015.

Written Opinion (Application No. PCT/IB2014/066306) Dated Mar. 10, 2015.

\* cited by examiner

160

160

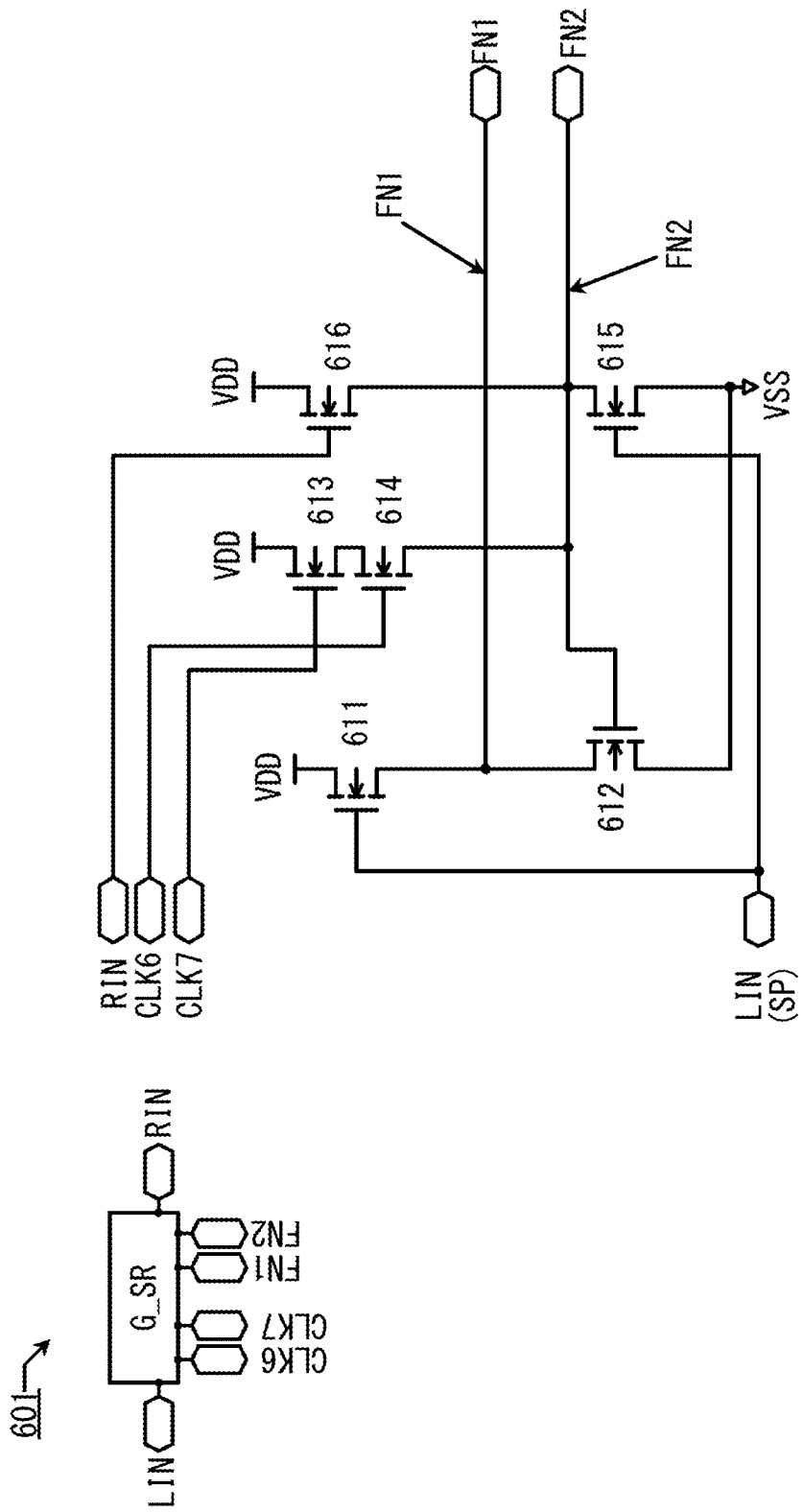

603

10 nm 2 nm 2 nm 2 nm

Electron beam enters in direction parallel to sample surface

Electron beam enters in direction perpendicular to sample surface

SEMICONDUCTOR DEVICE AND MANUFACTURING METHOD THEREOF

TECHNICAL FIELD

One embodiment of the present invention relates to a semiconductor device including an oxide semiconductor and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

Note that in this specification, a semiconductor device refers to a semiconductor element itself or a device including a semiconductor element. As an example of such a semiconductor element, for example, a transistor (a thin film transistor and the like) can be given. In addition, a display device such as a liquid crystal panel or an organic EL panel includes a semiconductor device in some cases.

BACKGROUND ART

There is a trend in a display device using a transistor (e.g., a liquid crystal panel and an organic EL panel) toward a larger screen. As the screen size becomes larger, in the case of a display device using an active element such as a transistor, a voltage applied to an element varies depending on the position of a wiring which is connected to the element due to wiring resistance, which cause a problem of deterioration of display quality such as display unevenness and a defect in grayscale.

Conventionally, an aluminum film has been widely used as a material used for the wiring, the signal line, or the like; moreover, research and development of using a copper (Cu) film as a material is extensively conducted to further reduce resistance. However, a Cu film is disadvantageous in that adhesion thereof to a base film is low and that characteristics of a transistor easily deteriorate due to diffusion of Cu in the Cu film into a semiconductor layer of the transistor. Note that a silicon-based semiconductor material is widely known as a material for a semiconductor thin film applicable to a transistor, and as another material, an oxide semiconductor has attracted attention (see Patent Document 1).

Furthermore, a Cu—Mn alloy is disclosed as an ohmic electrode formed over a semiconductor layer including an oxide semiconductor material containing indium (see Patent Document 2).

REFERENCE

Patent Documents

[Patent Document 1] Japanese Published Patent Application No. 2007-123861
[Patent Document 2] PCT International Publication No. 2012/002573

DISCLOSURE OF INVENTION

In the case where copper (Cu) is used as a wiring material of the semiconductor device, a method in which a barrier layer of titanium nitride, tungsten nitride, tantalum nitride, or the like is provided on a side surface or a lower surface of the Cu wiring to prevent diffusion of Cu is generally known. The barrier film has high resistance and contact resistance in a contact portion between the wirings is high. Therefore, wiring delay is caused.

An object of one embodiment of the present invention is to provide a novel semiconductor device which includes a transistor and a wiring, a signal line, or the like formed using a metal film containing Cu. Another object of one embodiment of the present invention is to provide a method for manufacturing a semiconductor device which includes a transistor and a wiring, a signal line, or the like formed using a metal film containing Cu. Another object of one embodiment of the present invention is to provide a semiconductor device which includes a transistor and in which wiring delay is suppressed. Another object of one embodiment of the present invention is to provide a highly reliable semiconductor device including a transistor. Another object of one embodiment of the present invention is to provide a novel semiconductor device and a method for manufacturing the novel semiconductor device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention is a semiconductor device including a first wiring, a second wiring, a first transistor, and a second transistor. The first wiring is electrically connected to a source or a drain of the first transistor, and the second wiring is electrically connected to a gate of the second transistor. The first wiring and the second wiring each include a Cu—X alloy film (X is Mn, Ni, Cr, Fe, Co, Mo, Ta, or Ti). The first wiring is connected to the second wiring in the Cu—X alloy film.

In the above embodiment, the first wiring includes a first Cu—Mn alloy film, a first Cu film over the first Cu—Mn alloy film, and a second Cu—Mn alloy film over the first Cu film.

In the above embodiment, the second wiring includes a third Cu—Mn alloy film, a second Cu film over the third Cu—Mn alloy film, and a fourth Cu—Mn alloy film over the second Cu film.

In the above embodiment, an inclination angle between a surface on which the first wiring is formed and a side surface of the first wiring is preferably greater than or equal to 30° and less than or equal to 70°.

In the above embodiment, an inclination angle between a surface on which the second wiring is formed and a side surface of the second wiring is preferably greater than or equal to 30° and less than or equal to 70°.

In the above embodiment, the first wiring and the second wiring are connected to an insulating film containing oxygen through manganese oxide.

One embodiment of the present invention is a display device including the semiconductor device described in the above embodiment.

One embodiment of the present invention is an electronic device that includes the display device described in the above embodiment and at least one of a microphone, a speaker, and an operation key.

Note that in this specification, ordinal numbers such as "first", "second", and "third" are used in order to avoid confusion among components, and thus do not limit the number of the components.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode layer) and a source (a source terminal, a source region, or a source electrode layer), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

According to one embodiment of the present invention, a novel semiconductor device which includes a transistor and a wiring, a signal line, or the like formed using a metal film containing Cu can be provided. According to one embodiment of the present invention, a method for manufacturing a semiconductor device which includes a transistor and a wiring, a signal line, or the like formed using a metal film containing Cu can be provided. According to one embodiment of the present invention, a semiconductor device which includes a transistor and in which wiring delay is suppressed can be provided. According to one embodiment of the present invention, a highly reliable semiconductor device using a transistor can be provided. According to one embodiment of the present invention, a novel semiconductor device or a method for manufacturing the novel semiconductor device can be provided.

Note that the descriptions of these effects do not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 20A and 20B illustrate a shift register unit;

BEST MODE FOR CARRYING OUT THE INVENTION

Figure 1A:
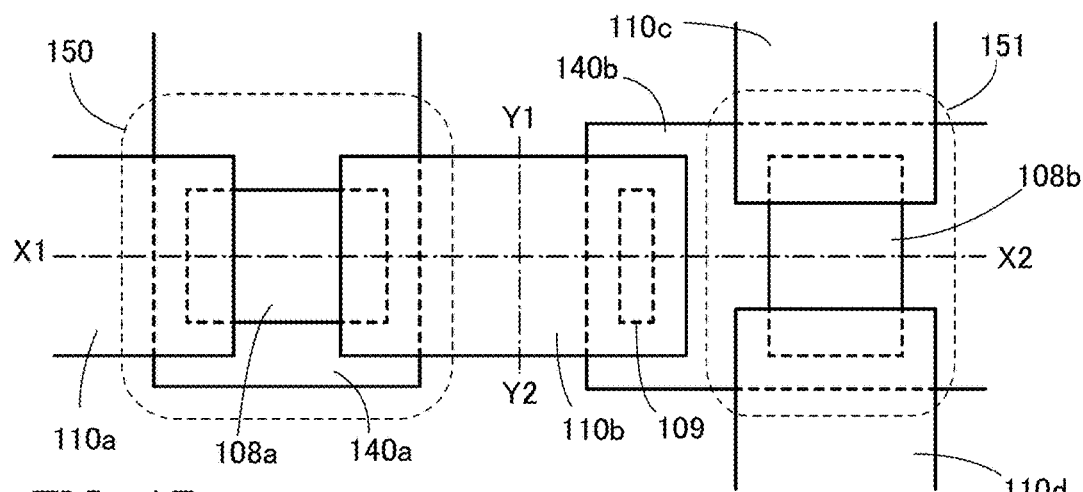
FIGS. 1A and 1B are a top view and a cross-sectional view of a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Embodiment 1

In this embodiment, a semiconductor device of one embodiment of the present invention is described with reference to drawings.

<Structure Example 1 of Semiconductor Device>

Figure 1B:
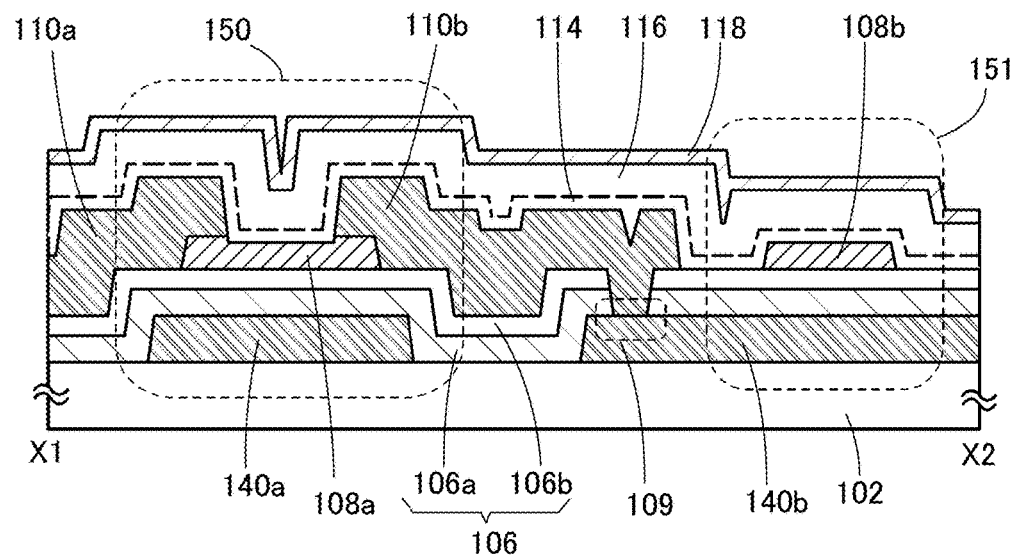

FIG. 1A is a top view illustrating a semiconductor device 160 of one embodiment of the present invention, and FIG. 1B is a cross-sectional view taken along dashed-dotted line X1-X2 in FIG. 1A. Note that in FIG. 1A, some components of the semiconductor device 160 are not illustrated to avoid complexity.

The semiconductor device 160 includes a transistor 150 and a transistor 151. FIG. 1B is a cross-sectional view of the transistor 150 in the channel length direction and a cross-sectional view of the transistor 151 in the channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

The transistor 150 includes a conductive film 140a over a substrate 102, an insulating film 106 over the substrate 102 and the conductive film 140a, an oxide semiconductor film 108a which is over the insulating film 106 and overlaps with the conductive film 140a, and a pair of electrode layers 110a and 110b electrically connected to the oxide semiconductor film 108a. The conductive film 140a functions as a gate electrode of the transistor 150, the insulating film 106 functions as a gate insulating film of the transistor 150, and the pair of electrode layers 110a and 110b functions as a source electrode and a drain electrode of the transistor 150. The insulating film 106 has a two-layer structure of an insulating film 106a and an insulating film 106b. Note that the structure of the insulating film 106 is not limited thereto, and the insulating film 106 may have a single-layer structure or a stacked-layer structure including three or more layers.

The transistor 151 includes a conductive film 140b over the substrate 102, the insulating film 106 over the substrate 102 and the conductive film 140b, an oxide semiconductor film 108b which is over the insulating film 106 and overlaps with the conductive film 140b, and a pair of electrode layers 110c and 110d electrically connected to the oxide semiconductor film 108b. The conductive film 140b functions as a gate electrode of the transistor 151, the insulating film 106 functions as a gate insulating film of the transistor 151, and the pair of electrode layers 110c and 110d function as a source electrode and a drain electrode of the transistor 151.

Furthermore, in FIG. 1B, over the transistors 150 and 151, specifically, over the oxide semiconductor films 108a and 108b and the pair of electrode layers 110a and 110b, an insulating film 114, an insulating film 116, and an insulating film 118 which function as protective insulating films of the transistors 150 and 151 are provided.

The electrode layer 110b of the transistor 150 and the conductive film 140b of the transistor 151 are electrically connected to each other through a contact hole 109. In other words, the source electrode layer or the drain electrode layer of the transistor 150 is electrically connected to the gate electrode layer of the transistor 151.

In the transistor 150, the pair of electrode layers 110a and 110b includes at least a Cu—X alloy film ((X is Mn, Ni, Cr, Fe, Co, Mo, Ta, or Ti), hereinafter, simply referred to as a Cu—X alloy film); for example, it is preferable to use a single-layer structure of a Cu—X alloy film or a stacked-layer structure of a Cu—X alloy film and a conductive film including a low resistance material such as copper (Cu), aluminum (Al), gold (Au), or silver (Ag), an alloy of any of these materials, or a compound containing any of these materials as its main component.

It is preferable that the Cu—X alloy film included in the pair of electrode layers 110a and 110b be in contact with the oxide semiconductor film 108a. In the case where the Cu—X alloy film is in contact with the oxide semiconductor film 108a, X in the Cu—X alloy film forms an oxide film of X at an interface with the oxide semiconductor film 108a in some cases. With the oxide film, entry of Cu in the Cu—X alloy film into the oxide semiconductor film 108a can be prevented.

For example, a Cu—Mn alloy film is used as the pair of electrode layers 110a and 110b. When the Cu—Mn alloy film is used as the pair of electrode layers 110a and 110b, adhesion with a base film, here, the insulating film 106b and the oxide semiconductor film 108a can be increased. With the Cu—Mn alloy film, a favorable ohmic contact with the oxide semiconductor film 108a can be made.

In the transistor 150, the conductive film 140a includes at least a Cu—X alloy film; for example, it is preferable to use a single-layer structure of a Cu—X alloy film or a stacked-layer structure of a Cu—X alloy film and a conductive film including a low resistance material such as copper (Cu), aluminum (Al), gold (Au), or silver (Ag), an alloy of any of these materials, or a compound containing any of these materials as its main component.

It is preferable that the Cu—X alloy film included in the conductive film 140a be in contact with the insulating film 106a. In the case where the insulating film 106a contains oxygen, when the Cu—X alloy film is in contact with the insulating film 106a, X in the Cu—X alloy film forms an oxide film of X at an interface with the insulating film 106a in some cases. With the oxide film, entry of Cu in the Cu—X alloy film into the oxide semiconductor film 108a through the insulating film 106 can be prevented.

For example, a Cu—Mn alloy film is used for the conductive film 140a. When the Cu—Mn alloy film is used as the conductive film 140a, adhesion with the substrate 102 and the insulating film 106 can be increased.

The pair of electrode layers 110a and 110b and the conductive film 140a also function as lead wirings or the like. The pair of electrode layers 110a and 110b and the conductive film 140a include a Cu—X alloy film or a Cu—X alloy film and a conductive film containing a low resistance material such as copper (Cu), aluminum (Al), gold (Au), or silver (Ag); thus, even in the case where a large-sized substrate is used as the substrate 102, a semiconductor device in which wiring delay is suppressed can be manufactured.

When the pair of electrode layers 110a and 110b and the conductive film 140a have the above structure, a highly reliable semiconductor device in which entry of Cu into the oxide semiconductor film 108a is prevented and wiring delay is suppressed can be provided.

Note that the mentioned above can apply to the pair of electrode layers 110c and 110d and the conductive film 140b of the transistor 151. When the pair of electrode layers 110c and 110d and the conductive film 140b have the above structure, a highly reliable semiconductor device in which entry of Cu into the oxide semiconductor film 108b is prevented and wiring delay is suppressed can be provided.

In the case where both the electrode layer 110b and the conductive film 140b include a Cu—X alloy film, the Cu—X alloy film included in the electrode layer 110b is preferably in contact with the Cu—X alloy film included in the conductive film 140b through the contact hole 109. When the Cu—X alloy films are in contact with each other, contact resistance can be reduced, and thus even in the case where a large-sized substrate is used as the substrate 102, a semiconductor device in which wiring delay is suppressed can be manufactured.

For the oxide semiconductor film 108a, an In—Ga oxide, an In—Zn oxide, or an In-M-Zn oxide (M is Ti, Ga, Y, Zr, La, Ce, Nd, Sn, or Hf) can be used. In addition, it is preferable that the oxide semiconductor film 108a include a crystal portion and the c-axis in the crystal portion be aligned in the direction parallel to a normal vector of a surface on which the oxide semiconductor film 108a is formed. In the case where the oxide semiconductor film 108a includes the crystal portion, entry of Cu in the pair of electrode layers 110a and 110b and the conductive film 140a into the oxide semiconductor film 108a can be prevented. Note that a CAAC-OS described later is preferably used for the oxide semiconductor film 108a having the crystal portion.

As illustrated in the transistor 150 in FIG. 1B, the thickness of a region of the oxide semiconductor film 108a which does not overlap with the pair of electrode layers 110a and 110b is smaller than that of a region of the oxide semiconductor film 108a which overlaps with the pair of electrode layers 110a and 110b. When the thickness of the region of the oxide semiconductor film 108a which does not overlap with the pair of electrode layers 110a and 110b is small, impurities (here, Cu) diffused from the pair of electrode layers 110a and 110b can be removed. Thus, a surface of the oxide semiconductor film 108a, i.e., a surface of the transistor 150 on the back channel side is cleaned, so that a highly reliable semiconductor device in which a reduction in electrical characteristics is suppressed and which has preferable electrical characteristics can be provided. Depending on circumstances or conditions, the thickness of the region of the oxide semiconductor film 108a which does not overlap with the pair of electrode layers 110a and 110b may be substantially the same as that of the region of the oxide semiconductor film 108a which overlaps with the pair of electrode layers 110a and 110b.

The mentioned above can apply to the oxide semiconductor film 108b of the transistor 151.

Figure 2A:
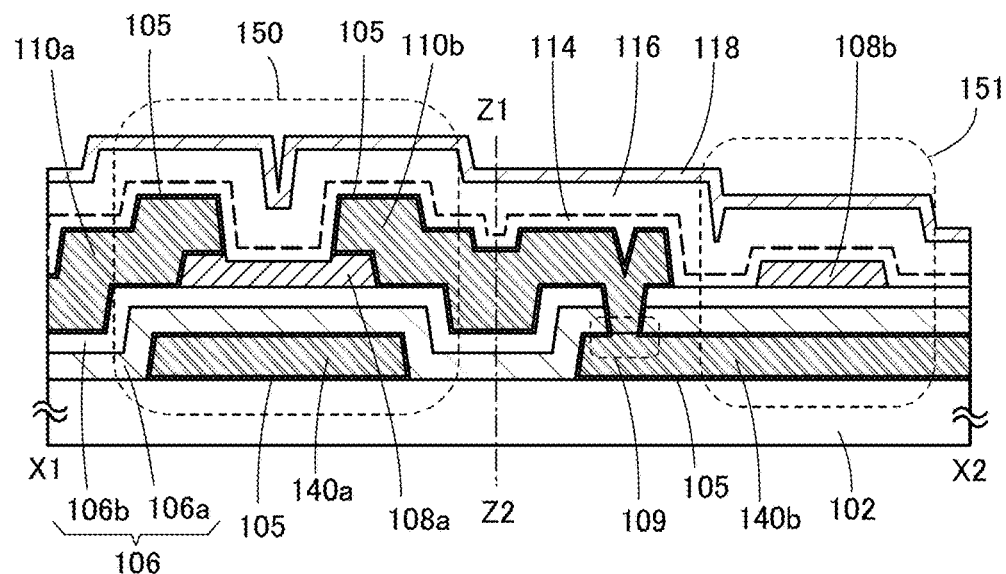
FIGS. 2A and 2B are cross-sectional views of a semiconductor device.

The semiconductor device 160 in FIG. 2A is an example of the case where heat treatment is performed on the semiconductor device 160 in FIG. 1B. The semiconductor device 160 in FIG. 2A is different from the semiconductor device 160 in FIG. 1B in that an oxide film 105 is formed to surround the electrode layers 110a to 110d and the conductive films 140a and 140b. The structure of the semiconductor device 160 in FIG. 2A is the same as that of the semiconductor device 160 in FIG. 1B, except for the above.

Figure 2B:
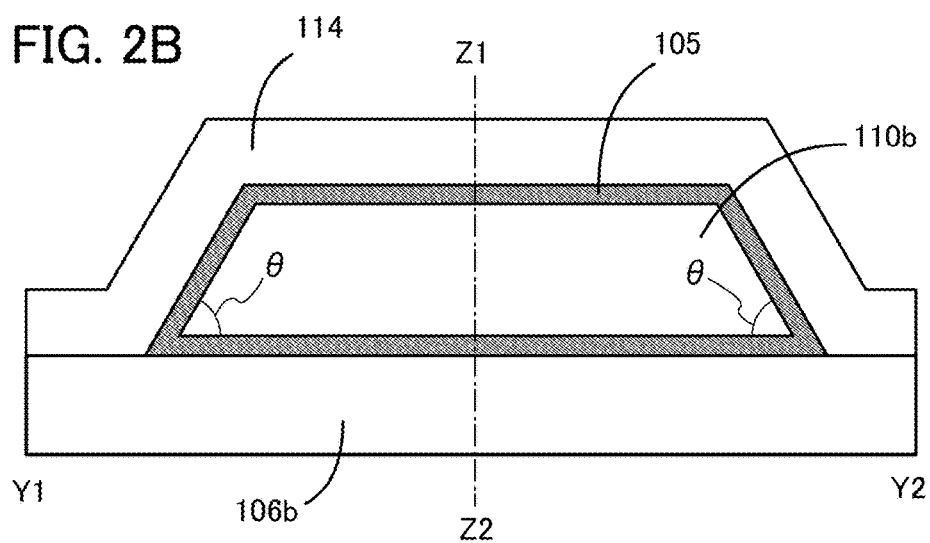

FIG. 2B is a cross-sectional view taken along dashed-dotted line Z1-Z2 in FIG. 2A. Only the electrode layer 110b and the insulating films in contact with the electrode layer 110b are illustrated. The hatching pattern of the electrode layer 110b is not illustrated to avoid complexity.

The oxide film 105 is formed in such a manner that an oxide (here, referred to as an oxide semiconductor film or an insulating film containing oxygen) and a conductive film containing a Cu—X alloy are in contact with each other and heated and X in the Cu—X alloy is segregated in the vicinity of an interface between the oxide and the conductive film and reacts with oxygen. In the case where X is Mn, examples of a substance contained in the oxide film 105 include a Mn oxide, an In—Mn oxide (in the case where the oxide contains In), a Ga—Mn oxide (in the case where the oxide contains Ga), an In—Ga—Mn oxide (in the case where the oxide contains In and Ga), an In—Ga—Zn—Mn oxide (in the case where the oxide contains In, Ga, and Zn), a Si—Mn oxide (in the case where the oxide contains silicon), an Al—Mn oxide (in the case where the oxide contains aluminum), and a Hf—Mn oxide (in the case where the oxide contains hafnium).

The heat treatment may be performed at a temperature higher than or equal to 100° C. and lower than or equal to 650° C., preferably higher than or equal to 150° C. and lower than or equal to 500° C., further preferably higher than or equal to 200° C. and lower than or equal to 350° C. The heat treatment may be performed using heat applied to the substrate in the formation step of the conductive film, the electrode layer, or the insulating film.

As illustrated in FIG. 2B, the oxide film 105 is formed at an interface between the electrode layer 110b and the insulating film 114 and an interface between the electrode layer 110b and the insulating film 106b to surround the electrode layer 110b. In order to form the oxide film 105, the insulating film 114 and the insulating film 106b are preferably formed using a silicon oxide film, a silicon oxynitride film, or a silicon nitride oxide film.

The taper angle θ of the electrode layer 110b in FIG. 2B is preferably greater than or equal to 30° and less than or equal to 70°. The electrode layer 110b preferably has the taper angle θ in the above range because favorable coverage with the insulating film 114 formed on the electrode layer 110b is obtained. Note that the taper angle refers to an inclination angle between a surface on which the electrode layer 110b is formed and a side surface of the electrode layer 110b when the electrode layer 110b is observed from the direction perpendicular to its cross section. The taper angle of a side surface with continuous curvature refers to an inclination angle between the surface on which the electrode layer 110b is formed and a given point of the side surface with continuous curvature.

As illustrated in FIG. 2A, the high resistance oxide film 105 is not formed in the contact hole 109. Therefore, even when the heat treatment is performed, contact resistance between the electrode layer 110b and the conductive film 140a can be kept low.

By the oxide film 105, Cu included in the electrode layers 110a to 110d and the conductive films 140a and 140b can be prevented from diffusing into the outside of the electrodes and adversely affecting the oxide semiconductor films 108a and 108b. When the semiconductor device 160 has the above structure, a highly reliable semiconductor device in which wiring delay is suppressed can be provided.

Other constituent elements of the semiconductor device of this embodiment are described below in detail.

<Substrate>

There is no particular limitation on the property of a material and the like of the substrate 102 as long as the material has heat resistance enough to withstand at least heat treatment performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Furthermore, any of these substrates further provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized display device can be manufactured.

An insulating film may be provided between the substrate 102 and the conductive films 140a and 140b. The insulating film can have a single-layer structure or a stacked-layer structure including an insulating film formed of silicon oxide, silicon oxynitride, silicon nitride, or the like by a chemical vapor deposition (CVD) method, a sputtering method, a thermal oxidation method, or the like.

For example, in this specification and the like, transistors can be formed using a variety of substrates as the substrate 102 and the other substrates used in this specification and the like. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrates over which transistors can be formed, a paper substrate, a cellophane substrate, an aramid film substrate, a polyimide film substrate, a stone substrate, a wood substrate, cloth substrates (including a natural fiber (e.g., silk, cotton, and hemp), a synthetic fiber (e.g., nylon, polyurethane, and polyester), and a regenerated fiber (e.g., acetate, cupra, rayon, and regenerated polyester)), a leather substrate, and a rubber substrate. The use of such a substrate enables formation of a transistor with excellent properties, a transistor with low power consumption, or a device with high durability, high heat resistance, or a reduction in weight or thickness.

<Gate Insulating Film>

As each of the insulating films 106a and 106b functioning as a gate insulating film of the transistor, an insulating film including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. The insulating film 106 is not limited to a two-layer structure, and a single-layer structure selected from the above films or a stacked structure of three or more layers selected from the above films may be employed.

Note that the insulating film 106b that is in contact with the oxide semiconductor films 108a and 108b functioning as channel regions of the transistors is preferably an oxide insulating film and preferably has a region (oxygen-excess region) containing oxygen in excess of the stoichiometric composition. In other words, the insulating film 106b is an insulating film capable of releasing oxygen. In order to provide the oxygen-excess region in the insulating film 106b, the insulating film 106b is formed in an oxygen atmosphere, for example. Alternatively, oxygen may be introduced into the formed insulating film 106b to provide the oxygen-excess region therein. Oxygen can be introduced by an ion implantation method, an ion doping method, a plasma immersion ion implantation method, plasma treatment, or the like.

Using hafnium oxide for the insulating films 106a and 106b provides the following effects. Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106a, and a silicon oxide film is formed as the insulating film 106b. The silicon nitride film has a higher dielectric constant than a silicon oxide film and needs a larger thickness for capacitance equivalent to that of the silicon oxide film. Thus, when the silicon nitride film is included in the gate insulating film of the transistor, the physical thickness of the insulating film can be increased. This makes it possible to reduce a decrease in the withstand voltage of the transistor and furthermore increase the withstand voltage, thereby preventing electrostatic breakdown of the transistor.

<Oxide Semiconductor Film>

The oxide semiconductor films 108a and 108b are each typically formed using an In—Ga oxide, an In—Zn oxide, or an In-M-Zn oxide (M is Ti, Ga, Y, Zr, La, Ce, Nd, Sn, or Hf). It is particularly preferable to use an In-M-Zn oxide (M is Ti, Ga, Y, Zr, La, Ce, Nd, Sn, or Hf) for the oxide semiconductor films 108a and 108b.

Note that hereinafter, the oxide semiconductor films 108a and 108b are collectively referred to as an oxide semiconductor film 108.

In the case where the oxide semiconductor film 108 is an In-M-Zn oxide (M is Ti, Ga, Y, Zr, La, Ce, Nd, Sn, or Hf), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratio of metal elements in the formed oxide semiconductor film 108 varies from the above atomic ratio of metal elements of the sputtering target within a range of ±40% as an error.

Note that in the case where the oxide semiconductor film 108 contains an In-M-Zn oxide, the proportion of In and the proportion of M, not taking Zn and O into consideration, are preferably greater than or equal to 25 atomic % and less than 75 atomic %, respectively, further preferably greater than or equal to 34 atomic % and less than 66 atomic %, respectively.

The energy gap of the oxide semiconductor film 108 is 2 eV or more, preferably 2.5 eV or more, further preferably 3 eV or more. With the use of an oxide semiconductor having such a wide energy gap, the off-state current of the transistor 150 can be reduced.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$ is used as the oxide semiconductor film 108.

Note that, without limitation to those described above, a material with an appropriate atomic ratio may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of the oxide semiconductor film 108 be set to appropriate values.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of 1 V to 10 V.

Thus, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor in which the channel region is formed in the oxide semiconductor film having a high density of trap states may have unstable electrical characteristics. As examples of the impurities, hydrogen, nitrogen, alkali metal, and alkaline earth metal are given.

Hydrogen contained in the oxide semiconductor film reacts with oxygen bonded to a metal atom to be water, and also causes oxygen vacancies in a lattice from which oxygen is released (or a portion from which oxygen is released). Due to entry of hydrogen into the oxygen vacancies, an electron serving as a carrier is generated. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, lower than $5\times10^{18}$ atoms/cm$^3$, preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$.

When silicon or carbon which is one of elements belonging to Group 14 is contained in the oxide semiconductor film 108, oxygen vacancies are increased, and the oxide semiconductor film 108 is changed to an n-type. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor film 108, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 108.

In addition, when nitrogen is contained in the oxide semiconductor film 108, electrons serving as carriers are generated to increase the carrier density, so that the oxide semiconductor film 108 easily becomes n-type. Thus, a transistor including an oxide semiconductor film which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor film having the amorphous structure has disordered atomic arrangement and no crystalline component, for example. Alternatively, an oxide film having an amorphous structure has, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

<Protective Insulating Film>

The insulating films 114, 116, and 118 function as a protective insulating film. For example, the insulating film 114 is an insulating film that is permeable to oxygen. The insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114. Note that in this specification, a "silicon oxynitride film" refers to a film that contains more oxygen than nitrogen, and a "silicon nitride oxide film" refers to a film that contains more nitrogen than oxygen.

In addition, it is preferable that the number of defects in the insulating film 114 be small and typically, the spin density corresponding to a signal that appears around g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an insulating film which is permeable to oxygen is formed as the insulating film 114, oxygen released from the insulating film 116 can be moved to the oxide semiconductor film 108 through the insulating film 114.

The insulating film 116 is formed using an oxide insulating film that contains oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the amount of defects in the insulating film 116 be small, and typically the spin density corresponding to a signal which appears around g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher defect density than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114, a single-layer structure of the insulating film 116, or a stacked-layer structure including three or more layers may be used.

The insulating film 118 has a function of blocking oxygen, hydrogen, water, an alkali metal, an alkaline earth metal, or the like. It is possible to prevent outward diffusion of oxygen from the oxide semiconductor film 108 and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Although the variety of films such as the conductive films, the insulating films, the oxide semiconductor films, and the metal oxide films which are described above can be formed by a sputtering method or a PECVD method, such films may be formed by another method, e.g., a thermal CVD method. As an example of a thermal CVD method, a metal organic chemical vapor deposition (MOCVD) method or an atomic layer deposition (ALD) method can be given.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ gas may be used. Furthermore, a $Zn(CH_3)_2$ gas may be used.

<Structure Example 2 of Semiconductor Device>

Figure 3A:
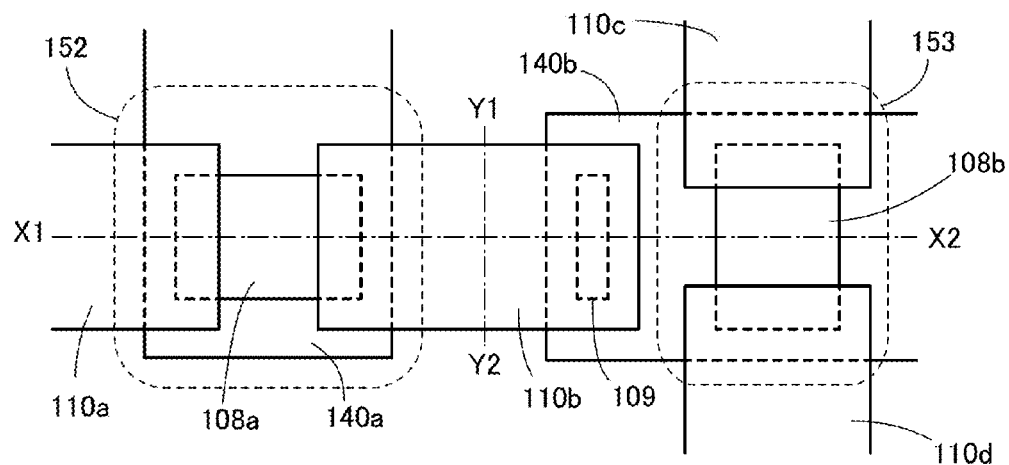
FIGS. 3A and 3B are a top view and a cross-sectional view of a semiconductor device.
Figure 3B:
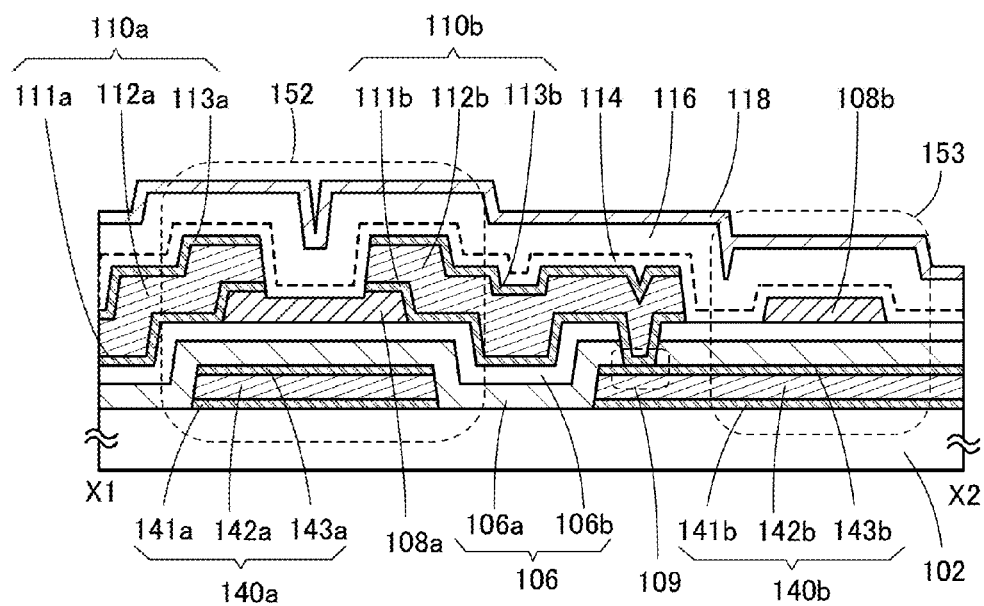

FIG. 3A is a top view illustrating a semiconductor device 161 of one embodiment of the present invention, and FIG. 3B is a cross-sectional view taken along dashed-dotted line X1-X2 in FIG. 3A. Note that in FIG. 3A, some components of the semiconductor device 161 are not illustrated to avoid complexity. The semiconductor device 161 includes a transistor 152 and a transistor 153. FIG. 3B is a cross-sectional view of the transistor 152 in the channel length direction and a cross-sectional view of the transistor 153 in the channel width direction.

The semiconductor device 161 in FIG. 3B is an example where the electrode layers 110a to 110d and the conductive films 140a and 140b of the semiconductor device 160 in FIG. 1B each have a three-layer stacked structure. The electrode layer 110a is a layer in which a conductive film 111a, a conductive film 112a, and a conductive film 113a are stacked in this order, the electrode layer 110b is a layer in which a conductive film 111b, a conductive film 112b, and a conductive film 113b are stacked in this order, the electrode layer 110c is a layer in which a conductive film 111c, a conductive film 112c, and a conductive film 113c are stacked in this order (not illustrated), the electrode layer 110d is a layer in which a conductive film 111d, a conductive film 112d, and a conductive film 113d are stacked in this order (not illustrated), the conductive film 140a is a layer in which a conductive film 141a, a conductive film 142a, and a conductive film 143a are stacked in this order, and the conductive film 140b is a layer in which a conductive film 141b, a conductive film 142b, and a conductive film 143b are stacked in this order. The structure of the semiconductor device 161 is the same as that of the semiconductor device 160, except for the above.

Hereinafter, the conductive films 111a to 111d are collectively referred to as a conductive film 111, the conductive films 112a to 112d are collectively referred to as a conductive film 112, and the conductive films 113a to 113d are collectively referred to as a conductive film 113.

Furthermore, hereinafter, the conductive films 141a and 141b are collectively referred to as a conductive film 141, the conductive films 142a and 142b are collectively referred to as a conductive film 142, and the conductive films 143a and 143b are collectively referred to as a conductive film 143.

The conductive films 111, 113, 141, and 143 are preferably Cu—X alloy films. When a Cu—X alloy film is used as a conductive film in contact with an oxide (here, the oxide semiconductor film 108 or an insulating film containing oxygen), X in the Cu—X alloy film forms an oxide film of X at an interface with the oxide, and entry of Cu in the Cu—X alloy film into the oxide semiconductor film 108 can be prevented.

As the conductive films 112 and 142, a conductive film including a low-resistance material such as copper (Cu), aluminum (Al), gold (Au), or silver (Ag), an alloy of any of these materials, or a compound containing any of these materials as its main components is preferably used.

The thickness of the conductive film 112 is preferably larger than that of each of the conductive films 111 and 113. In that case, the conductivity of the electrode layers 110a to 110d can be increased.

The thickness of the conductive film 142 is preferably larger than that of each of the conductive films 141 and 143. In that case, the conductivity of the conductive films 140a and 140b can be increased.

For example, the conductive films 111, 113, 141, and 143 are Cu—Mn alloy films and the conductive films 112 and 142 are copper (Cu) films. Note that the copper (Cu) film means pure copper (Cu), and the purity thereof is preferably higher than or equal to 99%. Note that pure copper (Cu) contains an impurity element at a small percentage in some cases.

When the conductive films 111, 113, 141, and 143 are Cu—Mn alloy films, adhesion with the oxide semiconductor film 108 and insulating films in contact with the above conductive films can be increased. When a Cu—Mn alloy film is used, a favorable ohmic contact with the oxide semiconductor film 108 can be made. The conductive film 111b and the conductive film 143b which are Cu—Mn alloy films are in contact with each other through the contact hole 109; thus, contact resistance between the electrode layer 110b and the conductive film 140b can be kept low.

Figure 11A:
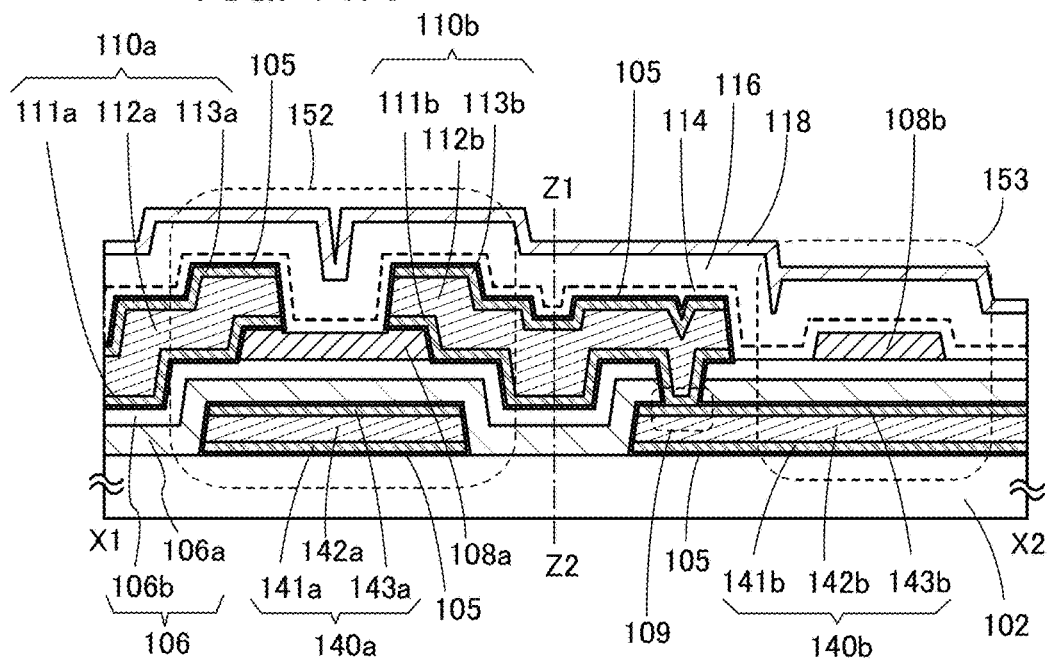
FIGS. 11A and 11B are cross-sectional views of a semiconductor device.

The semiconductor device 161 in FIG. 11A is an example of the case where heat treatment is performed on the semiconductor device 161 in FIG. 3B. the semiconductor device 161 in FIG. 11A is different from the semiconductor device 161 in FIG. 3B in that the oxide film 105 is formed to surround the electrode layers 110a to 110d and the conductive films 140a and 140b. The structure of the semiconductor device 161 in FIG. 11A is the same as that of the semiconductor device 161 in FIG. 3B, except for the above.

Figure 11B:
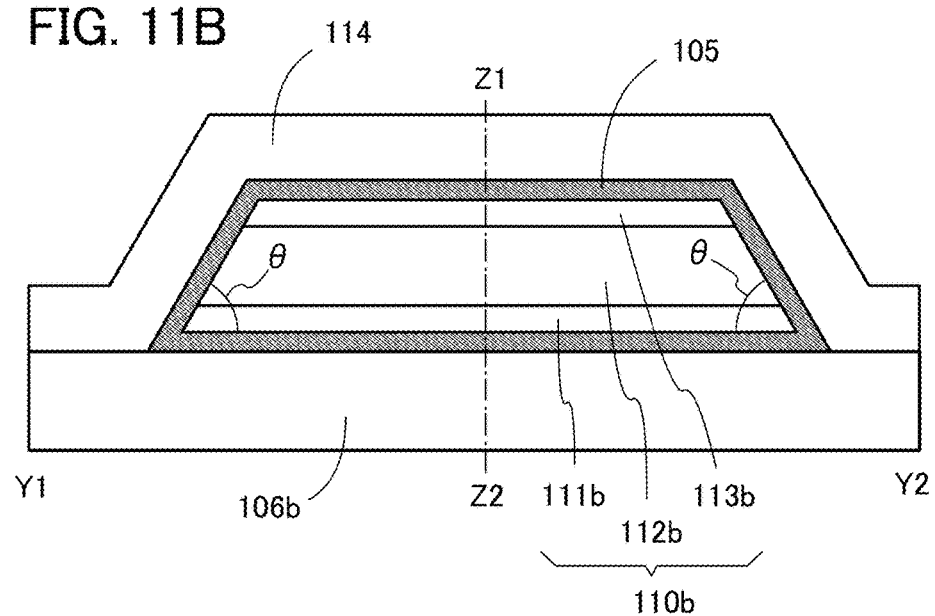

FIG. 11B is a cross-sectional view taken along dashed-dotted line Z1-Z2 in FIG. 11A. Only the electrode layer 110b and the insulating films in contact with the electrode layer 110b are illustrated. The hatching pattern of the electrode layer 110b is not illustrated to avoid complexity.

The oxide film 105 is formed in such a manner that an oxide (here, referred to as the oxide semiconductor film 108 or an insulating film containing oxygen) and a conductive film containing a Cu—X alloy are in contact with each other and heated and X in the Cu—X alloy is segregated in the vicinity of an interface between the oxide and the conductive film and reacts with oxygen. In the case where X is Mn, examples of a substance contained in the oxide film 105 include a Mn oxide, an In—Mn oxide (in the case were the oxide contains In), a Ga—Mn oxide (in the case where the oxide contains Ga), an In—Ga—Mn oxide (in the case where the oxide contains In and Ga), an In—Ga—Zn—Mn oxide (in the case where the oxide contains In, Ga, and Zn), a Si—Mn oxide (in the case where the oxide contains silicon), an Al—Mn oxide (in the case where the oxide contains aluminum), and a Hf—Mn oxide (in the case where the oxide contains hafnium).

The heat treatment may be performed at a temperature higher than or equal to 100° C. and lower than or equal to 650° C., preferably higher than or equal to 150° C. and lower than or equal to 500° C., further preferably higher than or equal to 200° C. and lower than or equal to 350° C. The heat treatment may be performed using heat applied to the substrate in the formation step of the conductive film, the electrode layer, or the insulating film.

As illustrated in FIG. 11B, the oxide film 105 is formed at an interface between the electrode layer 110b and the insulating film 114 and an interface between the electrode layer 110b and the insulating film 106b to surround the electrode layer 110b. In order to form the oxide film 105, the insulating film 114 and the insulating film 106b are preferably formed using a silicon oxide film, a silicon oxynitride film, or a silicon nitride oxide film.

In FIG. 11B, the oxide film 105 is formed on a side surface of the conductive film 112b not including a Cu—Mn alloy film because Mn in the Cu—Mn alloy films under and over the conductive film 112b is precipitated at the interface between the conductive film 112b and the insulating film 114 by heat treatment and reacts with oxygen of the insulating film 114 to form the oxide film 105.

The taper angle θ of the electrode layer 110b in FIG. 11B is preferably greater than or equal to 30° and less than or equal to 70°. The electrode layer 110b preferably has the taper angle θ in the above range because favorable coverage with the insulating film 114 formed on the electrode layer 110b is obtained. Note that the taper angle refers to an inclination angle between a surface on which the electrode layer 110b is formed and a side surface of the electrode layer 110b when the electrode layer 110b is observed from the direction perpendicular to its cross section. The taper angle of a side surface with continuous curvature refers to an inclination angle between the surface on which the electrode layer 110b is formed and a given point of the side surface with continuous curvature.

The high resistance oxide film 105 is not formed in the contact hole 109 in which the electrode layer 110b and the conductive film 140b are in contact with each other. Therefore, even when the heat treatment is performed, contact resistance between the electrode layer 110b and the conductive film 140b can be kept low.

By the oxide film 105, Cu included in the electrode layers 110a to 110d and the conductive films 140a and 140b can be prevented from diffusing into the outside of the electrodes and adversely affecting the oxide semiconductor film 108. When the semiconductor device 161 has the above structure, a highly reliable semiconductor device in which wiring delay is suppressed can be provided.

<Structure Example 3 of Semiconductor Device>

Figure 4A:
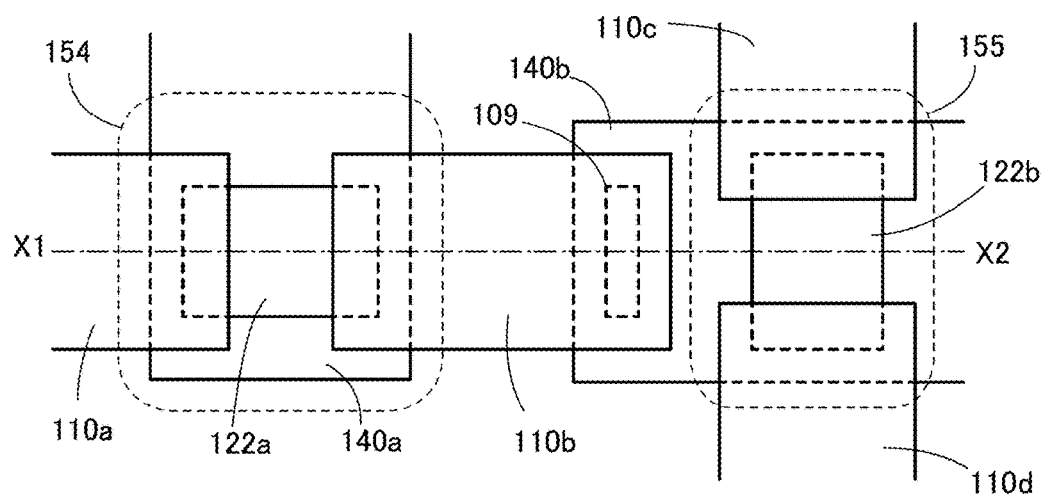
FIGS. 4A and 4B are a top view and a cross-sectional view of a semiconductor device.
Figure 4B:
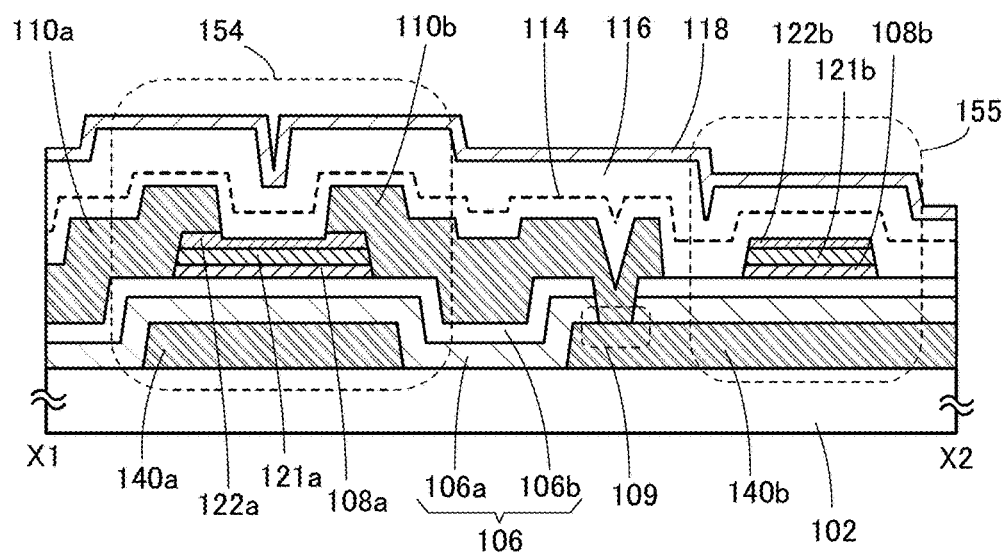

FIG. 4A is a top view illustrating a semiconductor device 162 of one embodiment of the present invention, and FIG. 4B is a cross-sectional view taken along dashed-dotted line X1-X2 in FIG. 4A. Note that in FIG. 4A, some components of the semiconductor device 162 are not illustrated to avoid complexity. The semiconductor device 162 includes a transistor 154 and a transistor 155. FIG. 4B is a cross-sectional view of the transistor 154 in the channel length direction and a cross-sectional view of the transistor 155 in the channel width direction.

The semiconductor device 162 has a structure in which a metal oxide film 121a and a metal oxide film 122a are formed over the oxide semiconductor film 108a and the metal oxide film 121b and the metal oxide film 122b are formed over the oxide semiconductor film 108b in the semiconductor device 160 illustrated in FIGS. 1A and 1B. Part of the oxide semiconductor film 108a is electrically connected to the pair of electrode layers 110a and 110b through the metal oxide films 121a and 122a, and part of the oxide semiconductor film 108b is electrically connected to the pair of electrode layers 110c and 110d through the metal oxide films 121b and 122b. The structure of the semiconductor device 162 is the same as that of the semiconductor device 160, except for the above.

The metal oxide films 121a and 122a serve as barrier films for preventing diffusion of constituent elements of the pair of electrode layers 110a and 110b into the oxide semiconductor film 108a. The metal oxide films 121b and 122b serve as barrier films for preventing diffusion of constituent elements of the pair of electrode layers 110c and 110d into the oxide semiconductor film 108b.

As illustrated in the transistor 154 in FIG. 4B, the thickness of a region of the metal oxide film 122a which does not overlap with the pair of electrode layers 110a and 110b is smaller than that of a region of the metal oxide film 122a which overlaps with the pair of electrode layers 110a and 110b. When the thickness of the region of the metal oxide film 122a which does not overlap with the pair of electrode layers 110a and 110b is small, impurities (here, Cu) diffused from the pair of electrode layers 110a and 110b can be removed. Thus, a surface of the metal oxide film 122a, i.e., a surface of the transistor 154 on the back channel side is cleaned, so that a highly reliable semiconductor device in which a reduction in electrical characteristics is suppressed and which has preferable electrical characteristics can be provided. Depending on circumstances or conditions, the thickness of the region of the metal oxide film 122a which does not overlap with the pair of electrode layers 110a and 110b may be substantially the same as that of the region of the metal oxide film 122a which overlaps with the pair of electrode layers 110a and 110b.

Note that the mentioned above can be applied even when the transistor 154 is replaced with the transistor 155, the pair of electrode layers 110a and 110b is replaced with the pair of electrode layers 110c and 110d, and the metal oxide film 122a is replaced with the metal oxide film 122b.

<Structure Example 4 of Semiconductor Device>

Figure 5A:
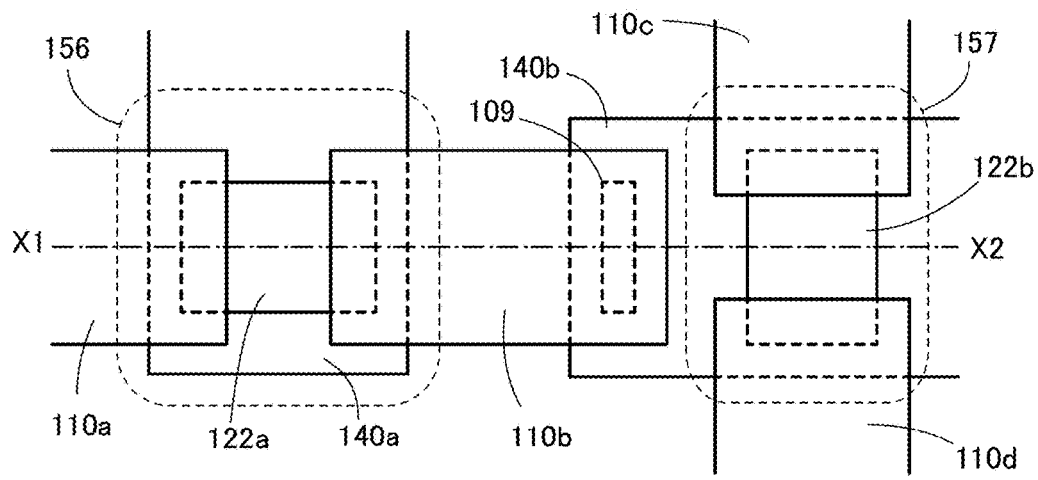
FIGS. 5A and 5B are a top view and a cross-sectional view of a semiconductor device.
Figure 5B:
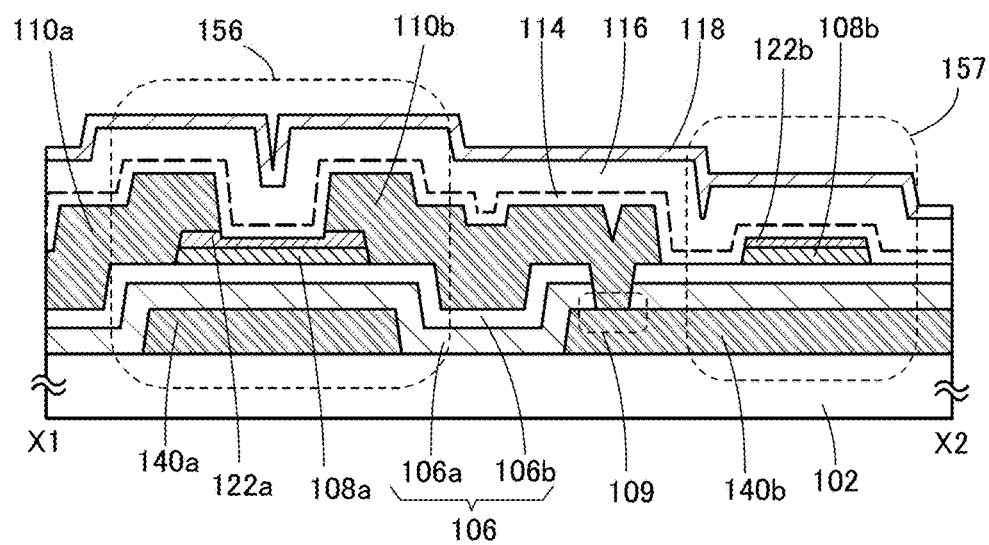

FIG. 5A is a top view illustrating a semiconductor device 163 of one embodiment of the present invention, and FIG. 5B is a cross-sectional view taken along dashed-dotted line X1-X2 in FIG. 5A. Note that in FIG. 5A, some components of the semiconductor device 163 are not illustrated to avoid complexity. The semiconductor device 163 includes a transistor 156 and a transistor 157. FIG. 5B is a cross-sectional view of the transistor 156 in the channel length direction and a cross-sectional view of the transistor 157 in the channel width direction.

The semiconductor device 163 has a structure in which the metal oxide film 122a is formed over the oxide semiconductor film 108a in the semiconductor device 160 illustrated in FIGS. 1A and 1B and the metal oxide film 122b is formed over the oxide semiconductor film 108b. Part of the oxide semiconductor film 108a is electrically connected to the pair of electrode layers 110a and 110b through the metal oxide film 122a, and part of the oxide semiconductor film 108b is electrically connected to the pair of electrode layers 110c and 110d through the metal oxide film 122b. The structure of the semiconductor device 163 is the same as that of the semiconductor device 160, except for the above.

The metal oxide films 122a serves as a barrier film for preventing diffusion of constituent elements of the pair of electrode layers 110a and 110b into the oxide semiconductor film 108a. The metal oxide film 122b serves as a barrier film for preventing diffusion of constituent elements of the pair of electrode layers 110c and 110d into the oxide semiconductor film 108b.

As illustrated in the transistor 156 in FIG. 5B, the thickness of a region of the metal oxide film 122a which does not overlap with the pair of electrode layers 110a and 110b is smaller than that of a region of the metal oxide film 122a which overlaps with the pair of electrode layers 110a and 110b. When the thickness of the region of the metal oxide film 122a which does not overlap with the pair of electrode layers 110a and 110b is small, impurities (here, Cu) diffused from the pair of electrode layers 110a and 110b can be removed. Thus, a surface of the metal oxide film 122a, i.e., a surface of the transistor 156 on the back channel side is cleaned, so that a highly reliable semiconductor device in which a reduction in electrical characteristics is suppressed and which has preferable electrical characteristics can be provided. Depending on circumstances or conditions, the thickness of the region of the metal oxide film 122a which does not overlap with the pair of electrode layers 110a and 110b may be substantially the same as that of the region of the metal oxide film 122a which overlaps with the pair of electrode layers 110a and 110b.

Note that the mentioned above can be applied even when the transistor 156 is replaced with the transistor 157, the pair of electrode layers 110a and 110b is replaced with the pair of electrode layers 110c and 110d, and the metal oxide film 122a is replaced with the metal oxide film 122b.

Here, band structures of an oxide semiconductor film, a metal oxide film, and insulating films in contact with these films are described with reference to FIGS. 6A and 6B.

Hereinafter, the metal oxide films 121a and 121b are collectively referred to as a metal oxide film 121, and the metal oxide films 122a and 122b are collectively referred to as a metal oxide film 122.

Figure 6A:
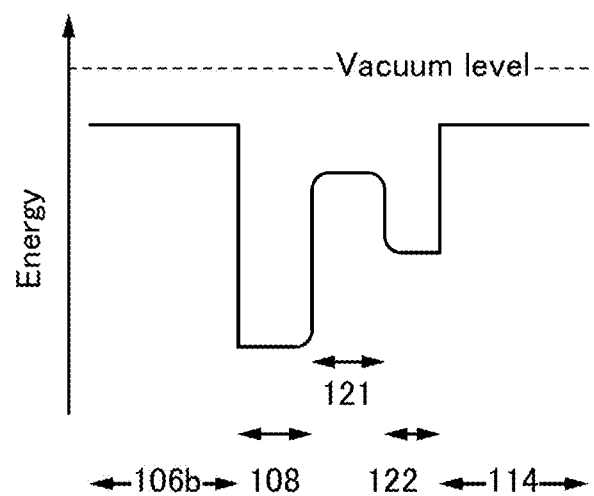
FIGS. 6A and 6B each illustrate an energy band of a stacked film.

FIG. 6A shows an example of a band structure in the thickness direction of a stacked-layer structure of the insulating film 106b, the oxide semiconductor film 108, the metal oxide film 121, the metal oxide film 122, and the insulating film 114. FIG. 6B shows an example of a band structure in the thickness direction of a stacked-layer structure of the insulating film 106b, the oxide semiconductor film 108, the metal oxide film 122, and the insulating film 114. For easy understanding, the energy level (Ec) of the bottom of the conduction band of each of the insulating film 106b, the oxide semiconductor film 108, the metal oxide films 121 and 122, and the insulating film 114 is shown in the band structures.

In the band structure of FIG. 6A, a silicon oxide film is used as each of the insulating film 106b and the insulating film 114, an oxide semiconductor film formed using a metal oxide target having an atomic ratio of metal elements of In:Ga:Zn=1:1:1 is used as the oxide semiconductor film 108, a metal oxide film formed using a metal oxide target having an atomic ratio of metal elements of In:Ga:Zn=1:4:5 is used as the metal oxide film 121, and a metal oxide film formed using a metal oxide target having an atomic ratio of metal elements of In:Ga:Zn=1:3:6 is used as the metal oxide film 122.

Figure 6B:
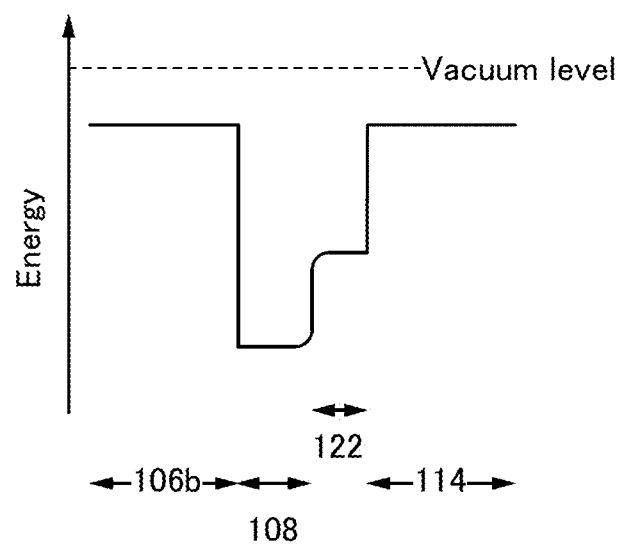

FIG. 6B is a band diagram of a structure in which a silicon oxide film is used as each of the insulating films 106b and 114, an oxide semiconductor film that is formed using a metal oxide target with an atomic ratio of metal elements of In:Ga:Zn=1:1:1 is used as the oxide semiconductor film 108 and a metal oxide film that is formed using a metal oxide target with an atomic ratio of metal elements of In:Ga:Zn=1:3:6 is used as the metal oxide film 122.

As illustrated in FIGS. 6A and 6B, the energy level of the bottom of the conduction band smoothly varies between the oxide semiconductor film 108 and the metal oxide film 121 and between the oxide semiconductor film 108 and the metal oxide film 122. In other words, the energy level of the bottom of the conduction band is continuously varied, or a continuous junction is formed. To obtain such a band structure, there exists no impurity, which forms a defect state such as a trap center or a recombination center, at the interface between the oxide semiconductor film 108 and the metal oxide film 121 or the interface between the oxide semiconductor film 108 and the metal oxide film 122.

To form a continuous junction between the oxide semiconductor film 108 and the metal oxide film 121 and between the oxide semiconductor film 108 and the metal oxide film 122, it is necessary to form the films successively without exposure to the air by using a multi-chamber deposition apparatus (sputtering apparatus) provided with a load lock chamber.

With the band structure of FIG. 6A or FIG. 6B, the oxide semiconductor film 108 serves as a well, and a channel region is formed in the oxide semiconductor film 108 in the transistor with the stacked-layer structure.

By providing the metal oxide films 121 and 122, the oxide semiconductor film 108 can be distanced away from trap states.

The trap states might be more distant from the vacuum level than the energy level (Ec) of the bottom of the conduction band of the oxide semiconductor film 108 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level (Ec) of the bottom of the conduction band of the oxide semiconductor film 108. Such a structure inhibits accumulation of electrons in the trap states. As a result, the on-state current and the field-effect mobility of the transistor can be increased.

In FIGS. 6A and 6B, the energy level of the bottom of the conduction band of each of the metal oxide films 121 and 122 is closer to the vacuum level than that of the oxide semiconductor film 108. Typically, an energy difference between the bottom of the conduction band of the oxide semiconductor film 108 and the bottom of the conduction band of each of the metal oxide films 121 and 122 is greater than or equal to 0.15 eV or greater than or equal to 0.5 eV, and less than or equal to 2 eV or less than or equal to 1 eV. That is, the difference between the electron affinity of each of the metal oxide films 121 and 122 and the electron affinity of the oxide semiconductor film 108 is greater than or equal to 0.15 eV or greater than or equal to 0.5 eV, and less than or equal to 2 eV or less than or equal to 1 eV.

In such a structure, the oxide semiconductor film 108 serves as a main path of current and functions as a channel region. In addition, since each of the metal oxide films 121 and 122 contains one or more metal elements contained in the oxide semiconductor film 108 in which a channel region is formed, interface scattering is less likely to occur at the interface between the oxide semiconductor film 108 and the metal oxide film 121 or the interface between the oxide semiconductor film 108 and the metal oxide film 122. Thus, the transistor can have high field-effect mobility because the movement of carriers is not hindered at the interface.

To prevent each of the metal oxide films 121 and 122 from functioning as part of a channel region, a material having sufficiently low conductivity is used for each of the metal oxide films 121 and 122. Alternatively, a material which has a smaller electron affinity (an energy difference between the vacuum level and the bottom of the conduction band) than the oxide semiconductor film 108 and has a difference in energy level of the bottom of the conduction band from the oxide semiconductor film 108 (band offset) is used for each of the metal oxide films 121 and 122. Furthermore, to inhibit generation of a difference between threshold voltages due to the value of the drain voltage, it is preferable to form each of the metal oxide films 121 and 122 using a material whose energy level of the bottom of the conduction band is closer to the vacuum level than that of the oxide semiconductor film 108 is by more than 0.2 eV, preferably 0.5 eV or more.

It is preferable that each of the metal oxide films 121 and 122 not have a spinel crystal structure. If the metal oxide film 121 or the metal oxide film 122 has a spinel crystal structure, constituent elements of the electrode layers 110a to 110d might be diffused into the oxide semiconductor film 108 at the interface between the spinel crystal structure and another region. Note that each of the metal oxide films 121 and 122 is preferably a CAAC-OS, which is described later, in which case a higher blocking property against constituent elements of the electrode layers 110a to 110d, e.g., copper elements, is obtained.

The thickness of each of the metal oxide films 121 and 122 is greater than or equal to a thickness that is capable of inhibiting diffusion of the constituent element of the electrode layers 110a to 110d into the oxide semiconductor film 108, and less than a thickness that inhibits supply of oxygen from the insulating film 114 to the oxide semiconductor film 108. For example, when the thickness of each of the metal oxide films 121 and 122 is greater than or equal to 10 nm, the constituent elements of the electrode layers 110a to 110d can be prevented from diffusing into the oxide semiconductor film 108. When the thickness of each of the metal oxide films 121 and 122 is less than or equal to 100 nm, oxygen can be effectively supplied from the insulating films 114 and 116 to the oxide semiconductor film 108.

When each of the metal oxide films 121 and 122 is an In-M-Zn oxide in which the atomic ratio of the element M (M is Ti, Ga, Y, Zr, La, Ce, Nd, Sn, or Hf) is higher than that of In, the energy gap of each of the metal oxide films 121 and 122 can be large and the electron affinity thereof can be small. Therefore, a difference in electron affinity between the oxide semiconductor film 108 and each of the metal oxide films 121 and 122 may be controlled by the proportion of the element M. Furthermore, oxygen vacancies are less likely to be generated in the metal oxide film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When each of the metal oxide films 121 and 122 contains an In-M-Zn oxide, the proportion of In and the proportion of M, not taking Zn and O into consideration, are preferably less than 50 atomic % and greater than or equal to 50 atomic %, respectively, further preferably less than 25 atomic % and greater than or equal to 75 atomic %, respectively.

Furthermore, in the case where the oxide semiconductor film 108 and the metal oxide films 121 and 122 are each formed of an In-M-Zn oxide (M is Ti, Ga, Y, Zr, La, Ce, Nd, Sn, or Hf), the proportion of M (M is Ti, Ga, Y, Zr, La, Ce, Nd, Sn, or Hf) in each of the metal oxide films 121 and 122 is larger than that in the oxide semiconductor film 108. Typically, the proportion of M in each of the metal oxide films 121 and 122 is 1.5 or more times, preferably two or more times, further preferably three or more times as large as that in the oxide semiconductor film 108.

Furthermore, in the case where the oxide semiconductor film 108 and the metal oxide films 121 and 122 are each formed of an In-M-Zn oxide (M is Ti, Ga, Y, Zr, La, Ce, Nd, Sn, or Hf), when the oxide semiconductor film 108 has an atomic ratio of In:M:Zn=$x_1$:$y_1$:$z_1$ and the metal oxide films 121 and 122 each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, still further preferably $y_2/x_2$ is three or more times or four or more times as large as $y_1/x_1$. In that case, it is preferable that, in the oxide semiconductor film 108, $y_1$ be larger than or equal to $x_1$ because the transistor including the oxide semiconductor film 108 can have stable electrical characteristics. However, when $y_1$ is three or more times as large as $x_1$, the field-effect mobility of the transistor including the oxide semiconductor film 108 is reduced. Accordingly, $y_1$ is preferably smaller than three times $x_1$.

In the case where the oxide semiconductor film 108 is formed of an In-M-Zn oxide (M is Ti, Ga, Y, Zr, La, Ce, Nd, Sn, or Hf) and a target having the atomic ratio of metal elements of In:M:Zn=$x_1$:$y_1$:$z_1$ is used for depositing the oxide semiconductor film 108, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later is easily formed as the oxide semiconductor film 108. Typical examples of the atomic ratio of the metal elements of the target include In:M:Zn=1:1:1, In:M:Zn=1:1:1.2, and In:M:Zn=3:1:2.

In the case where each of the metal oxide films 121 and 122 is formed of an In-M-Zn oxide (M is Ti, Ga, Y, Zr, La, Ce, Nd, Sn, or Hf) and a target having the atomic ratio of metal elements of In:M:Zn=$x_2$:$y_2$:$z_2$ is used for depositing the metal oxide films 121 and 122, $x_2/y_2$ is preferably less than $x_1/y_1$, and $z_2/y_2$ is preferably greater than or equal to ⅓ and less than or equal to 6, further preferably greater than or equal to 1 and less than or equal to 6. When the atomic ratio of M with respect to indium is high, the energy gap of each of the metal oxide films 121 and 122 can be large and the electron affinity thereof can be small; therefore, $y_2/x_2$ is preferably greater than or equal to 3 or greater than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where each of the metal oxide films 121 and 122 is formed of an In-M oxide (M is Ti, Ga, Y, Zr, La, Ce, Nd, Sn, or Hf), when a divalent metal element (e.g., zinc) is not contained as M, the metal oxide films 121 and 122 which do not include a spinel crystal structure can be formed. For each of the metal oxide films 121 and 122, for example, an In—Ga oxide can be used. The In—Ga oxide can be formed by a sputtering method using an In—Ga metal oxide target (In:Ga=7:93), for example. To deposit the metal oxide films 121 and 122 by a sputtering method using DC discharge, when an atomic ratio of In:M is x:y, it is preferable that y/(x+y) be less than or equal to 0.96, further preferably less than or equal to 0.95, for example, 0.93.

Note that the atomic ratio of each of the oxide semiconductor film 108 and the metal oxide films 121 and 122 varies within a range of ±40% of the above atomic ratio as an error.

<Method for Manufacturing Semiconductor Device>

Next, a method for manufacturing the semiconductor device 161 of one embodiment of the present invention is described below in detail with reference to drawings.

Figure 7A:
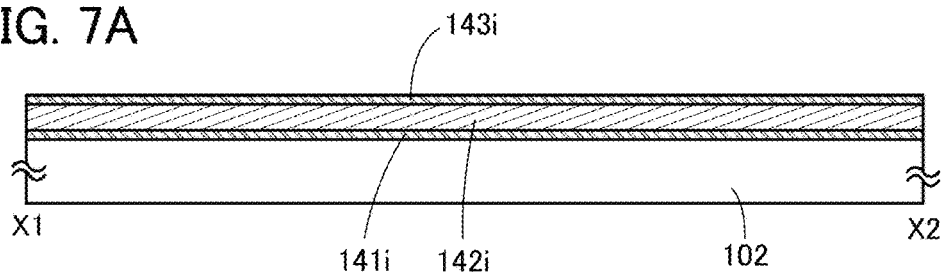
FIGS. 7A to 7D are cross-sectional views illustrating a method for manufacturing a semiconductor device.

First, a conductive film 141i, a conductive film 142i, and a conductive film 143i are formed over the substrate 102 (see FIG. 7A). For the conductive films 141i to 143i, any of the materials of the conductive films 141 to 143 can be used. In this embodiment, the conductive films 141i and 143i are 30-nm-thick Cu—Mn alloy films. The Cu—Mn alloy film can be formed using a Cu—Mn metal target (Cu:Mn=90:10 [atomic %]) by a sputtering method. A 200-nm-thick Cu film is formed by a sputtering method as the conductive film 142i.

Figure 7B:
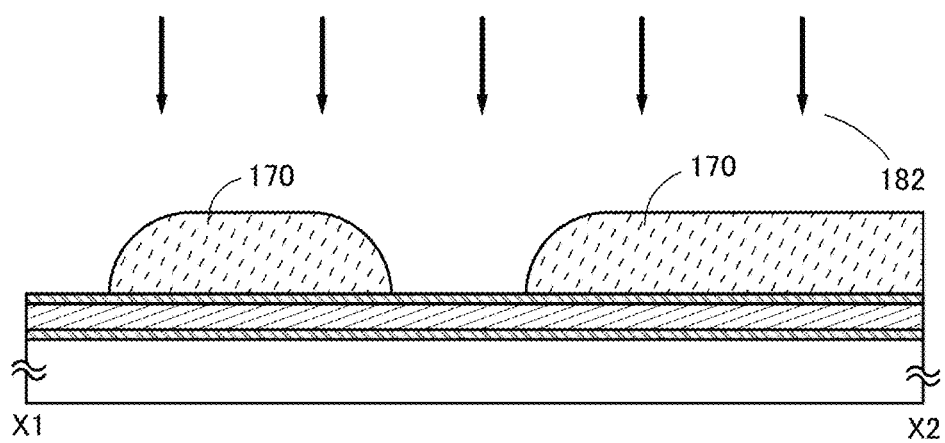

Next, a resist is applied over the conductive film 143i and is patterned, whereby a resist mask 170 is formed in desired regions. After that, an etchant 182 is applied over the conductive film 143i and the resist mask 170, so that the conductive films 141i to 143i are etched (see FIG. 7B).

The resist mask 170 can be formed in such a manner that a photosensitive resin is applied and then is exposed and developed in a desired region. Note that the photosensitive resin may be a negative-type or positive-type photosensitive resin. The resist mask 170 may be formed by an ink-jet method. In the case where the resist mask 170 is formed by an ink-jet method, the manufacturing cost can be reduced because no photomask is used.

Examples of the etchant 182 used for etching the conductive films 141i to 143i include an etchant containing an organic acid solution and hydrogen peroxide water.

Figure 7C:
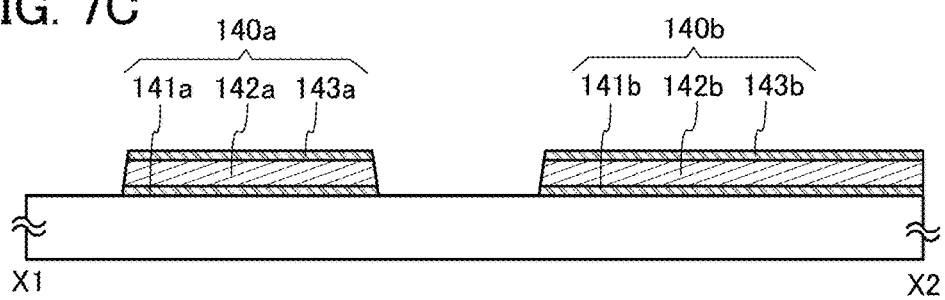

Next, the resist mask 170 is removed. The conductive films 141i to 143i are etched using the etchant 182, so that the conductive films 140a and 140b functioning as gate electrode layers are formed (see FIG. 7C). The resist mask 170 can be removed using, for example, a resist peeling apparatus.

Figure 7D:
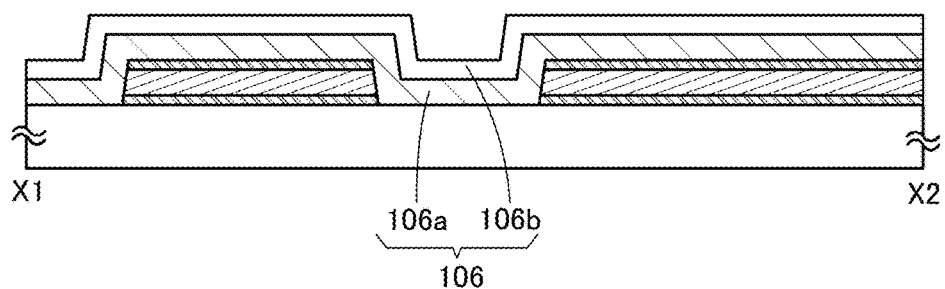

Next, the insulating film 106 functioning as a gate insulating film is formed over the substrate 102 and the conductive films 140a and 140b. The insulating film 106 includes the insulating films 106a and 106b (see FIG. 7D).

The insulating film 106 functioning as a gate insulating film can be formed by a sputtering method, a PECVD method, a thermal CVD method, a vacuum evaporation method, a PLD method, or the like. In this embodiment, a 400-nm-thick silicon nitride oxide film as the insulating film 106a functioning as a gate insulating film and a 50-nm-thick silicon oxynitride film as the insulating film 106b are formed by a PECVD method.

Figure 8A:
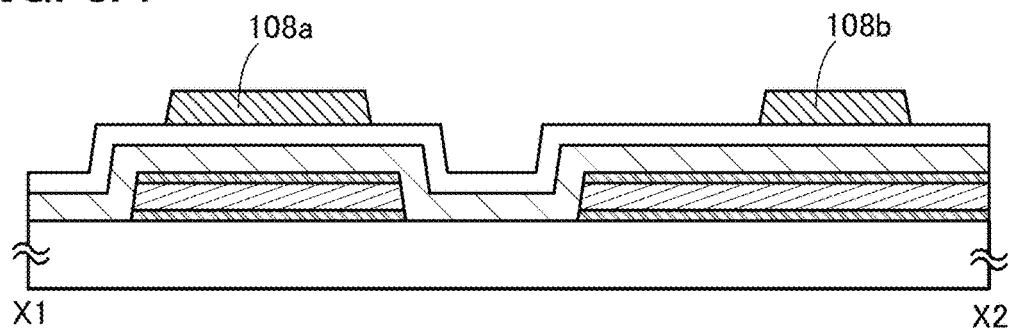
FIGS. 8A to 8C are cross-sectional views illustrating the method for manufacturing a semiconductor device.

Next, an oxide semiconductor film is deposited on the insulating film 106 functioning as the gate insulating film, and processed into a desired shape, whereby the oxide semiconductor films 108a and 108b are formed (see FIG. 8A).

In this embodiment, the oxide semiconductor films 108a and 108b (hereinafter referred to as an oxide semiconductor film 108) are formed by a sputtering method using an In—Ga—Zn metal oxide target (In:Ga:Zn=1:1:1).

After the oxide semiconductor film 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like contained in the oxide semiconductor film 108. Note that the heat treatment for the purpose of reducing hydrogen, water, and the like may be performed before the oxide semiconductor film 108 is processed into an island shape.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

By heat treatment for the oxide semiconductor film 108, an oxide film is formed in the vicinity of an interface between the insulating film 106a and the conductive films 140a and 140b and an interface between the substrate 102 and the conductive films 140a and 140b in some cases. The oxide film is the oxide film 105 described above.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas containing carbon or hydrogen from an exhaust system to the inside of the chamber.

Figure 8B:
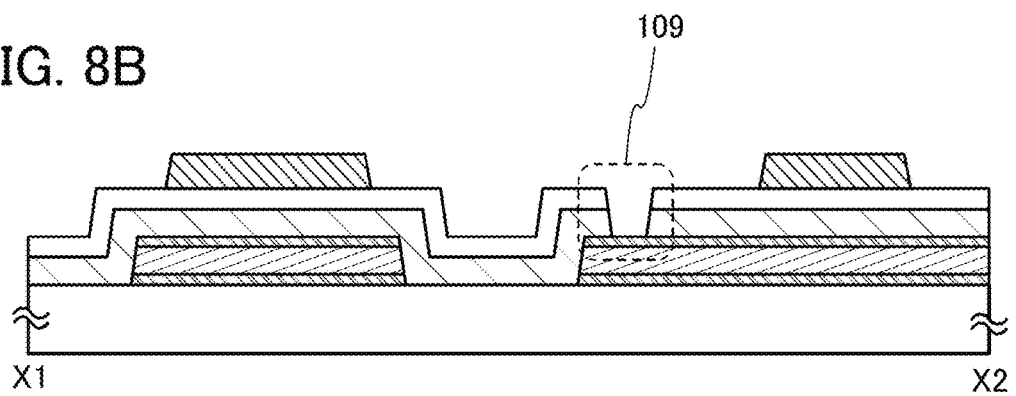

Next, the contact hole 109 is formed in the insulating film 106 (see FIG. 8B). The contact hole 109 reaches the conductive film 143b. A pattern is formed in a desired region, and the contact hole 109 can be formed using a dry etching apparatus.

Figure 8C:
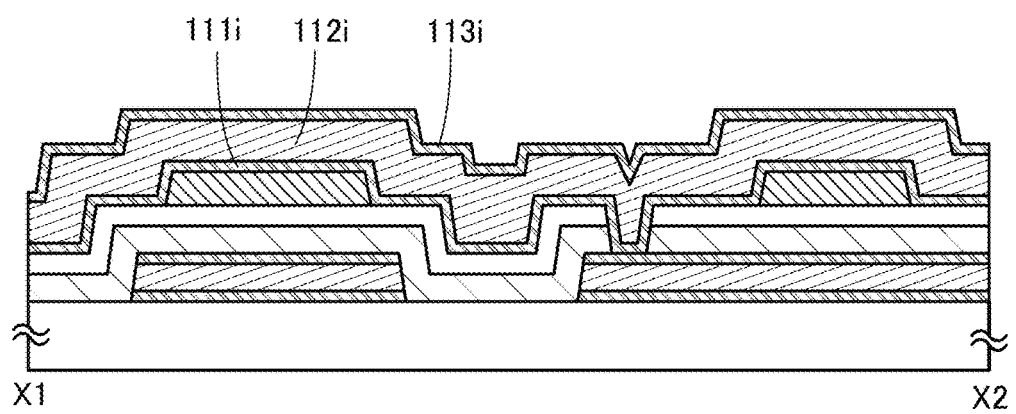

Next, a conductive film 111i, a conductive film 112i, and a conductive film 113i are formed over the insulating film 106 and the oxide semiconductor film 108 (see FIG. 8C). For the conductive films 111i and 113i, any of the materials of the conductive films 111 and 113 can be used. In this embodiment, the conductive films 111*i* and 113*i* are 30-nm-thick Cu—Mn alloy films. The Cu—Mn alloy film can be formed using a Cu—Mn metal target (Cu:Mn=90:10 [atomic %]) by a sputtering method. A 200-nm-thick Cu film is formed by a sputtering method as the conductive film 112*i*.

Figure 9A:
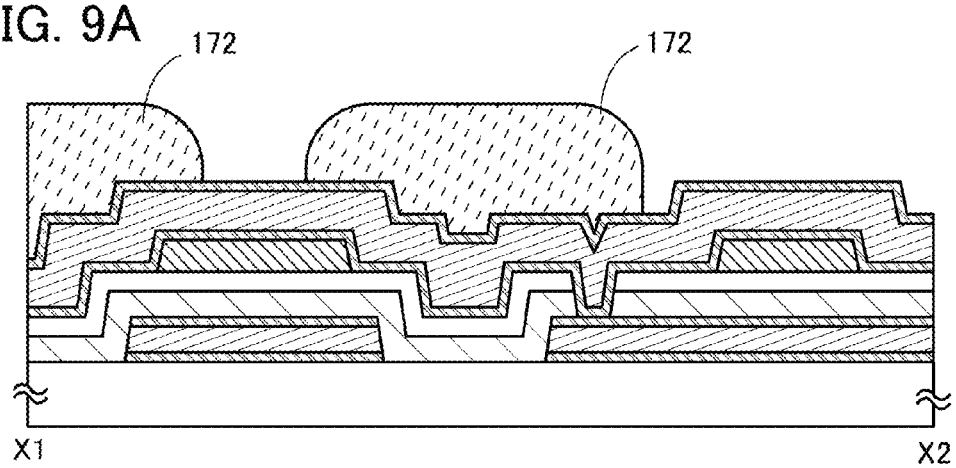
FIGS. 9A to 9C are cross-sectional views illustrating the method for manufacturing a semiconductor device.

Next, a resist is applied over the conductive film 113*i* and is patterned, whereby a resist mask 172 is formed in desired regions (see FIG. 9A). The resist mask 172 can be formed in such a manner that a photosensitive resin is applied and then is exposed and developed in a desired region. Note that the photosensitive resin may be a negative-type or positive-type photosensitive resin. The resist mask 172 may be formed by an ink-jet method. In the case where the resist mask 172 is formed by an ink-jet method, the manufacturing cost can be reduced because no photomask is used.

Figure 9B:
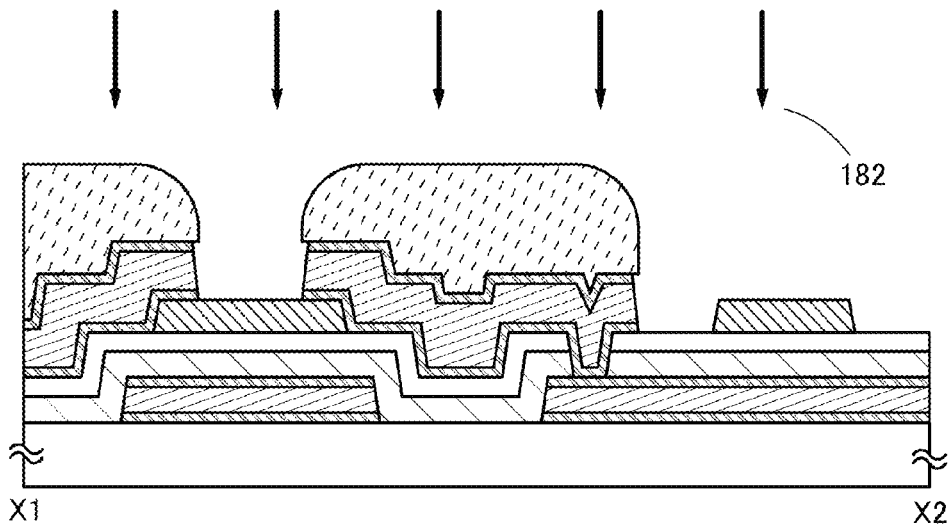

Next, the etchant 182 is applied over the resist mask 172, so that the conductive films 111*i* to 113*i* are etched (see FIG. 9B).

Figure 9C:
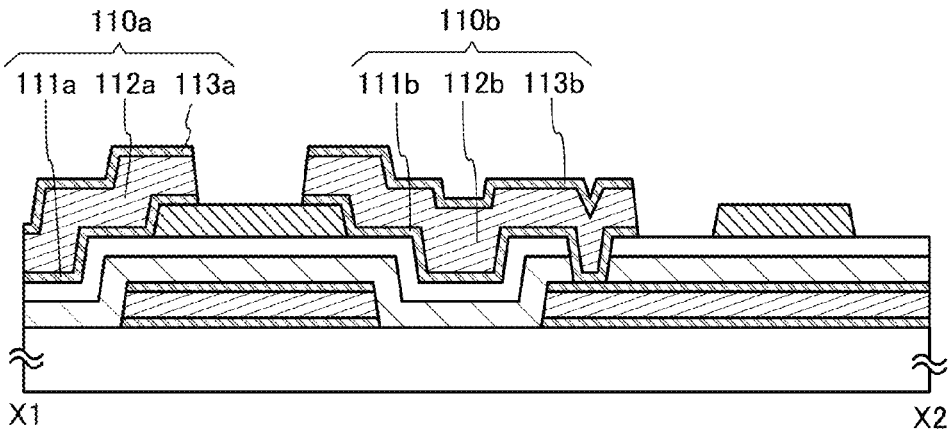

Next, the resist mask 172 is removed, and the electrode layer 110*a* including the conductive films 111*a* to 113*a*, the electrode layer 110*b* including the conductive films 111*b* to 113*b*, the electrode layer 110*c* including the conductive films 111*c* to 113*c* (not illustrated), and the electrode layer 110*d* including the conductive films 111*d* to 113*d* (not illustrated) are formed (see FIG. 9C).

Examples of the etchant 182 used for etching the conductive films 111*i* to 113*i* include an etchant containing an organic acid solution and hydrogen peroxide water. The resist mask 172 can be removed using, for example, a resist peeling apparatus.

Figure 10A:
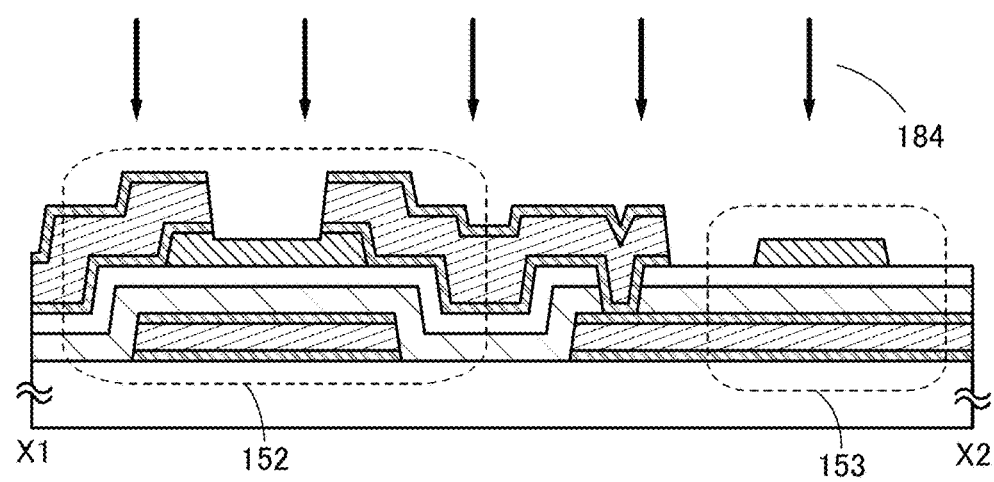
FIGS. 10A and 10B are cross-sectional views illustrating the method for manufacturing a semiconductor device.

Next, an etchant 184 is applied to the electrode layers 110*a* to 110*d* and the oxide semiconductor film 108, so that part of a surface of the oxide semiconductor film 108 which is exposed from the electrode layers 110*a* to 110*d* is etched (see FIG. 10A).

As the etchant 184, for example, a dilution of an acid-based chemical solution such as phosphoric acid, nitric acid, hydrofluoric acid, hydrochloric acid, sulfuric acid, acetic acid, or oxalic acid can be used. Note that the etchant 184 is not limited to the above acid-based chemical solutions. For example, a chemical solution with which the etching rate of the electrode layers 110*a* to 110*d* is lower than that of the oxide semiconductor film 108 may be used as the etchant 184. Specifically, a mixed solution of phosphoric acid, a chelating agent (e.g., ethylenediaminetetraacetic acid), and aromatic-compound-based anticorrosive (e.g., benzotriazole (BTA)) can be used.

The treatment using the etchant 184 can remove part of the constituent elements of the electrode layers 110*a* to 110*d* which are attached to the surface of the oxide semiconductor film 108.

Through the above process, the transistors 152 and 153 are formed.

Figure 10B:
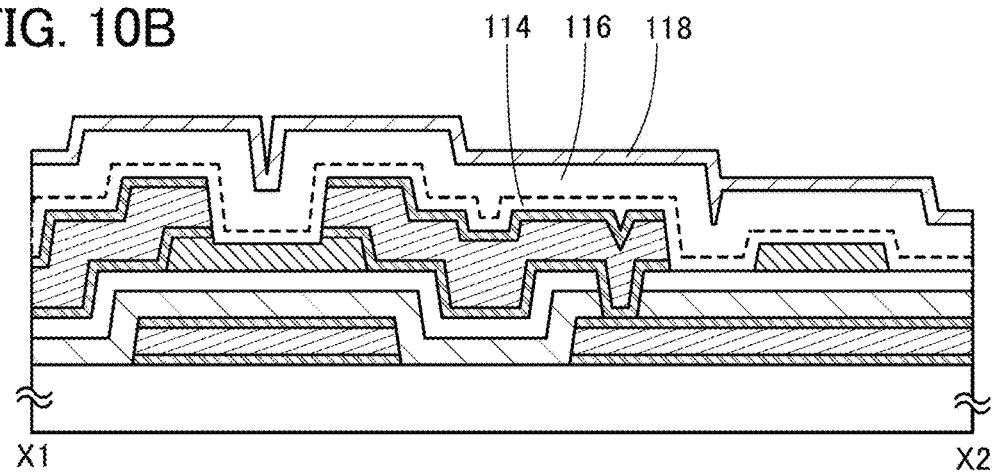

Next, the insulating films 114, 116, and 118 functioning as a protective insulating film of the transistors 152 and 153 are formed to cover the oxide semiconductor film 108 and the electrode layers 110*a* to 110*d* (see FIG. 10B).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced and oxygen in the insulating film 116 can be moved to the oxide semiconductor film 108; accordingly, the amount of oxygen vacancies in the oxide semiconductor film 108 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 27.12 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the decomposition efficiency of the source gas in plasma is increased, oxygen radicals are increased, and oxidation of the source gas is promoted; therefore, the oxygen content of the insulating film 116 becomes higher than that in the stoichiometric composition. On the other hand, in the film formed at a substrate temperature within the above temperature range, a bond between silicon and oxygen is weak, and accordingly, part of oxygen in the film is released by heat treatment in a later step. Thus, it is possible to form an oxide insulating film which contains oxygen at a higher proportion than oxygen in the stoichiometric composition and from which part of oxygen is released by heating.

Note that the insulating film 114 functions as a protective film of the oxide semiconductor film 108 in the step of forming the insulating film 116. Consequently, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density corresponding to a signal which appears around g=2.001 due to a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

After the insulating films 114 and 116 are formed, heat treatment is performed. By the heat treatment, part of oxygen contained in the insulating films 114 and 116 can be moved to the oxide semiconductor film 108, so that the amount of oxygen vacancies contained in the oxide semiconductor film 108 can be further reduced. After the heat treatment, the insulating film 118 is formed.

The temperature of the heat treatment performed on the insulating films 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). Note that an electric furnace, an RTA apparatus, or the like can be used for the heat treatment, in which it is preferable that hydrogen, water, and the like not be contained in the nitrogen, oxygen, ultra-dry air, or rare gas.

In this embodiment, the heat treatment is performed at 350° C. in an atmosphere of nitrogen and oxygen for an hour.

In the case where water, hydrogen, or the like is contained in the insulating films 114 and 116, when the insulating film 118 having a function of blocking water, hydrogen, and the like is formed and then heat treatment is performed, water, hydrogen, or the like contained in the insulating films 114 and 116 might be moved to the oxide semiconductor film 108, so that defects might be generated in the oxide semiconductor film 108. Thus, when heat treatment is performed before formation of the insulating film 118, water or hydrogen contained in the insulating films 114 and 116 can be effectively reduced.

Note that when the insulating film 116 is formed over the insulating film 114 while being heated, oxygen can be moved to the oxide semiconductor film 108 and oxygen vacancies in the oxide semiconductor film 108 can be reduced. For this reason, the heat treatment is not necessarily performed.

By heat treatment after the insulating films 114 and 116 are formed, an oxide film is formed in the vicinity of an interface between an oxide (here, the oxide semiconductor film 108 and an insulating film containing oxygen) and the electrode layers 110a to 110d and an interface between the oxide and the conductive films 140a and 140b in some cases. The oxide film is the oxide film 105 described above. Also in the case where the insulating film 114 is formed by heating, the oxide film 105 is formed in some cases.

In the case where the insulating film 118 is formed by a PECVD method, the substrate temperature is preferably set to higher than or equal to 300° C. and lower than or equal to 400° C., more preferably higher than or equal to 320° C. and lower than or equal to 370° C., so that a dense film can be formed.

For example, in the case where a silicon nitride film is formed by a PECVD method as the insulating film 118, a deposition gas containing silicon, nitrogen, and ammonia are preferably used as a source gas. A small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Heat treatment may be performed after the formation of the insulating film 118. The heat treatment is performed typically at a temperature of higher than or equal to 150° C. and lower than or equal to 400° C., preferably higher than or equal to 300° C. and lower than or equal to 400° C., more preferably higher than or equal to 320° C. and lower than or equal to 370° C. When the heat treatment is performed, the amount of hydrogen and water in the insulating films 114 and 116 is reduced and accordingly the generation of defects in the oxide semiconductor film 108 described above is inhibited.

Through the above process, the semiconductor device 161 in FIGS. 2A and 2B can be formed.

Figure 12A:
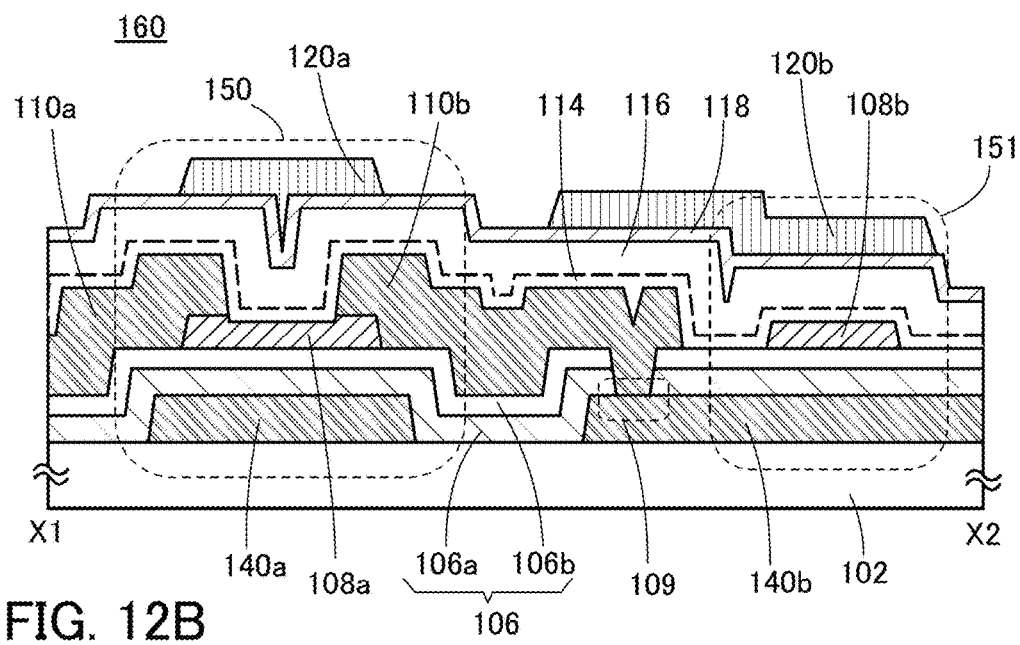
FIGS. 12A and 12B are each a cross-sectional view of a semiconductor device.

Although the example where one gate electrode is provided in the transistor is shown in FIGS. 1A and 1B and the like, one embodiment of the present invention is not limited thereto. A plurality of gate electrodes may be provided in the transistor. For example, FIG. 12A shows an example where conductive films 120a and 120b are provided in FIG. 1B. The conductive films 120a and 120b function as second gate electrode layers. For the conductive films 120a and 120b, any of the materials of the conductive films 140a and 140b may be used.

Figure 12B:
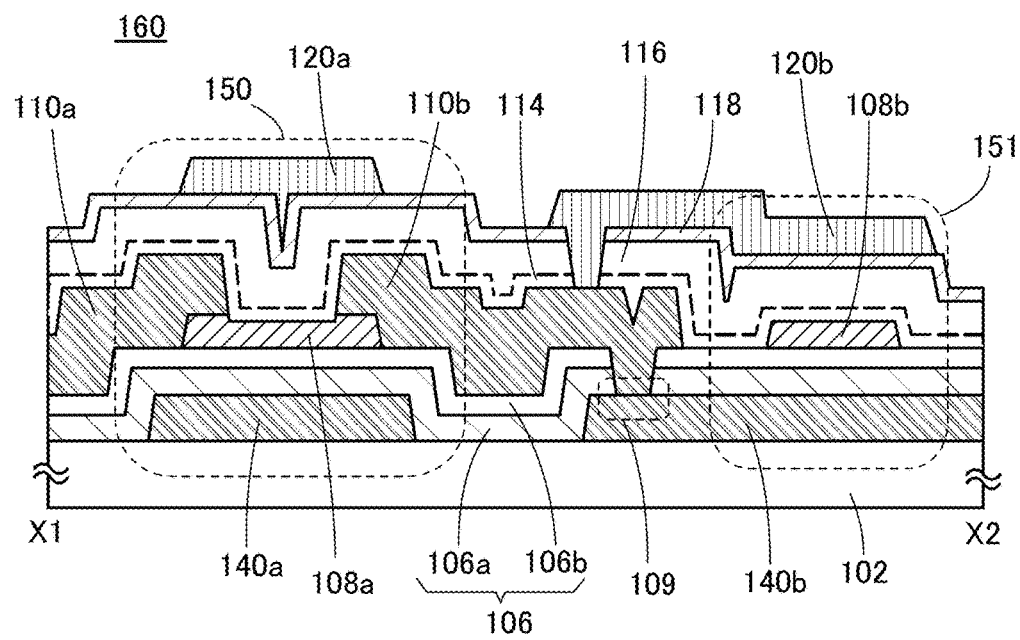

The conductive films 120a and 140a may be supplied with different potentials or the same potential. The conductive films 120b and 140b may be supplied with different potentials or the same potential. FIG. 12B shows an example where the conductive film 140b and the conductive film 120b are connected to each other.

Although this embodiment shows a structure where the oxide semiconductor film 108 is used as the semiconductor layer of the transistor, one embodiment of the present invention is not limited thereto. For example, instead of the oxide semiconductor film 108, a semiconductor material such as Group IV semiconductors (e.g., silicon), Group III semiconductors (e.g., gallium), and compound semiconductors may be used. There is no particular limitation on the crystallinity of the semiconductor material; for example, an amorphous semiconductor film (typically, amorphous silicon) or a crystalline semiconductor film (typically, polycrystalline silicon) can be used. In the case where amorphous silicon is used for an amorphous semiconductor film, in order to make an ohmic contact with amorphous silicon, a semiconductor layer to which an impurity such as phosphorus (P) or arsenic (As) is added may be provided between the electrode layers 110a to 110d and the amorphous silicon film.

The structure and method described in this embodiment can be implemented by being combined as appropriate with any of the other structures and methods described in the other embodiments.

Embodiment 2

In this embodiment, a semiconductor device of one embodiment of the present invention is described with reference to FIGS. 13A and 13B, FIGS. 14A and 14B, FIGS. 15A and 15B, and FIG. 16.

<Structure Example 1 of Semiconductor Device>

Figure 13A:
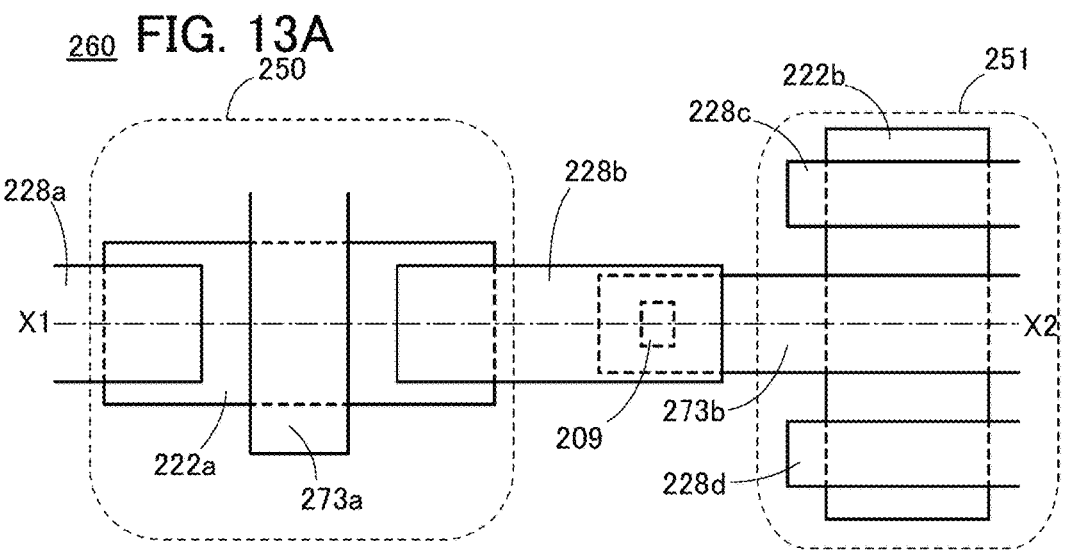
FIGS. 13A and 13B are a top view and a cross-sectional view of a semiconductor device.
Figure 13B:
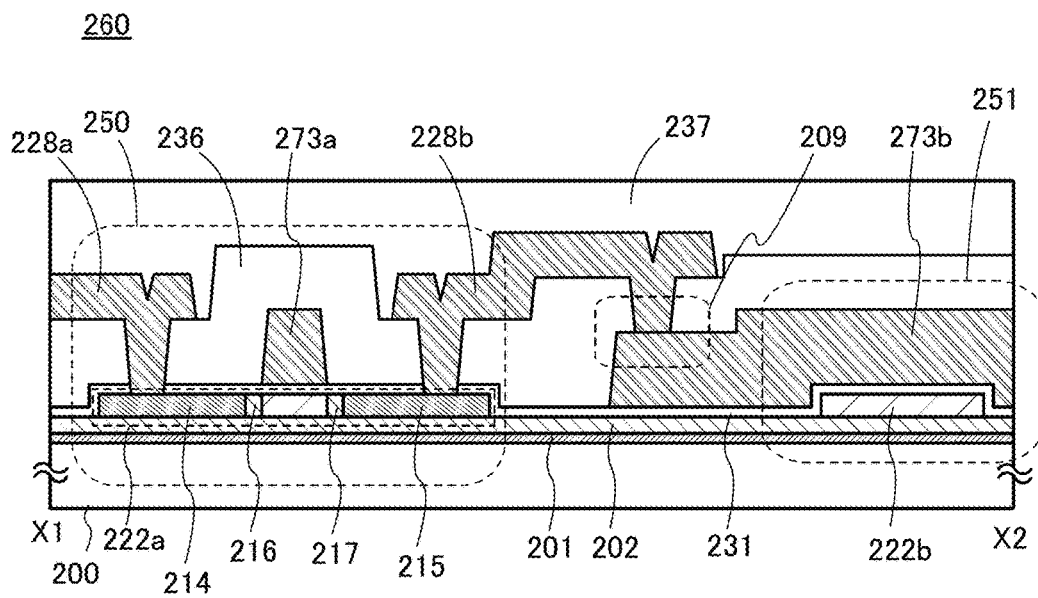

FIG. 13A is a top view illustrating a semiconductor device 260 of one embodiment of the present invention, and FIG. 13B is a cross-sectional view taken along dashed-dotted line X1-X2 in FIG. 13A. Note that in FIG. 13A, some components of the semiconductor device 260 are not illustrated to avoid complexity.

The semiconductor device 260 includes a transistor 250 and a transistor 251. FIG. 13B is a cross-sectional view of the transistor 250 in the channel length direction and a cross-sectional view of the transistor 251 in the channel width direction.

Here, components of the semiconductor device 260 shown in FIGS. 13A and 13B are described below.

An insulating film 201 and an insulating film 202 are formed over the substrate 200. The semiconductor layer 222a and the semiconductor layer 222b in which channel regions of the transistors are formed in island-like shapes over the insulating film 202.

There is no particular limitation on the property of a material and the like of the substrate 200 as long as the material has heat resistance enough to withstand at least heat treatment to be performed later. For example, a glass substrate, a ceramic substrate, a quartz substrate, a sapphire substrate, or the like may be used as the substrate 200. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 200. Furthermore, any of these substrates further provided with a semiconductor element may be used as the substrate 200. In the case where a glass substrate is used as the substrate 200, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized liquid crystal display device can be manufactured.

Alternatively, a flexible substrate may be used as the substrate 200, and the transistor may be provided directly on the flexible substrate. Further alternatively, a separation layer may be provided between the substrate 200 and the transistor. The separation layer can be used when part or the whole of an element portion formed over the separation layer is completed and separated from the substrate 200 and transferred to another substrate. In such a case, the transistor can be transferred to a substrate having low heat resistance or a flexible substrate as well.

Each of the insulating film 201 and the insulating film 202 can have a single layer structure or a stacked-layer structure including an insulating film formed of silicon oxide, silicon oxynitride, silicon nitride, or the like by a CVD method, a sputtering method, a thermal oxidation method, or the like. As a combination of the insulating film 201 and the insulating film 202, a combination of silicon oxynitride and silicon oxide can be used for example.

The semiconductor layer 222a and the semiconductor layer 222b are preferably formed using crystalline silicon, but may be formed using amorphous silicon. Crystalline silicon is formed in such a manner that, after an amorphous silicon film is formed, the amorphous silicon film is crystallized by laser irradiation. Alternatively, after a metal film such as a Ni film is formed over an amorphous silicon film, the amorphous silicon film may be thermally crystallized. Further alternatively, a crystalline silicon film may be formed by a CVD method.

An insulating film 231 is a gate insulating film. The insulating film 231 can be formed with a single layer structure or a stacked-layer structure using an insulating film of silicon oxide, silicon oxynitride, silicon nitride, or the like by a CVD method, a sputtering method, or the like.

Furthermore, when a silicon oxide film is formed by a CVD method using an organosilane gas as the insulating film 231, the crystallinity of a semiconductor film to be formed later can be increased, whereby the on-state current and the field-effect mobility of the transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Alternatively, the insulating film 231 may be formed by performing plasma treatment on the semiconductor layers 222a and 222b to oxidize or nitride the surfaces of the semiconductor layers 222a and 222b. For example, the insulating film 231 is formed by plasma treatment with a mixed gas of a rare gas such as He, Ar, Kr, or Xe, and oxygen, nitrogen oxide ($NO_2$), ammonia, nitrogen, hydrogen, or the like. In this case, when excitation of plasma is performed by introducing a microwave, plasma with a low electron temperature and high density can be generated. The surface of a semiconductor film can be oxidized or nitrided by oxygen radicals (OH radicals are included in some cases) or nitrogen radicals (NH radicals are included in some cases) generated by this high-density plasma.

By treatment using such high-density plasma, an insulating film with a thickness greater than or equal to 1 nm and less than or equal to 20 nm, typically greater than or equal to 5 nm and less than or equal to 10 nm, is formed over the semiconductor film. Since reaction in this case is solid-phase reaction, interface state density between the insulating film and the semiconductor film can be made quite low. By such high density plasma treatment, since the semiconductor film is directly oxidized (or nitrided), variation in thickness of the formed insulating film can be made extremely small. By solid-phase oxidation of the surface of the semiconductor film through such high-density plasma treatment, an insulating film which has favorable uniformity and low interface state density can be formed.

As for the insulating film 231, only the insulating film formed by high density plasma treatment may be used, or one or more of insulating films of silicon oxide, silicon oxynitride, or silicon nitride may be deposited and stacked by a CVD method, a sputtering method, or the like. In any case, when transistors include an insulating film formed by high-density plasma in a part or the whole of a gate insulating film, variations in characteristics can be reduced.

Next, a conductive film 273a and a conductive film 273b functioning as gate electrodes are formed over the insulating film 231. The conductive films 273a and 273b each include at least a Cu—X alloy film; for example, it is preferable to use a single-layer structure of a Cu—X alloy film or a stacked-layer structure of a Cu—X alloy film and a conductive film including a low-resistance material such as copper (Cu), aluminum (Al), gold (Au), or silver (Ag), an alloy of any of these materials, or a compound containing any of these materials as its main component. The Cu—X alloy film included in the conductive film 273 is preferably in contact with an insulating film containing oxygen. When the Cu—X alloy film is in contact with an insulating film containing oxygen, X in the Cu—X alloy film forms an oxide film of X at an interface with the insulating film containing oxygen in some cases. With the oxide film, Cu in the Cu—X alloy film can be prevented from diffusing into the insulating film and entering the semiconductor layers 222a and 222b.

For example, when the conductive films 273a and 273b are Cu—Mn alloy films, adhesion between the conductive films 273a and 273b and the insulating film can be increased.

Impurity regions 214 and impurity regions 215 are formed in the semiconductor layer 222a, and impurity regions 216 and impurity regions 217 are formed in the semiconductor layer 222b. An impurity element can be introduced by an ion doping method, an ion implantation method, or the like with the use of an n-type impurity element or a p-type impurity element. As the n-type impurity element, phosphorus (P), arsenic (As), or the like can be used. As the p-type impurity element, boron (B), aluminum (Al), gallium (Ga), or the like can be used.

The insulating films 236 and 237 function as interlayer insulating films. The insulating films 236 and 237 can be formed using an insulating film made of silicon oxide, silicon oxynitride, silicon nitride, or the like by a CVD method, a sputtering method, or the like. Alternatively, an organic resin such as an acrylic resin, a polyimide resin, a benzocyclobutene-based resin, a siloxane-based resin, a polyamide resin, or an epoxy resin can be used.

The conductive films 228a to 228d function as source electrodes and drain electrodes. The conductive films 228a to 228d each include at least a Cu—X alloy film; for example, it is preferable to use a single-layer structure of a Cu—X alloy film or a stacked-layer structure of a Cu—X alloy film and a conductive film including a low-resistance material such as copper (Cu), aluminum (Al), gold (Au), or silver (Ag), an alloy of any of these materials, or a compound containing any of these materials as its main component. The Cu—X alloy film included in each of the conductive films 228a to 228d is preferably in contact with an insulating film containing oxygen. When the Cu—X alloy film is in contact with an insulating film containing oxygen, X in the Cu—X alloy film forms an oxide film of X at an interface with the insulating film containing oxygen in some cases. With the oxide film, Cu in the Cu—X alloy film can be prevented from diffusing into the insulating film and entering the semiconductor layers 222a and 222b.

For example, the conductive films 228a to 228d are Cu—Mn alloy films. When the conductive films 228a to 228d are Cu—Mn alloy films, adhesion between the insulating film and the conductive films 228a to 228d can be increased.

The conductive films 273a, 273b, and 228a to 228d also function as wirings or the like. In the case where the conductive films include a Cu—X alloy film, or a Cu—X alloy film and a conductive film containing a low-resistance material such as copper (Cu), aluminum (Al), gold (Au), or silver (Ag), even when the substrate 200 is a large-sized substrate, a semiconductor device in which wiring delay is suppressed can be provided.

Furthermore, the conductive film 228b and the conductive film 273b are connected to each other through the contact hole 209. It is preferable that the Cu—X alloy film included in the conductive film 228b be in contact with the Cu—X alloy film included in the conductive film 273b through the contact hole 209. When the Cu—X alloy films are in contact with each other, contact resistance can be reduced, and thus even in the case where a large-sized substrate is used as the substrate 200, a semiconductor device in which wiring delay is suppressed can be manufactured.

When the semiconductor device 260 has the above structure, entry of copper (Cu) elements into the semiconductor layers 222a and 222b can be suppressed, and a highly reliable semiconductor device in which wiring delay is suppressed can be provided.

Figure 16:
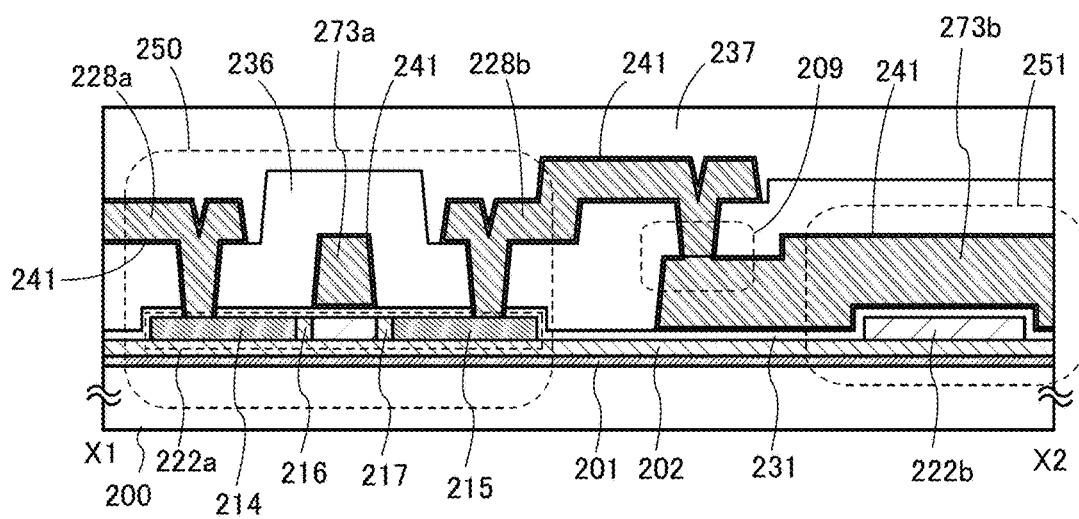
FIG. 16 is a cross-sectional view of a semiconductor device.

The cross-sectional view of the semiconductor device 260 in FIG. 16 is different from that of the semiconductor device 260 in FIG. 13B in that an oxide film 241 surrounds the conductive films 273a, 273b, and 228a to 228d. The structure of the semiconductor device 260 illustrated in FIG. 16 is the same as that of the semiconductor device 260 illustrated in FIG. 13B, except for the above.

The semiconductor device 260 illustrated in FIG. 16 is an example where heat treatment is performed on the semiconductor device 260 in FIG. 13B and the oxide film 241 is formed around the conductive films 273a, 273b, and 228a to 228d. In the case where an oxide (here, an insulating film containing oxygen) and a conductive film containing a Cu—X alloy are in contact with each other and heated, X in the Cu—X alloy is segregated in the vicinity of an interface between the oxide and the conductive film and reacts with oxygen, so that the oxide film 241 is formed. In the case where X is Mn, examples of a substance contained in the oxide film 241 include a Mn oxide, an In—Mn oxide (in the case where the oxide contains In), a Ga—Mn oxide (in the case where the oxide contains Ga), an In—Ga—Mn oxide (in the case where the oxide contains In and Ga), an In—Ga—Zn—Mn oxide (in the case where the oxide contains In, Ga, and Zn), a Si—Mn oxide (in the case where the oxide contains silicon), an Al—Mn oxide (in the case where the oxide contains aluminum), and a Hf—Mn oxide (in the case where the oxide contains hafnium).

The heat treatment may be performed at a temperature higher than or equal to 100° C. and lower than or equal to 650° C., preferably higher than or equal to 150° C. and lower than or equal to 500° C., further preferably higher than or equal to 200° C. and lower than or equal to 350° C. The heat treatment may be performed using heat applied to the substrate in the formation step of the conductive film, the electrode layer, or the insulating film.

The high resistance oxide film 241 is not formed in the contact hole 209 in which the conductive film 228b and the conductive film 273b are in contact with each other. Therefore, even when the heat treatment is performed, contact resistance between the conductive film 228b and the conductive film 273b can be kept low.

By the oxide film 241, Cu included in the conductive films 273a, 273b, and 228a to 228d can be prevented from diffusing into the outside of the conductive films and adversely affecting the semiconductor layers 222a and 222b. When the semiconductor device 260 has the above structure, a highly reliable semiconductor device in which wiring delay is suppressed can be provided.

<Structure Example 2 of Semiconductor Device>

Figure 14A:
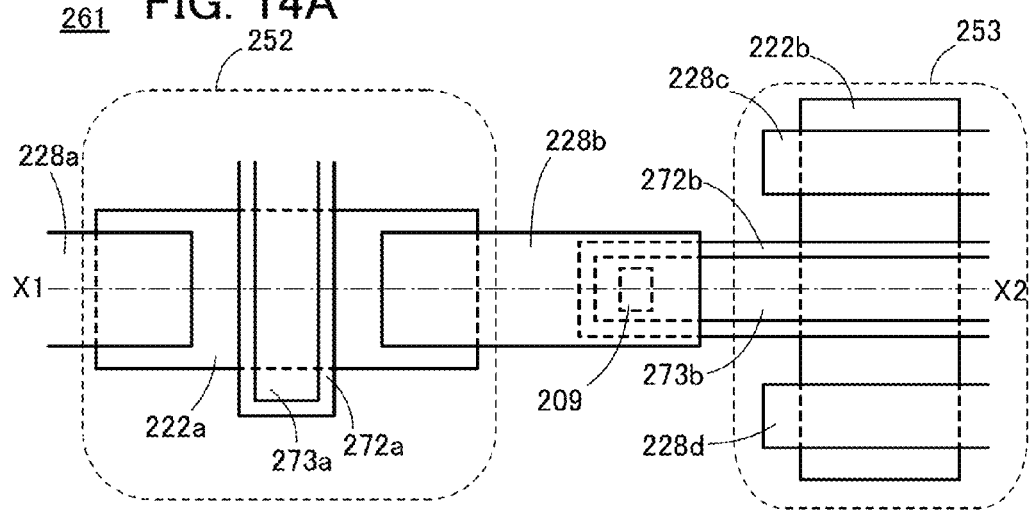
FIGS. 14A and 14B are a top view and a cross-sectional view of a semiconductor device.
Figure 14B:
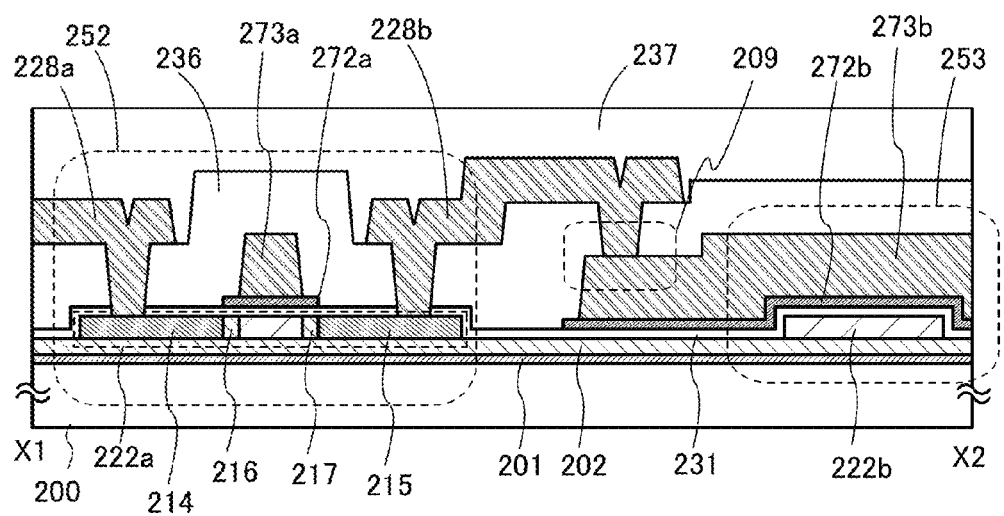

FIG. 14A is a top view illustrating a semiconductor device 261 of one embodiment of the present invention, and FIG. 14B is a cross-sectional view taken along dashed-dotted line X1-X2 in FIG. 14A. Note that in FIG. 14A, some components of the semiconductor device 261 are not illustrated to avoid complexity.

FIG. 14B is a cross-sectional view of the semiconductor device 261 of one embodiment of the present invention. The semiconductor device 261 includes a transistor 252 and a transistor 253. FIG. 14B is a cross-sectional view of the transistor 252 in the channel length direction and a cross-sectional view of the transistor 253 in the channel width direction.

The semiconductor device 261 in FIG. 14B is an example where, in the cross-sectional view of the semiconductor device 260 in FIG. 13B, a conductive film 272a is provided between the insulating film 231 and the conductive film 273a and a conductive film 272b is provided between the insulating film 231 and the conductive film 273b. The impurity regions 216 and 217 are formed under the conductive films 272a and 272b. The structure of the semiconductor device 261 is the same as that of the semiconductor device 260, except for the above.

Each of the conductive film 272a and the conductive film 272b can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component (for example, tantalum nitride). Alternatively, they are each formed using a semiconductor material typified by polycrystalline silicon doped with an impurity element such as phosphorus. Note that the conductive films 272a and 272b and the conductive films 273a and 273b may be formed of the same conductive material or different conductive materials.

As illustrated in FIGS. 14A and 14B, the conductive films 272a and 272b functioning as gate electrodes are formed over the impurity regions 216 and 217; thus, a transistor which is less likely to be affected by hot-carrier degradation can be provided.

<Structure Example 3 of Semiconductor Device>

Figure 15A:
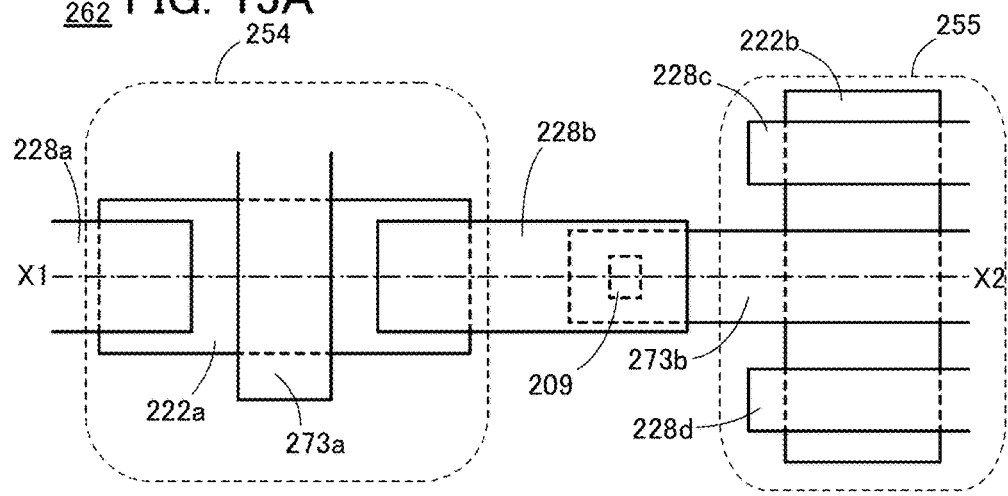
FIGS. 15A and 15B are a top view and a cross-sectional view of a semiconductor device.
Figure 15B:
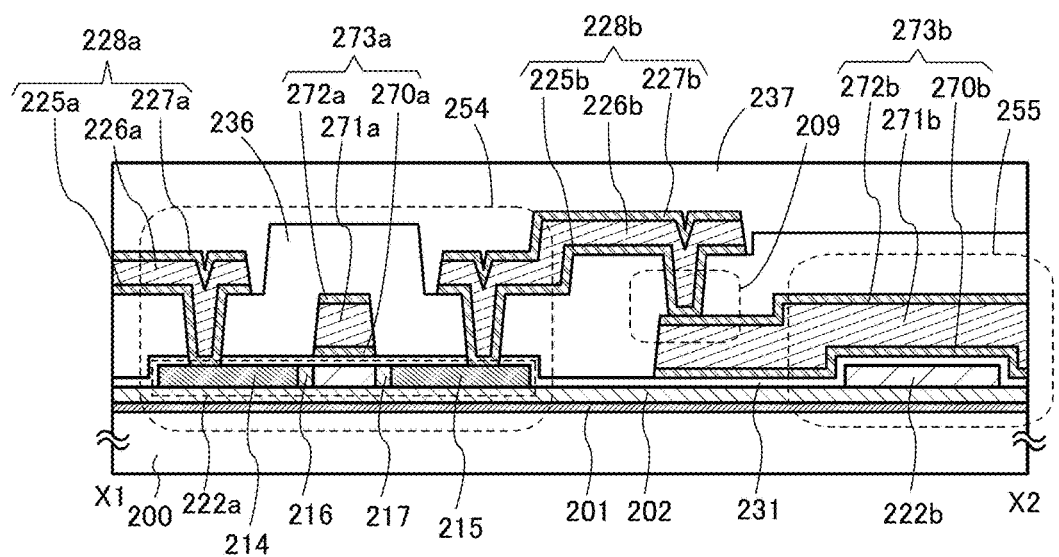

FIG. 15A is a top view illustrating a semiconductor device 262 of one embodiment of the present invention, and FIG. 15B is a cross-sectional view taken along dashed-dotted line X1-X2 in FIG. 15A. Note that in FIG. 15A, some components of the semiconductor device 262 are not illustrated to avoid complexity.

FIG. 15B is a cross-sectional view of the semiconductor device 262 of one embodiment of the present invention. The semiconductor device 262 includes a transistor 254 and a transistor 255. FIG. 15B is a cross-sectional view of the transistor 254 in the channel length direction and a cross-sectional view of the transistor 255 in the channel width direction.

The semiconductor device 262 illustrated in FIG. 15B is an example where, in the cross-sectional view of the semiconductor device 260 in FIG. 13B, the conductive films 228a to 228d and the conductive films 273a and 273b each have a three-layer stacked structure. The conductive film 228a is a layer in which a conductive film 225a, a conductive film 226a, and a conductive film 227a are stacked in this order, the conductive film 228b is a layer in which a conductive film 225b, a conductive film 226b, and a conductive film 227b are stacked in this order, the conductive film 228c is a layer in which a conductive film 225c, a conductive film 226c, and a conductive film 227c are stacked in this order, the conductive film 228d is a layer in which a conductive film 225d, a conductive film 226d, and a conductive film 227d are stacked in this order, the conductive film 273a is a layer in which a conductive film 270a, a conductive film 271a, and a conductive film 272a are stacked in this order, and the conductive film 273b is a layer in which a conductive film 270b, a conductive film 271b, and a conductive film 272b are stacked in this order. The structure of the semiconductor device 262 is the same as that of the semiconductor device 260, except for the above.

Hereinafter, the conductive films 270a and 270b are collectively referred to as a conductive film 270, the conductive films 271a and 271b are collectively referred to as a conductive film 271, and the conductive films 272a and 272b are collectively referred to as a conductive film 272.

Hereinafter, the conductive films 225a to 225d are collectively referred to as a conductive film 225, the conductive films 226a to 226d are collectively referred to as a conductive film 226, and the conductive films 227a to 227d are collectively referred to as a conductive film 227.

In the semiconductor device 262 in FIGS. 15A and 15B, the conductive films 225, 227, 270, and 272 are preferably Cu—X alloy films. When these conductive films in contact with insulating films containing oxygen are Cu—X alloy films, X in the Cu—X alloy film forms an oxide film of X at an interface with the insulating film containing oxygen, and thus, Cu in the Cu—X alloy film can be prevented from diffusing into the insulating film and entering the semiconductor layer 222.

As the conductive films 226 and 271, a conductive film including a low-resistance material such as copper (Cu), aluminum (Al), gold (Au), or silver (Ag), an alloy of any of these materials, or a compound containing any of these materials as its main components is preferably used.

When the thickness of the conductive film 226 is larger than those of the conductive films 225 and 227, the conductivity of the conductive films 228a to 228d is preferably increased.

When the thickness of the conductive film 271 is larger than those of the conductive films 270 and 272, the conductivity of the conductive films 273a and 273b is preferably increased.

For example, the conductive films 225, 227, 270, and 272 are Cu—Mn alloy films and the conductive films 226 and 271 are copper (Cu) films. Note that, the copper (Cu) film means pure copper (Cu), and the purity thereof is preferably higher than or equal to 99%. Note that pure copper (Cu) contains an impurity element at a small percentage in some cases.

When the conductive films 225, 227, 270, and 272 are Cu—Mn alloy films, adhesion with insulating films in contact with the conductive films can be increased.

The conductive film 225b and the conductive film 272b which are Cu—Mn alloy films are in contact with each other through the contact hole 209; thus, contact resistance between the conductive film 228b and the conductive film 273b can be kept low.

When the semiconductor device 262 has the above structure, entry of copper (Cu) elements into the semiconductor layers 222a and 222b can be suppressed, and a highly reliable semiconductor device in which wiring delay is suppressed can be provided.

Figure 17A:
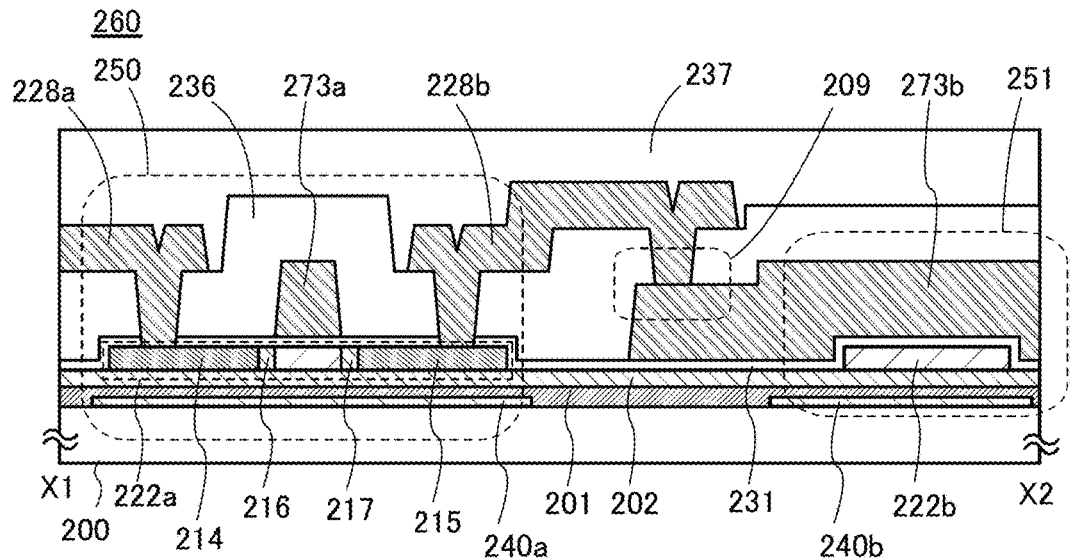
FIGS. 17A and 17B are each a cross-sectional view of a semiconductor device.

For example, in FIG. 13B, a layer 240a and a layer 240b may be provided under channel regions of the transistors. The layers 240a and 240b each have a light-blocking function, for example. Thus, an increase in off-state current caused by entry of light into a channel region can be suppressed. FIG. 17A shows an example of this case.

Figure 17B:
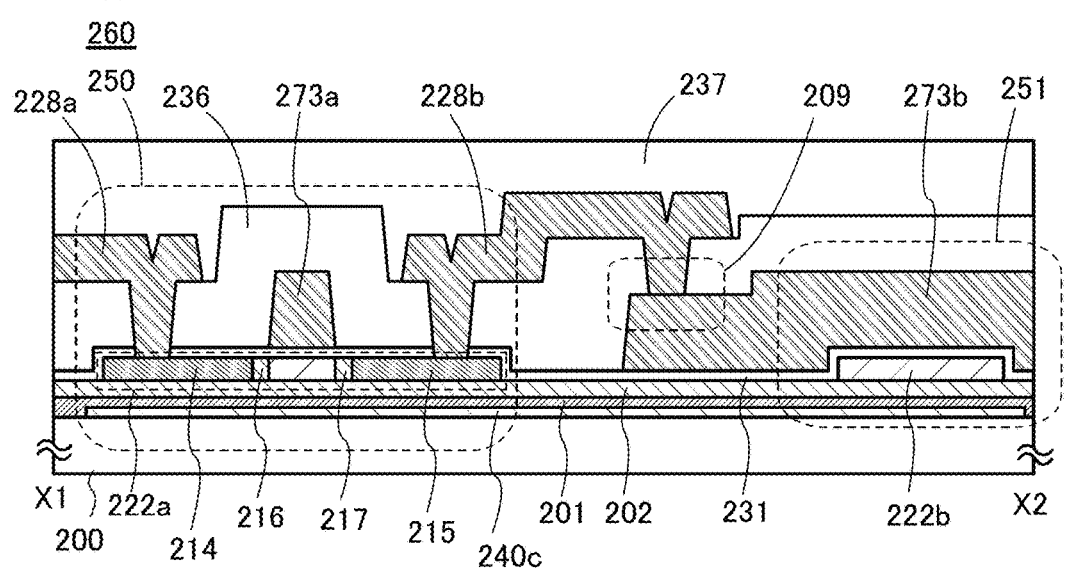

For the layers 240a and 240b, for example, the materials or stacked-layer structure of the conductive films 228a to 228d, the conductive films 273a and 273b, and the like can be used. Alternatively, for the layers 240a and 240b, molybdenum, tungsten, silicon, an alloy thereof, or the like may be used. Note that the layers 240a and 240b may be in a floating state, for example. The layers 240a and 240b may form a layer 240c which is an island. FIG. 17B shows an example of this case.

The structure and method described in this embodiment can be implemented by being combined as appropriate with any of the other structures and methods described in the other embodiments.

Embodiment 3

In this embodiment, a display device that can be formed using a semiconductor device of one embodiment of the present invention is described with reference to FIGS. 18A to 18C.

The display device illustrated in FIG. 18A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by chip-on-glass (COG) or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_Y). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal to Y), a pulse signal is input from the gate driver 504a through the scan line GL_m, and a data signal is input from the source driver 504b through the data line DL_n in accordance with the potential of the scan line GL_m.

Figure 18A:
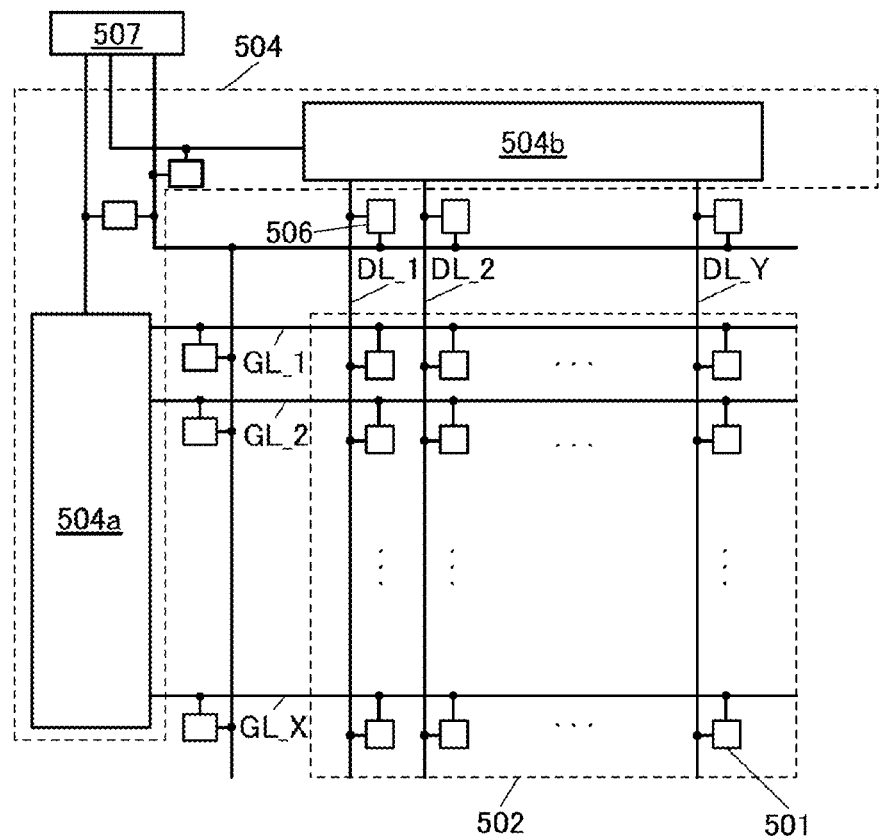
FIGS. 18A to 18C are a block diagram and circuit diagrams illustrating a display device.

The protection circuit 506 shown in FIG. 18A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 18A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 18A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 18B:
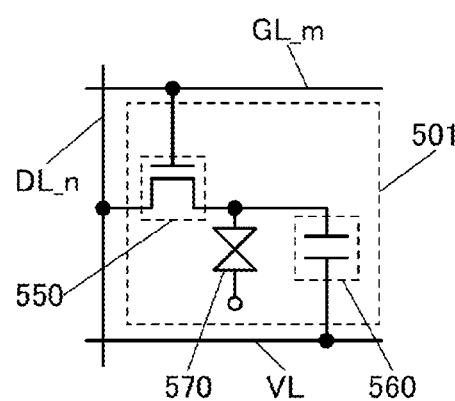

Each of the plurality of pixel circuits 501 in FIG. 18A can have the structure illustrated in FIG. 18B, for example.

The pixel circuit 501 illustrated in FIG. 18B includes a liquid crystal element 570, a transistor 550, and a capacitor 560.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 18B, the pixel circuits 501 are sequentially selected row by row by the gate driver 504a illustrated in FIG. 18A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 18C:
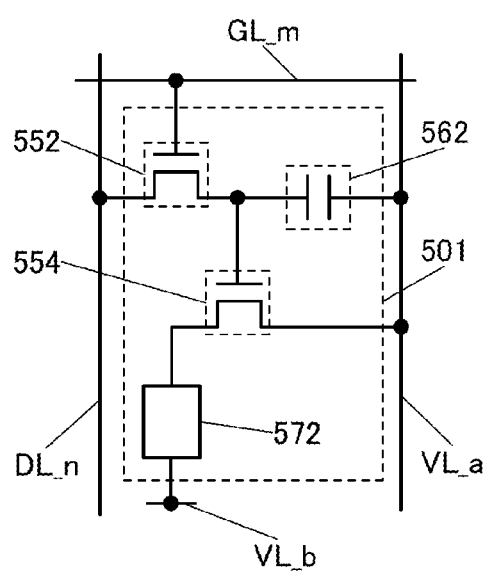

Alternatively, each of the plurality of pixel circuits 501 in FIG. 18A can have the structure illustrated in FIG. 18C, for example.

The pixel circuit 501 illustrated in FIG. 18C includes transistors 552 and 554, a capacitor 562, and a light-emitting element 572. A source electrode or a drain electrode of the transistor 552 is electrically connected to a gate electrode of the transistor 554. Here, any of the semiconductor devices 160, 161, 162, 163, 260, 261, and 262 described in the above embodiments, for example, can be used as the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 18C, the pixel circuits 501 are sequentially selected row by row by the gate driver 504a illustrated in FIG. 18A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although an example where the liquid crystal element 570 and the light-emitting element 572 are used as display elements is shown here, one embodiment of the present invention is not limited thereto.

For example, in this specification and the like, a display element, a display device which is a device including a display element, a light-emitting element, and a light-emitting device which is a device including a light-emitting element can employ various modes and can include various elements. Examples of a display element, a display device, a light-emitting element, or a light-emitting device include a display medium whose contrast, luminance, reflectance, transmittance, or the like is changed by electromagnetic action, such as an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a carbon nanotube. Examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink, electro liquid powder, or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

The structure described in this embodiment can be used in appropriate combination with any of the other structures described in the other embodiments.

Embodiment 4

In this embodiment, a driver circuit of a display device to which the semiconductor device of one embodiment of the present invention can be applied will be described with reference to drawings.

Figure 19:
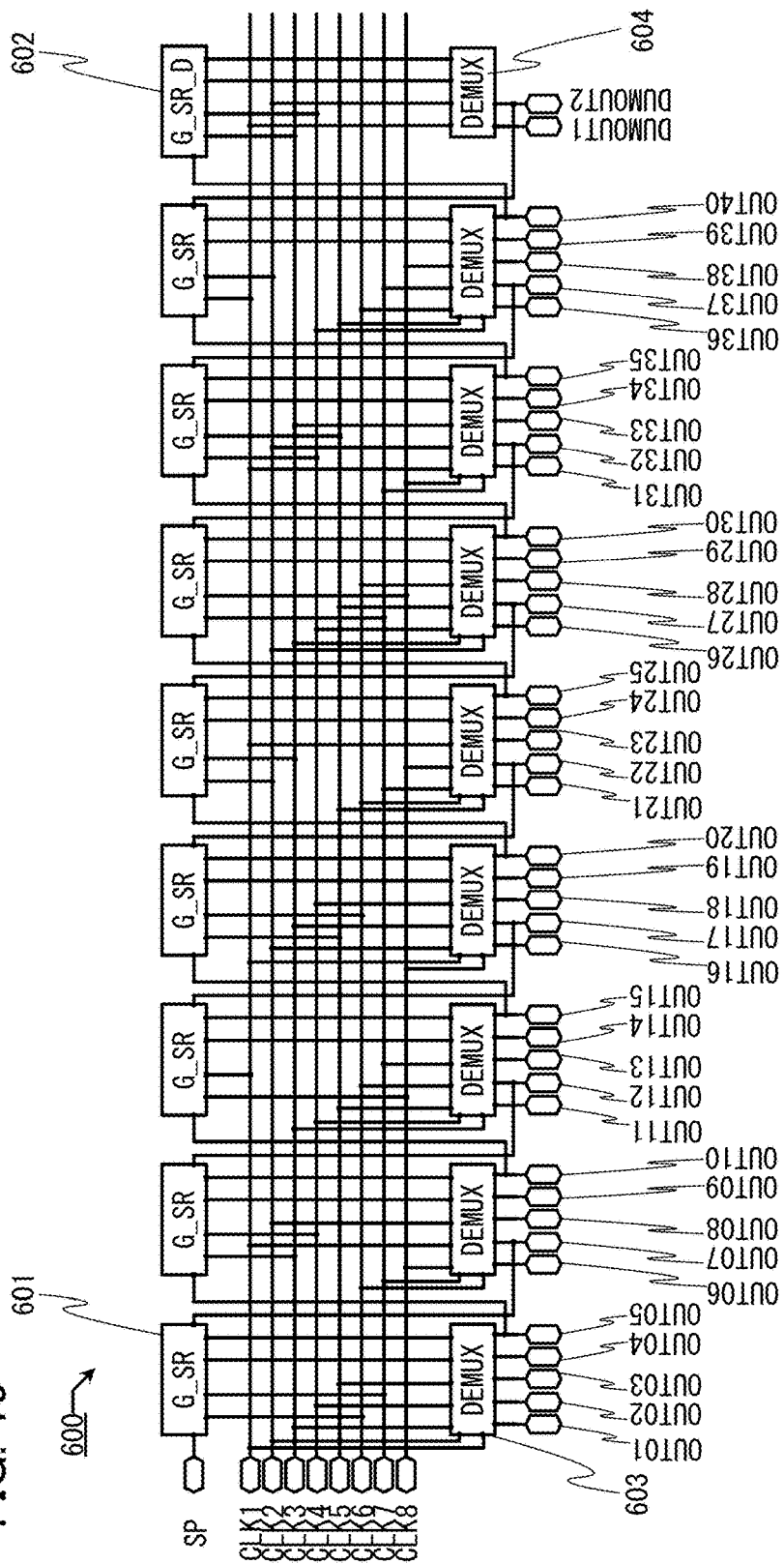
FIG. 19 illustrates an overall view of a gate driver circuit.

FIG. 19 is a diagram of an entire gate driver circuit as one example of a driver circuit of a display device. A gate driver circuit 600 includes a plurality of shift register units 601, a shift register unit 602 which is a dummy stage, demultiplexer circuits 603 electrically connected to the shift register units 601, a demultiplexer circuit 604 electrically connected to the shift register unit 602, and signal lines transmitting a start pulse SP and clock signals (CLK1 to CLK8).

To the shift register unit 601 (here, description is made by using a shift register unit in the first stage), as shown in FIG. 20A, a set signal LN (here, the start pulse SP), a reset signal RIN, and clock signals (here, CLK6 and CLK7) are input. FIG. 20B illustrates a specific circuit structure example. The shift register unit 601 includes a first transistor 611 to a sixth transistor 616.

One of a source and a drain of the first transistor 611 is connected to a high power supply potential line VDD. The other of the source and the drain of the first transistor 611 is connected to one of a source and a drain of the second transistor 612 and an input terminal FN1 of the demultiplexer circuit 603. The set signal LN is input to a gate of the first transistor 611. The other of the source and the drain of the second transistor 612 is connected to a low power supply potential line VSS. A gate of the second transistor 612 is connected to an input terminal FN2 of the demultiplexer circuit 603, one of a source and a drain of the fourth transistor 614, one of a source and a drain of the fifth transistor 615, and one of a source and a drain of the sixth transistor 616. One of a source and a drain of the third transistor 613 is connected to the high power supply potential line VDD. The other of the source and the drain of the third transistor 613 is connected to the other of the source and the drain of the fourth transistor 614. The clock signal CLK7 is input to a gate of the third transistor 613. The clock signal CLK6 is input to a gate of the fourth transistor 614. The other of the source and the drain of the fifth transistor 615 is connected to the low power supply potential line VSS. The set signal LN is input to a gate of the fifth transistor 615. The other of the source and the drain of the sixth transistor 616 is connected to the high power supply potential line VDD. The reset signal RN is input to a gate of the sixth transistor 616. Note that a portion in which the other of the source and the drain of the first transistor 611 and the one of the source and the drain of the second transistor 612 are electrically connected is referred to as a node FN1. A portion in which the gate of the second transistor 612, the one of the source and the drain of the fourth transistor 614, the one of the source and the drain of the fifth transistor 615, and the one of the source and the drain of the sixth transistor 616 are electrically connected is referred to as a node FN2.

The clock signals CLK6 and CLK7 are input to the shift register unit 601 in the (8a+1)th stage (a is zero or a natural number). The clock signals CLK3 and CLK4 are input to the shift register unit 601 in the (8a+2)th stage (a is zero or a natural number). The clock signals CLK1 and CLK8 are input to the shift register unit 601 in the (8a+3)th stage (a is zero or a natural number). The clock signals CLK5 and CLK6 are input to the shift register unit 601 in the (8a+4)th stage (a is zero or a natural number). The clock signals CLK2 and CLK3 are input to the shift register unit 601 in the (8a+5)th stage (a is zero or a natural number). The clock signals CLK7 and CLK8 are input to the shift register unit 601 in the (8a+6)th stage (a is zero or a natural number). The clock signals CLK4 and CLK5 are input to the shift register unit 601 in the (8a+7)th stage (a is zero or a natural number). The clock signals CLK1 and CLK2 are input to the shift register unit 601 in the 8(a+1)th stage (a is zero or a natural number).

Figure 21B:
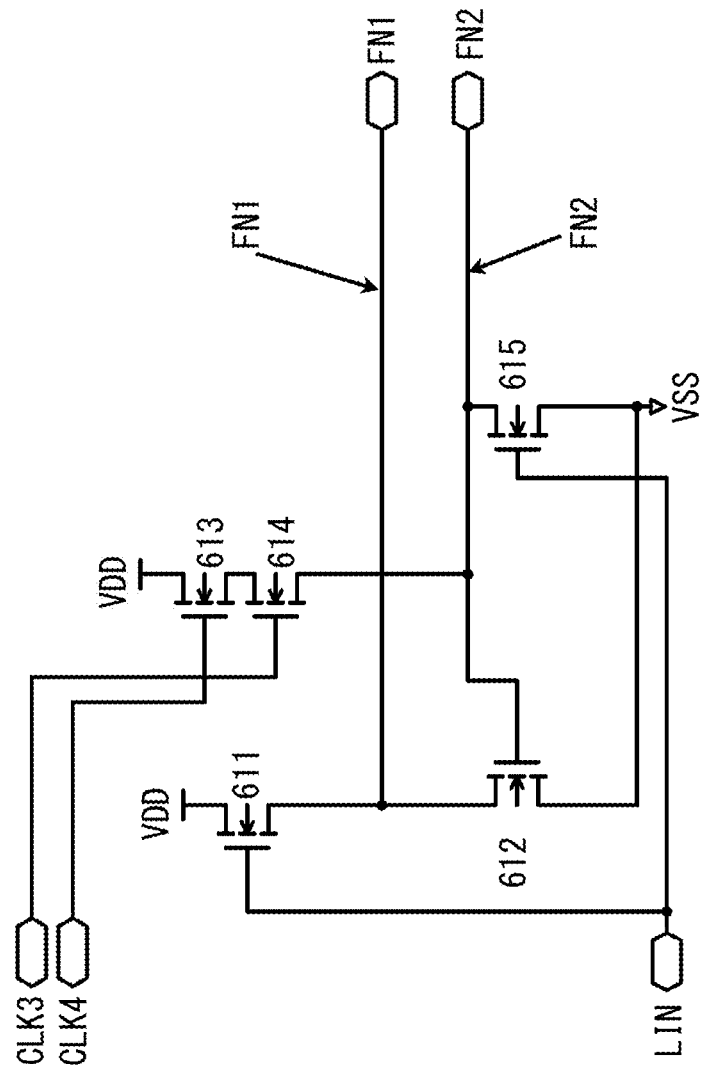
FIGS. 21A and 21B illustrate a shift register unit which is a dummy stage.
Figure 21A:
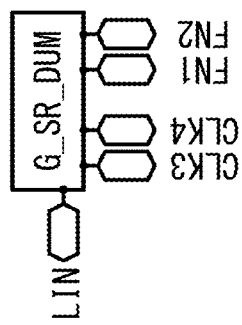

The set signal LIN and clock signals (here, CLK3 and CLK4) are input to the shift register unit 602 which is a dummy stage, as illustrated in FIG. 21A. FIG. 21B illustrates a specific circuit structure example. The shift register unit 602 includes the first transistor 611 to the fifth transistor 615.

The one of the source and the drain of the first transistor 611 is connected to the high power supply potential line VDD. The other of the source and the drain of the first transistor 611 is connected to the one of the source and the drain of the second transistor 612 and the input terminal FN1 of the demultiplexer circuit 604. The set signal LIN is input to the gate of the first transistor 611. The other of the source and the drain of the second transistor 612 is connected to the low power supply potential line VSS. The gate of the second transistor 612 is connected to the input terminal FN2 of the demultiplexer circuit 604, the one of the source and the drain of the fourth transistor 614, and the one of the source and the drain of the fifth transistor 615. The one of the source and the drain of the third transistor 613 is connected to the high power supply potential line VDD. The other of the source and the drain of the third transistor 613 is connected to the other of the source and the drain of the fourth transistor 614. The clock signal CLK4 is input to the gate of the third transistor 613. The clock signal CLK3 is input of the gate of the fourth transistor 614. The other of the source and the drain of the fifth transistor 615 is connected to the low power supply potential line VSS. The set signal LIN is input to the gate of the fifth transistor 615. Note that a portion in which the other of the source and the drain of the first transistor 611 and the one of the source and the drain of the second transistor 612 are electrically connected is referred to as the node FN1. A portion in which the gate of the second transistor 612, the one of the source and the drain of the fourth transistor 614, and the one of the source and the drain of the fifth transistor 615 are electrically connected is referred to as the node FN2.

Figure 22B:
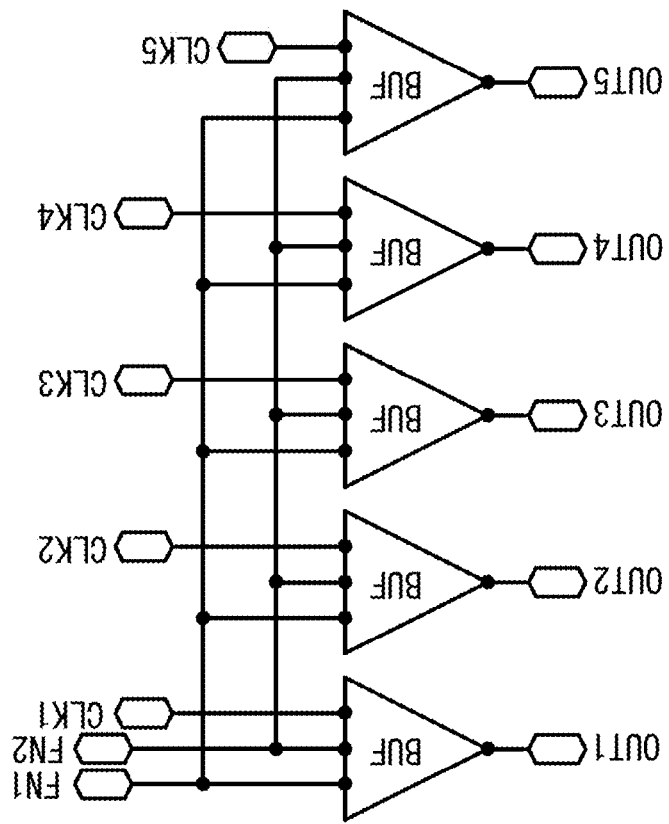
FIGS. 22A and 22B illustrate a demultiplexer.
Figure 22A:
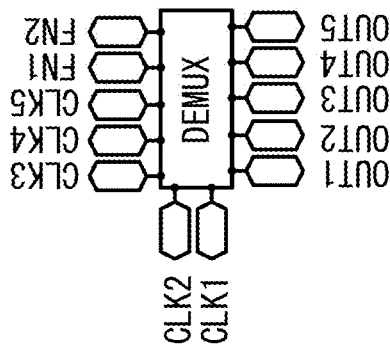
Figure 23A:
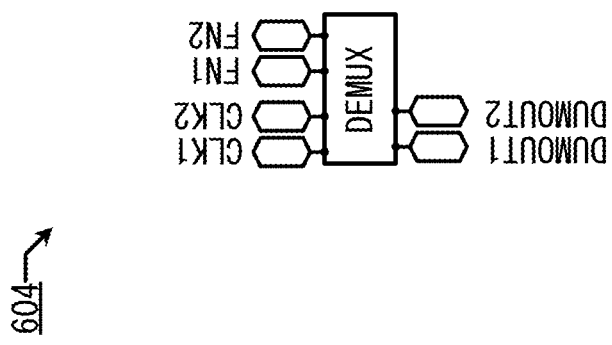
FIGS. 23A and 23B illustrate a demultiplexer.
Figure 23B:
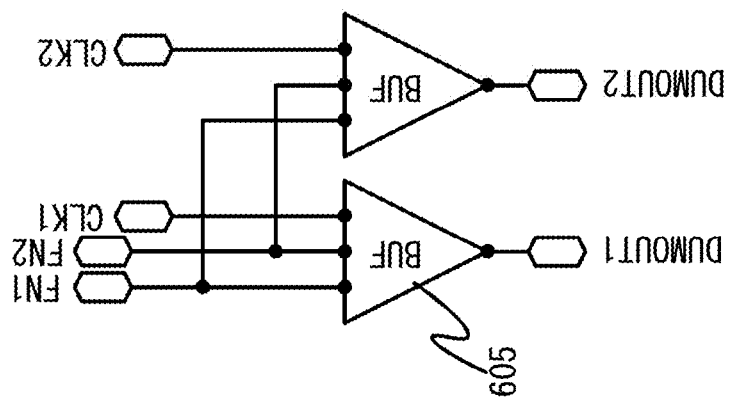

As illustrated in FIG. 22A and FIG. 23A, clock signals and output signals are input from the shift register unit 601 and the shift register unit 602 (signals input to the input terminal FN1 and the input terminal FN2) to the demultiplexer circuit 603 and the demultiplexer circuit 604, and the demultiplexer circuit 603 and the demultiplexer circuit 604 output signals. FIG. 22B and FIG. 23B each illustrate a specific circuit structure example. The demultiplexer circuit 603 and the demultiplexer circuit 604 each include a buffer 605.

Figure 24:
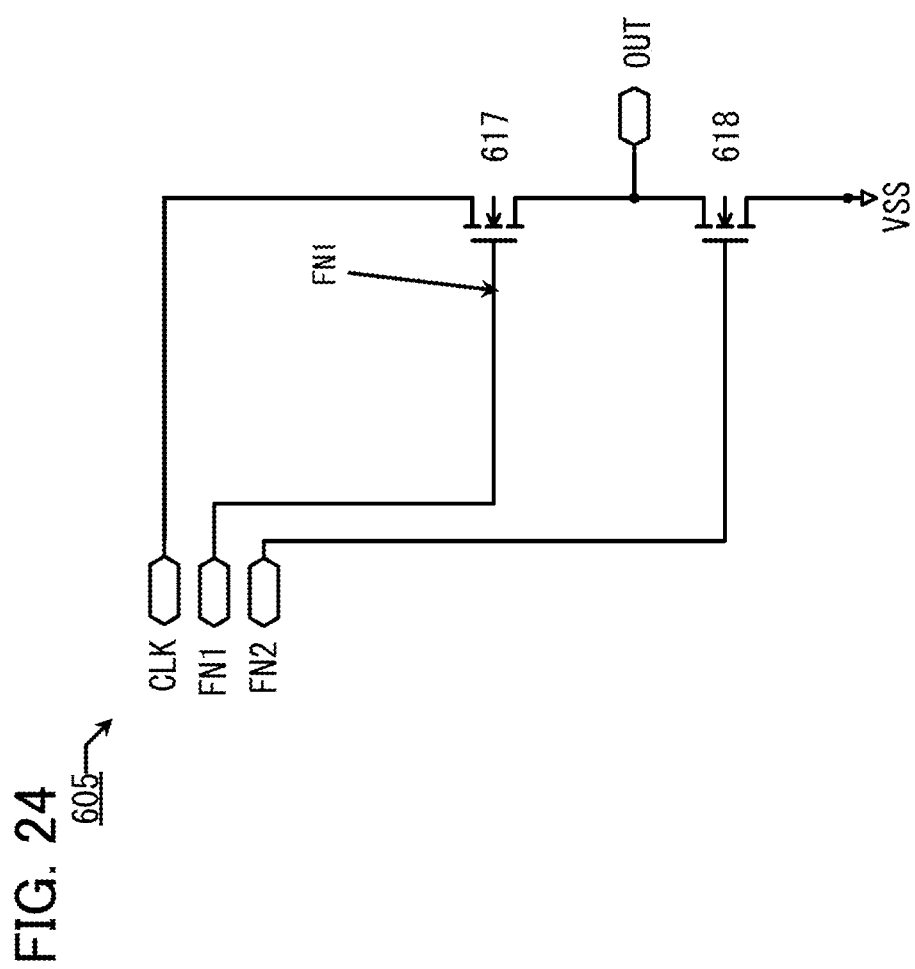
FIG. 24 illustrates a buffer.

FIG. 24 illustrates one example of a specific circuit structure of the buffer 605. A clock signal CLK (one of the clock signals CLK1 to CLK8) is input to one of a source and a drain of a seventh transistor 617. The other of the source and the drain of the seventh transistor 617 is connected to one of a source and a drain of an eighth transistor 618 and an output terminal. A gate of the seventh transistor 617 is connected to the node FN1. The other of the source and the drain of the eighth transistor 618 is connected to the low power supply potential line VSS. A gate of the eighth transistor 618 is connected to the node FN2.

Figure 25B:
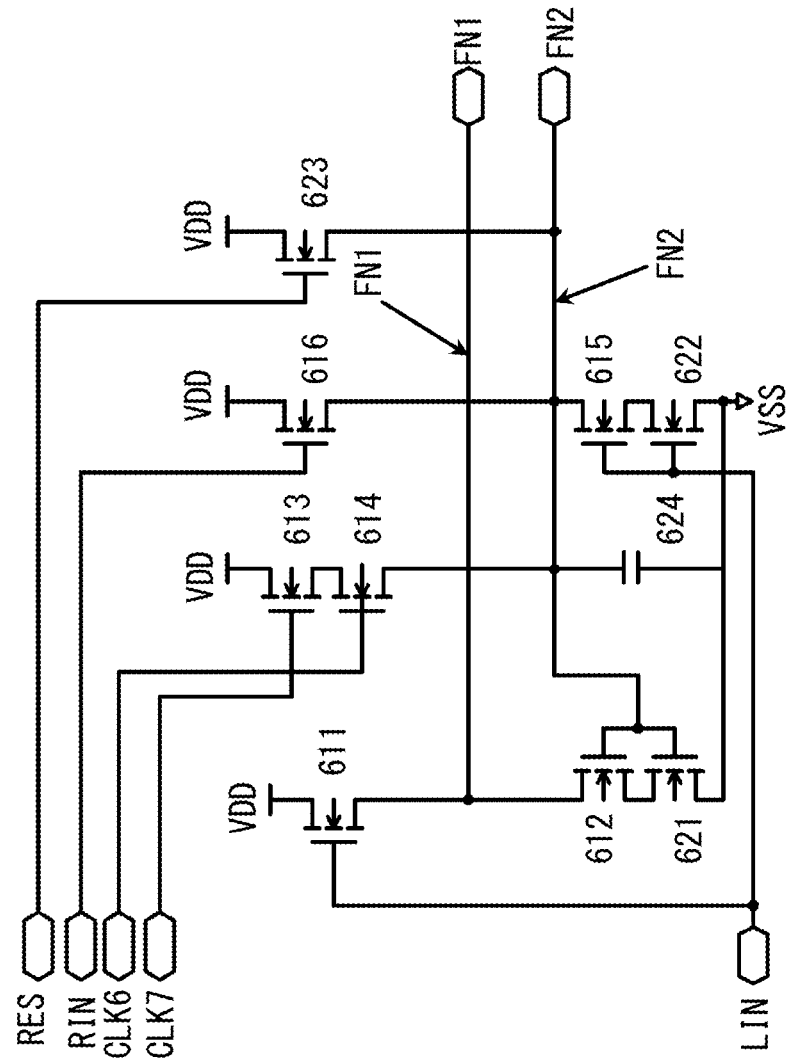
FIGS. 25A and 25B illustrate another shift register unit.
Figure 25A:
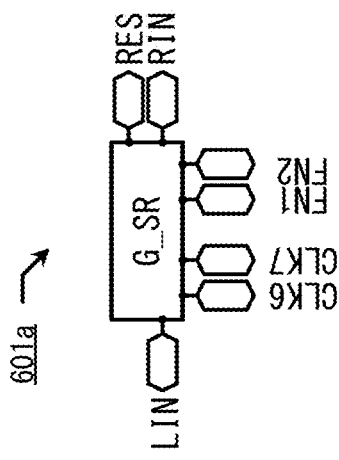

A shift register unit may be a shift register unit 601*a* which is illustrated in FIG. 25A and FIG. 25B and in which a transistor 621, a transistor 622, a transistor 623, and a capacitor 624 are added to the shift register unit 601. Note that a reset signal RES is input to a gate of the transistor 623.

Figure 26B:
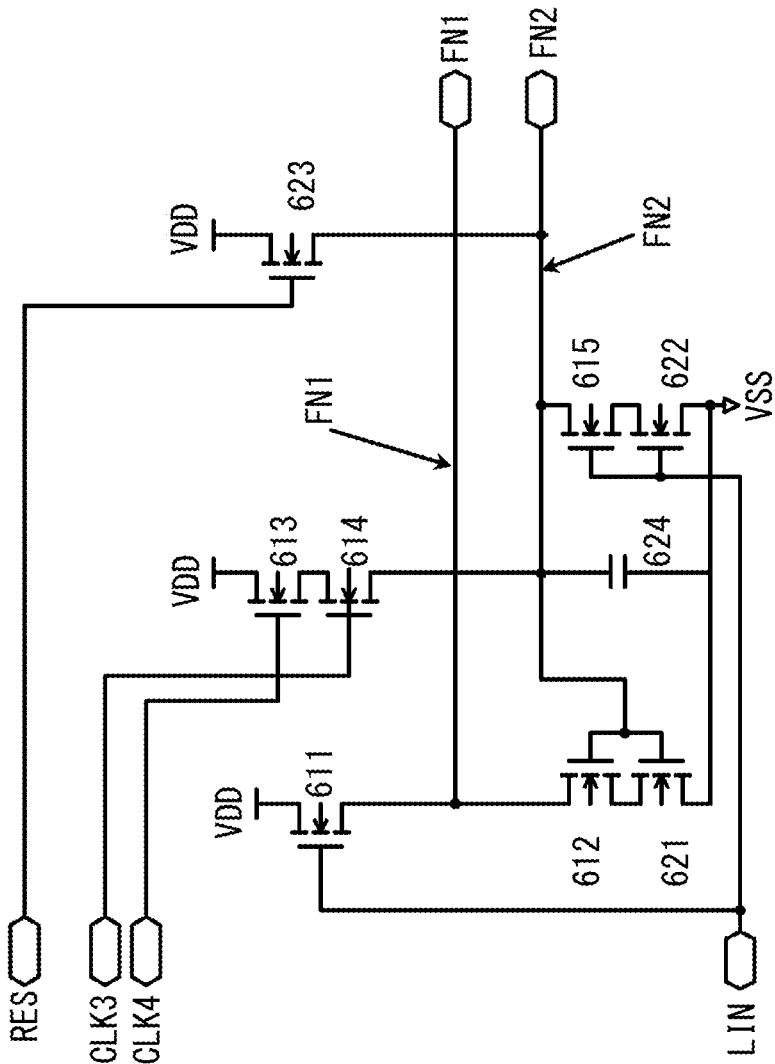
FIGS. 26A and 26B illustrate a shift register unit which is a dummy stage.
Figure 26A:
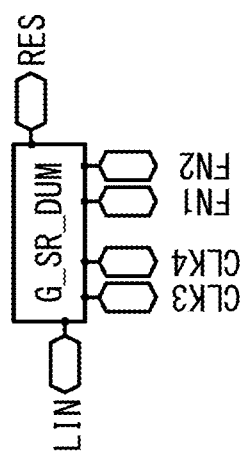

Similarly, a shift register unit which is a dummy stage may be a shift register unit 602*a* which is illustrated in FIG. 26A and FIG. 26B and in which the transistor 621, the transistor 622, the transistor 623, and the capacitor 624 are added to the shift register unit 602. Note that the reset signal RES is input to the gate of the transistor 623.

To initialize the shift register unit, a pulse of the reset signal RES is input to turn on the transistor 623, so that the potential of the node FN2 becomes equal to the potential of the high potential power supply line VDD. The second transistor 612 and the transistor 621 are turned on with the potential of the node FN2, so that the potential of the node FN1 becomes equal to the potential of the low potential power supply line VSS. Consequently, the shift register unit can be initialized. Note that the reset signal RES is input to all of the shift register units using a common signal line.

Figure 27B:
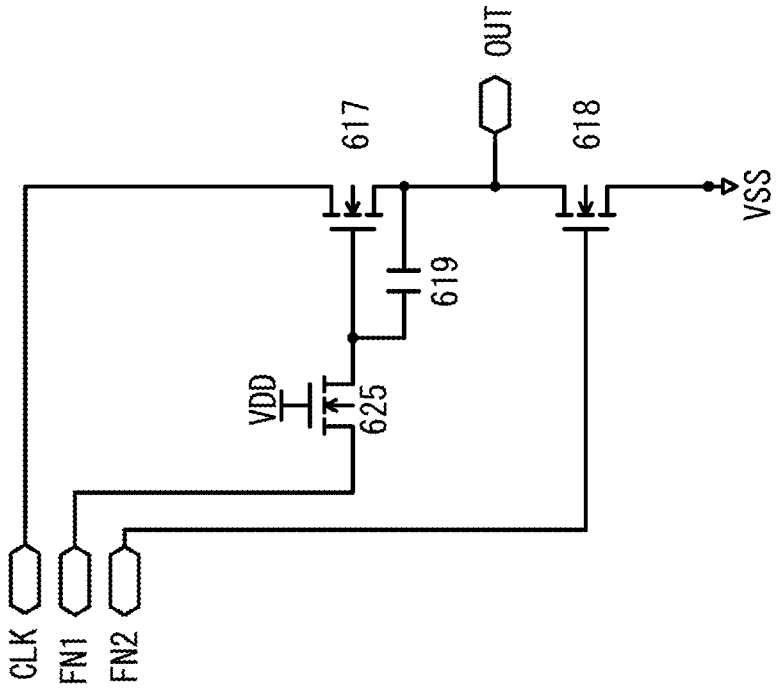
FIGS. 27A and 27B illustrate another buffer.
Figure 27A:
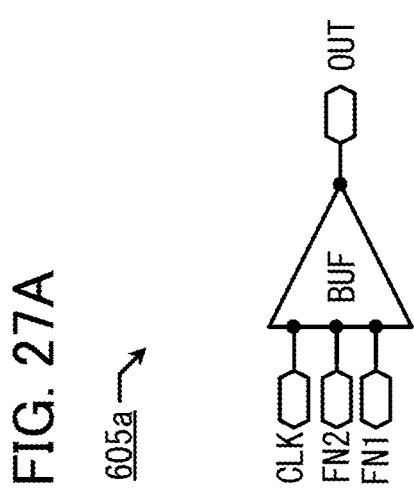

As illustrated in FIG. 27A and FIG. 27B, the buffer 605 can be replaced with a buffer 605*a* further provided with a transistor 625 and a capacitor 619.

The capacitor serves as storage capacitor for holding charge.

In the shift register unit 601 in the first stage, the clock signals CLK1 to CLK5 are input to the demultiplexer circuit 603 and the demultiplexer circuit 603 outputs output signals OUT1 to OUT5.

The potential of the node FN2 is fixed to a high potential in a period in which a gate selection output is not output, so that the second transistor 612 and the eighth transistor 618 are always on. In this way, the output is a low potential stably. However, in the case where the cutoff current (a drain current flowing at a gate voltage of 0 V) of the fifth transistor 615 is high, charge of the node FN2 leaks through the fifth transistor 615; therefore, charge needs to be regularly compensated. Thus, the third transistor 613 and the fourth transistor 614 are turned on with the clock signals CLK6 and CLK7, so that charge for the node FN2 is supplied from the high power supply potential line VDD. Note that a gate selection output period (the period in which the node FN1 is at high potential) of the shift register unit 601 in the first stage is a period from the rising (set) of the start pulse SP to the rising (reset) of the clock signal CLK7, which is described later. In the period, the gate selection output period and timing of regular compensation of charge are set not to overlap each other with two clock signals.

In the shift register unit 601 in the first stage, the clock signal CLK8 is not input to anywhere. The clock signal is also provided to avoid overlapping timing of regular compensation of charge.

Similarly, in the shift register unit 601 in the second stage, the clock signals CLK1, CLK2, and CLK6 to CLK8 are input to the demultiplexer circuit 603, and the demultiplexer circuit 603 outputs output signals OUT6 to OUT10. The clock signals CLK3 and CLK4 have a function of regularly compensating charge. In the shift register unit 601 in the second stage, the clock signal CLK5 is not input to anywhere.

The same can be applied to the shift register units 601 in the third and the following stages. In other words, one stage of the shift register unit inputs five clock signals to the demultiplexer circuit 603, and the demultiplexer circuit 603 outputs five output signals. Other two clock signals have a function of regularly compensating charge and are input to the shift register unit 601. The other clock signal is not input to anywhere.

The same is also applied to the shift register unit 602 which is a dummy stage. The clock signals CLK1 and CLK2 are input to the demultiplexer circuit 604, and the demultiplexer circuit 604 outputs output signals DUMOUT1 and DUMOUT2. The clock signals CLK3 and CLK4 have a function of regularly compensating charge.

The number of clock signals are eight in this embodiment, but the present invention is not limited thereto. The number of clock signals may be any number as long as it is four or more. For example, when the number of clock signals is n, the number of output signals is (n−3) since three clock signals do not contribute to output signals.

In other words, by connecting n signal lines for transmitting clock signals to one stage of the shift register unit, (n−3) output signals can be output. The larger n becomes, the smaller the rate of signal lines for transmitting clock signals which do not contribute to output becomes; accordingly, the area of the shift register unit part is small compared to a conventional structure in which one stage of a shift register unit outputs one output signal. Therefore, the width of the gate driver circuit 600 can be reduced, whereby the bezel of the display device can be narrowed.

Figures 28A, 28B:
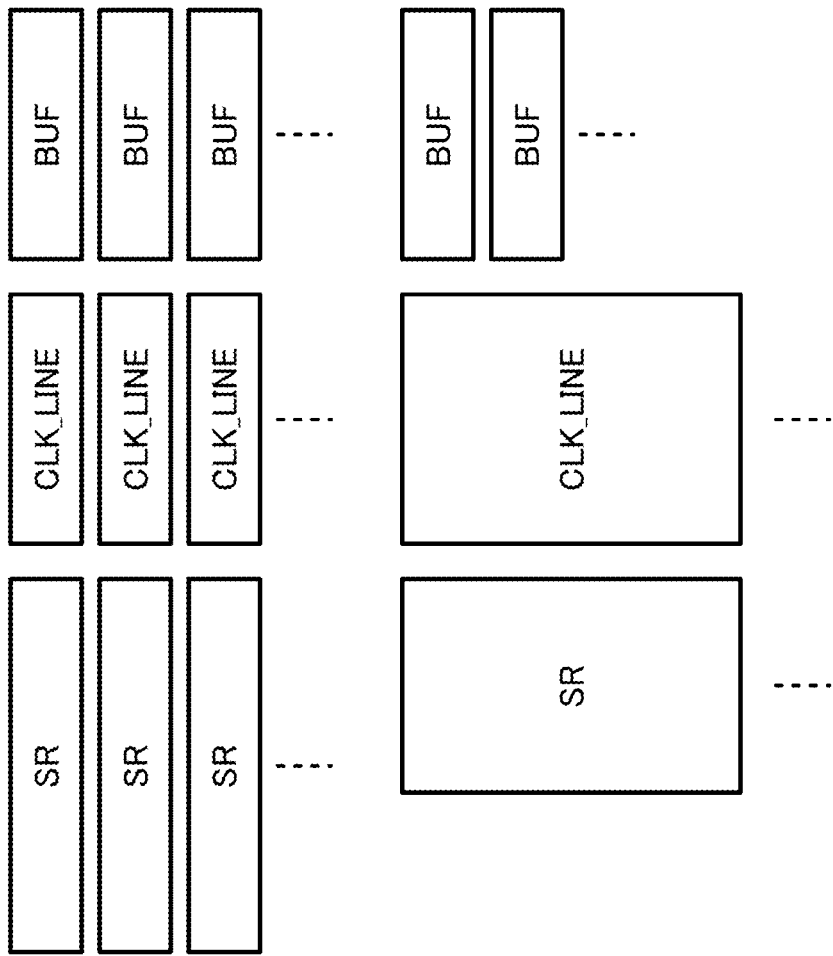
FIGS. 28A and 28B illustrate a way to obtain a narrower bezel.

Here, to narrow the width of the gate driver circuit 600 is briefly described. FIG. 28A is a block diagram of a conventional gate driver circuit. FIG. 28B is a block diagram of a gate driver circuit in this embodiment.

In a conventional gate driver circuit illustrated in FIG. 28A, one stage of a shift register unit SR is connected to four signal lines CLK_LINE for transmitting a clock signal and one buffer BUF outputs one signal. On the other hand, in the gate driver circuit in this embodiment illustrated in FIG. 28B, one shift register unit SR is connected to eight signal lines CLK_LINE for transmitting clock signals and five buffers BUF output five signals.

The gate driver circuit in this embodiment can have a smaller horizontal layout width of one shift register unit than that of the conventional gate driver circuit. The vertical layout width increases because of increased buffers BUF (here, five times as much as the conventional one), but the increase does not contribute to a reduction in width of the gate driver circuit. The horizontal layout width of one shift register unit can be reduced, so that the bezel can be narrower. In comparison with the conventional one, the number of the signal lines CLK_LINE for transmitting a clock signal is increased, and accordingly, load capacitance for each signal line CLK_LINE can be reduced. Therefore, even when the signal line CLK_LINE is set to thin to increase load resistance, delay time is not changed (because time constant=load capacitance×load resistance). Accordingly, by making the width of the signal line thin to obtain the same time constant, increase in layout width can be prevented; therefore, even if the number of the signal lines CLK_LINE is increased, the width of the gate driver circuit can be narrowed.

Next, the operation of the gate driver circuit 600 is described with reference to a timing diagram in FIG. 29. Here, high potentials of the set signal LN, the reset signal RIN, and the clock signals CLK1 to CLK8 correspond to the potential of the high power supply potential line VDD, while low potentials of the set signal LIN, the reset signal RIN, and the clock signals CLK1 to CLK8 correspond to the potential of the low power supply potential line VSS.

Figure 29:
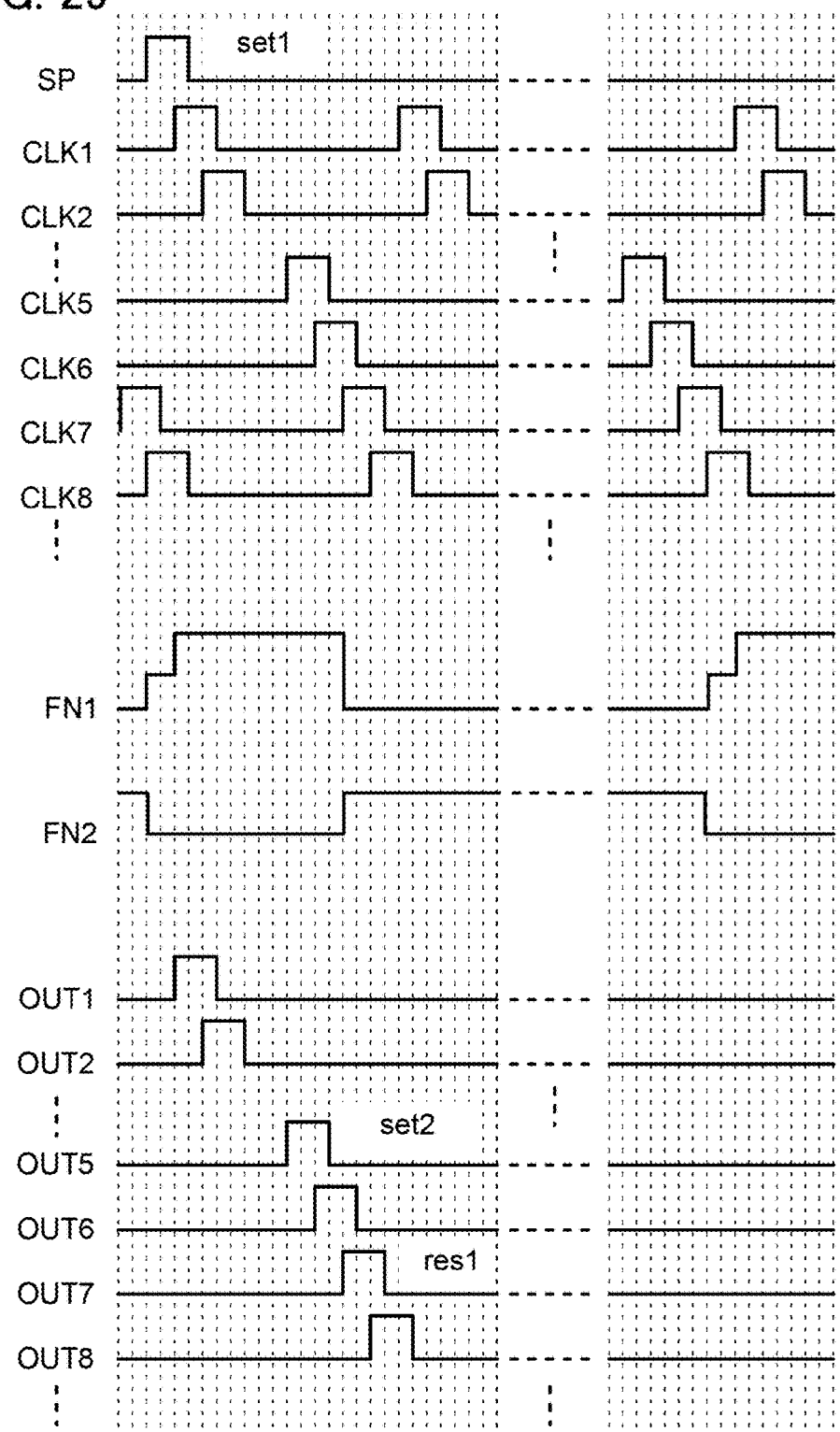
FIG. 29 is a timing chart of a shift register unit.

In the driving method of the gate driver circuit 600 shown in FIG. 29, first, the start pulse SP is set to a high potential to turn on the first transistor 611 and the fifth transistor 615. Since the reset signal RN (the output signal OUT7) is a low potential, the sixth transistor 616 is turned off. Since the clock signals CLK1 to CLK6 are low potentials and the clock signals CLK7 and CLK8 are high potentials, the fourth transistor 614 and the seventh transistor 617 are turned off and the third transistor 613 is turned on.

At that time, the potential of the node FN1 has a value obtained by subtracting the threshold voltage of the first transistor 611 from the potential of the high potential power supply line VDD (VDD−Vth(611)), while the potential of the node FN2 becomes equal to the potential of the low potential power supply line VSS. Accordingly, the seventh transistor 617 is turned on and the eighth transistor 618 is turned off, and thus, the output signals OUT1 to OUT5 are low potentials, as in the clock signals CLK1 to CLK5.

Then, the clock signal CLK7 is set to a low potential, so that the third transistor 613 is turned off. Note that a high potential is held at a node in which the other of the source and the drain of the third transistor 613 and the one of the source and the drain of the fourth transistor 614 are electrically connected.

Next, the clock signal CLK1 changes from a low potential to a high potential, and the potential of the node FN1 increases by a voltage corresponding to the amplitude of the clock signal CLK1 by a bootstrap operation. As a result, the seventh transistor 617 is turned on, and a high potential (the potential of the clock signal CLK1) is output as the output signal OUT1. Note that the bootstrap operation occurs similarly when the clock signals followed by the clock signal CLK2 changes from a low potential to a high potential. Next, the clock signal CLK8 becomes a low potential, but change does not occur because a signal of the clock signal CLK8 is not used for the shift register unit 601 in the first stage. Then, the clock signal CLK2 becomes a high potential, and a high potential is output as the output signal OUT2. After that, the clock signal CLK1 becomes a low potential, and a low potential is output as the output signal OUT1. The same can be applied to the following operation associated with the output signals OUT3 and OUT4. When the clock signal CLK5 becomes a high potential and the output signal OUT5 becomes a high potential, the set signal LIN of the shift register unit 601 in the second stage becomes a high potential.

In the shift register unit 601 in the first stage, when the clock signal CLK6 becomes a high potential, the fourth transistor 614 is turned on. Then, the clock signal CLK5 becomes a low potential, and a low potential is output as the output signal OUT5.

In the shift register unit 601 in the second stage, the set signal LIN (the output signal OUT5) becomes a high potential, and the first transistor 611 and the fifth transistor 615 are turned on. Since the reset signal RIN (an output signal OUT12) is a low potential, the sixth transistor 616 is turned off. Since the clock signals CLK1, CLK2, and CLK6 to CLK8 become low potentials and the clock signals CLK4 and CLK5 become high potentials, the fourth transistor 614 and the seventh transistor 617 are turned off and the third transistor 613 is turned on.

At this time, the potential of the node FN1 has a value obtained by subtracting the threshold voltage of the first transistor 611 from the potential of the high potential power supply line VDD (VDD−Vth(611)), while the potential of the node FN2 becomes equal to the potential of the low potential power supply line VSS. Accordingly, the seventh transistor 617 is turned on and the eighth transistor 618 is turned off, and thus, output signals OUT6 to OUT10 become low potentials, as in the clock signals CLK1, CLK2, and CLK6 to CLK5.

Next, the clock signal CLK4 becomes a low potential, and the third transistor 613 is turned off. Note that a high potential is held at a node in which the other of the source and the drain of the third transistor 613 and the one of the source and the drain of the fourth transistor 614 are electrically connected.

Next, the clock signal CLK6 changes from a low potential to a high potential, and the potential of the node FN1 increases by a voltage corresponding to the amplitude of the clock signal CLK6 by a bootstrap operation. As a result, the seventh transistor 617 is turned on, and a high potential (the potential of the clock signal CLK6) is output as the output signal OUT6. Next, the clock signal CLK5 becomes a low potential, but change does not occur because a signal of the clock signal CLK5 is not used for the shift register unit 601 in the second stage. Then, the clock signal CLK7 becomes a high potential, and a high potential is output as the output signal OUT7.

At that time, in the shift register unit 601 in the first stage, the reset signal RN (the output signal OUT7) becomes a high potential, and the sixth transistor 616 is turned on, so that the potential of the node FN2 becomes equal to the potential of the high potential power supply line VDD. The second transistor 612 is turned on with the potential of the node FN2, so that the potential of the node FN1 becomes the potential of the low potential power supply line VSS and then is reset.

The shift register unit 601 in the second stage is driven like the shift register unit 601 in the first stage.

That is, the output signal OUT5($m-1$) of the shift register unit 601 in the (m−1)th stage is input as the set signal LN of the shift register unit 601 in the m-th stage (m is a natural number). The output signal OUT5($m+2$) of the shift register unit 601 in the (m+1)th stage is input as the reset signal RIN of the shift register unit 601 in the m-th stage. Note that the set signal LIN when m is 1 corresponds to the start pulse SP.

The shift register unit 602 which is a dummy stage is similar to the shift register unit 601. The reset signal RN can be input to the shift register unit 601 in the final stage with the shift register unit 602.

Note that pulses of a clock signal and the next clock signal overlap by one third of the pulse width in this embodiment, but the present invention is not limited thereto. The overlap width may be any value as long as it is half of the pulse width or less. The falling of the pulse of the clock signal and the rising of the pulse of the next clock signal may be at the same timing. In that case, the gate selection output period of the shift register unit 601 in the first stage is a period from the rising (set) of the start pulse SP to the rising (reset) of the clock signal CLK6; accordingly, the number of clock signals needed for regularly compensating charge is only one.

Note that the structure and the like described in this embodiment can be used as appropriate in combination with any of the structures and the like in the other embodiments.

Embodiment 5

In this embodiment, a display module and electronic devices that can be formed using a semiconductor device of one embodiment of the present invention are described with reference to FIG. 30 and FIGS. 31A to 31H.

Figure 30:
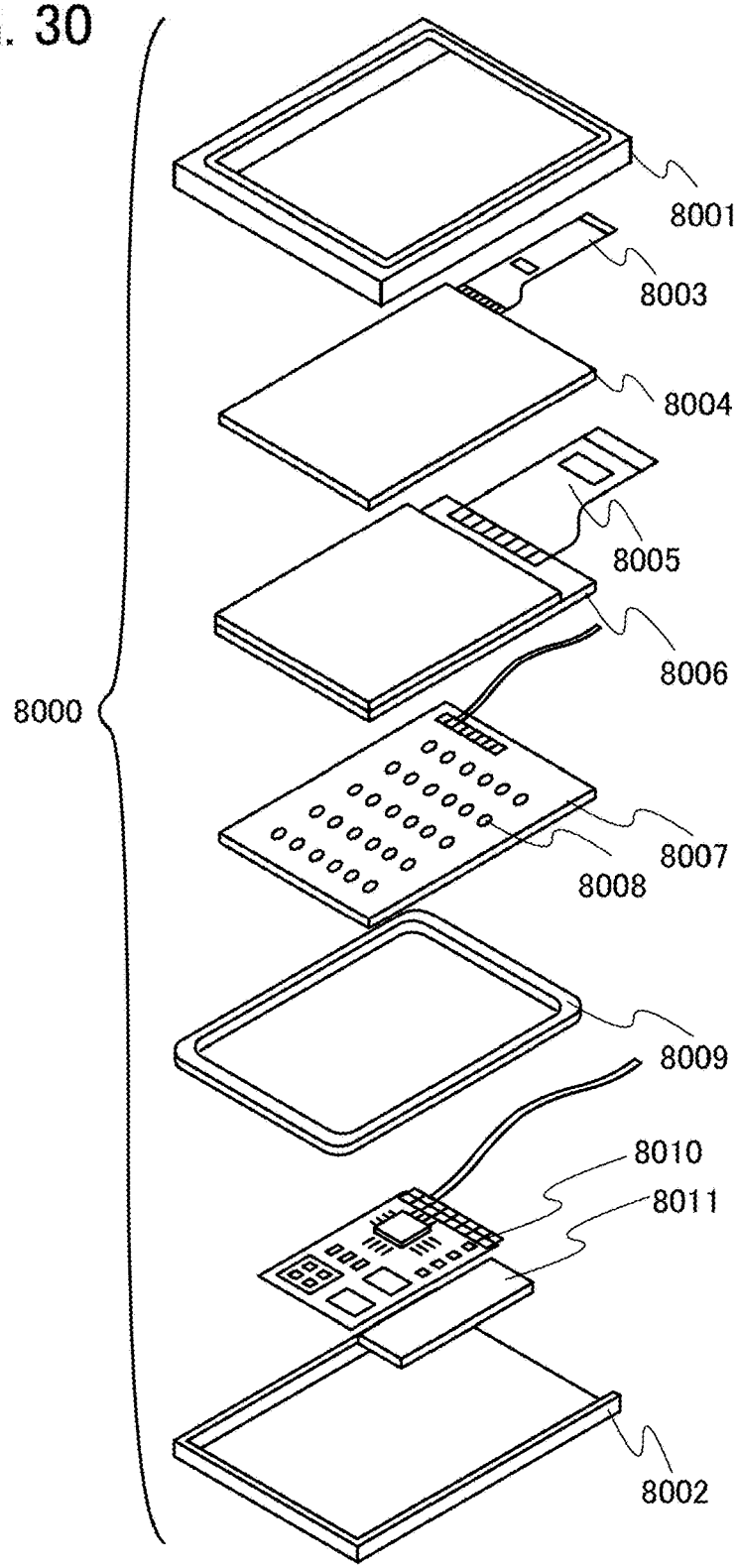
FIG. 30 illustrates a display module.

In a display module 8000 illustrated in FIG. 30, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 30, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 31A to 31H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 31A:
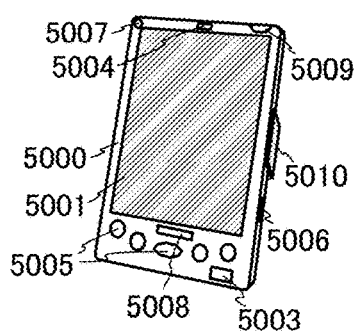
FIGS. 31A to 31H illustrate electronic devices.
Figure 31B:
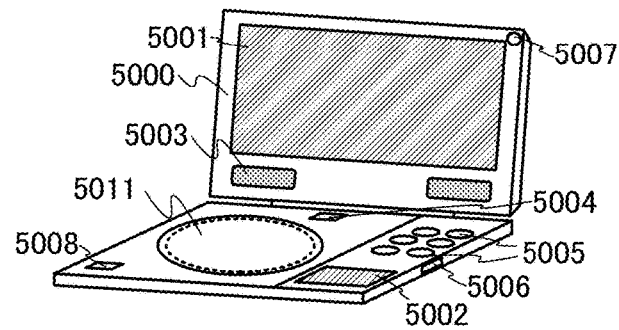
Figure 31C:
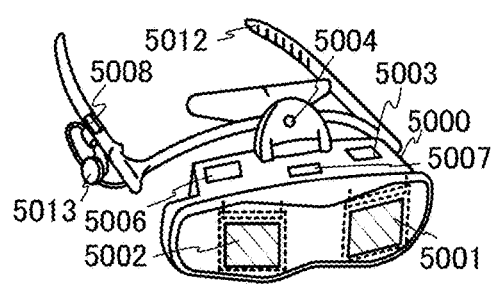
Figure 31D:
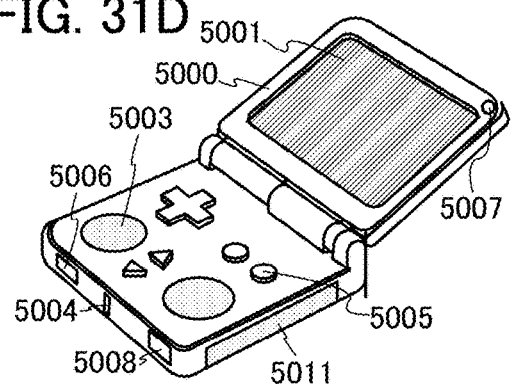
Figure 31E:
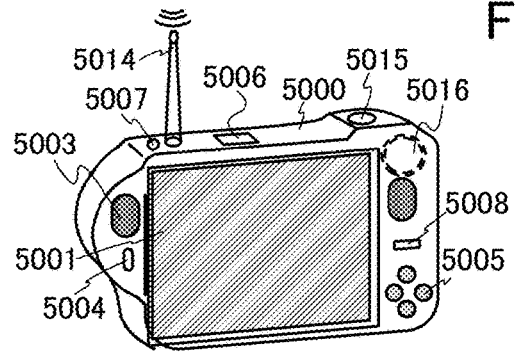
Figure 31F:
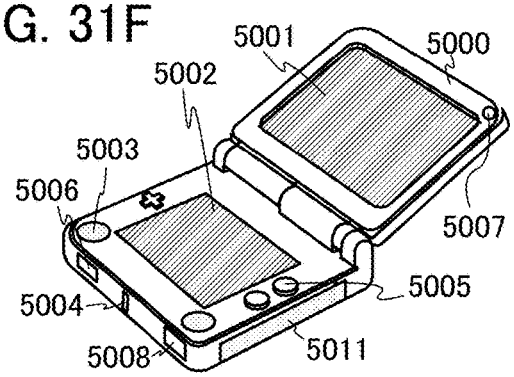
Figure 31G:
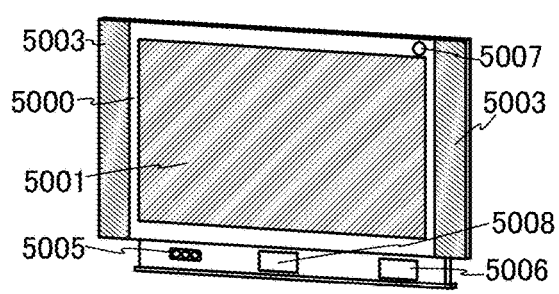
Figure 31H:
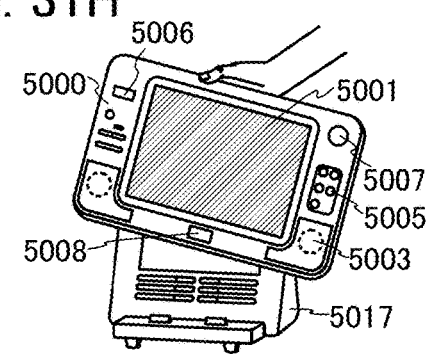

FIG. 31A illustrates a mobile computer that can include a switch 5009, an infrared port 5010, and the like in addition to the above components. FIG. 31B illustrates a portable image reproducing device (e.g., a DVD player) that is provided with a memory medium and can include a second display portion 5002, a memory medium reading portion 5011, and the like in addition to the above components. FIG. 31C illustrates a goggle-type display that can include the second display portion 5002, a support 5012, an earphone 5013, and the like in addition to the above components. FIG. 31D illustrates a portable game machine that can include the memory medium reading portion 5011 and the like in addition to the above components. FIG. 31E illustrates a digital camera that has a television reception function and can include an antenna 5014, a shutter button 5015, an image receiving portion 5016, and the like in addition to the above components. FIG. 31F illustrates a portable game machine that can include the second display portion 5002, the memory medium reading portion 5011, and the like in addition to the above components. FIG. 31G illustrates a television receiver that can include a tuner, an image processing portion, and the like in addition to the above components. FIG. 31H illustrates a portable television receiver that can include a charger 5017 capable of transmitting and receiving signals, and the like in addition to the above components.

The electronic devices illustrated in FIGS. 31A to 31H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 31A to 31H are not limited to those described above, and the electronic devices can have a variety of functions.

The electronic devices described in this embodiment each include the display portion for displaying some sort of data. Note that the semiconductor device of one embodiment of the present invention can also be used for an electronic device which does not have a display portion.

The structure described in this embodiment can be used in appropriate combination with any of the structures described in the other embodiments.

Embodiment 6

In this embodiment, a semiconductor device of one embodiment of the present invention is described with reference to FIGS. 32A and 32B.

Figure 32A:
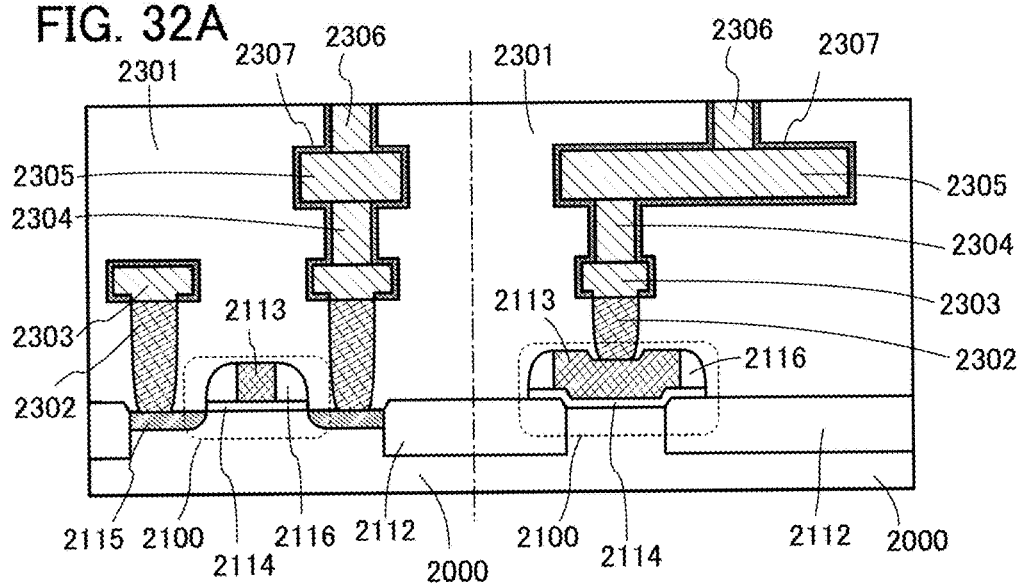
FIGS. 32A and 32B are each a cross-sectional view of a semiconductor device.
Figure 32B:
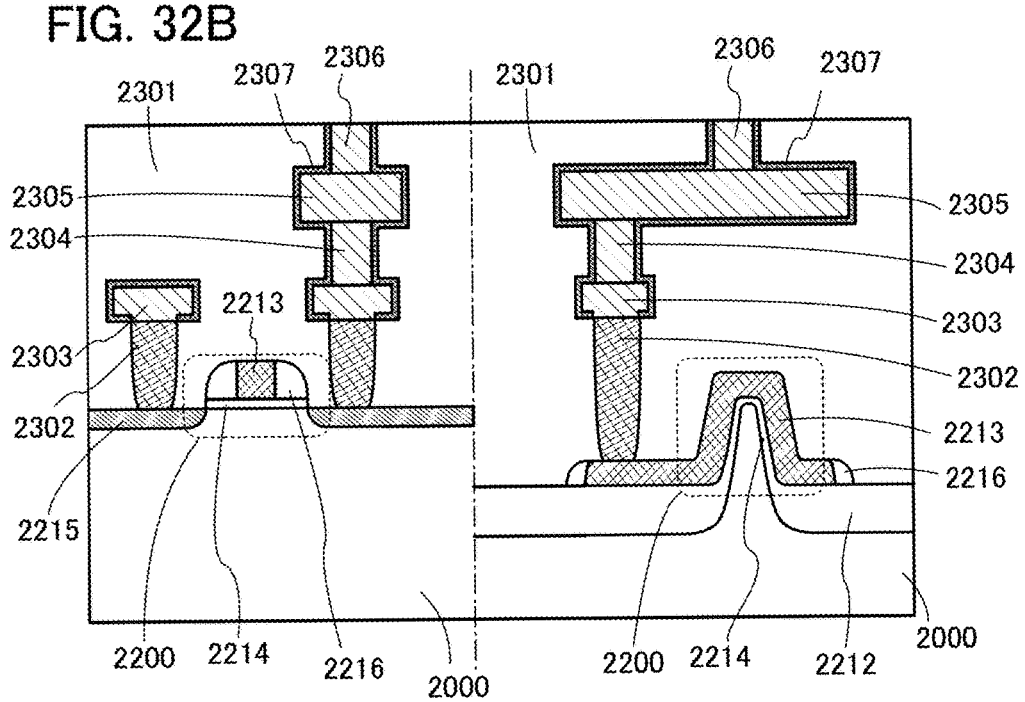

FIGS. 32A and 32B are cross-sectional views of a semiconductor device of one embodiment of the present invention. The semiconductor device in FIG. 32A includes a semiconductor substrate 2000, a transistor 2100, an insulating layer 2112 for element isolation, an insulating layer 2301, a plug 2302, a wiring 2303, a plug 2304, a wiring 2305, a plug 2306, and an oxide film 2307. The transistor 2100 includes a gate electrode 2113, a gate insulating film 2114, source and drain regions 2115 to which impurities are added, and a sidewall insulating layer 2116. A cross-sectional view of the transistor in the channel length direction is on the left side of a dashed-dotted line, and a cross-sectional view of the transistor in the channel width direction is on the right side of the dashed-dotted line.

Moreover, the transistor 2100 is provided with an impurity region functioning as a Lightly Doped Drain (LDD) region or an extension region under the sidewall insulating layer 2116.

As the transistor 2100, a transistor containing silicide (salicide) or a transistor which does not include the sidewall insulating layer 2116 may be used. When a structure that contains silicide (salicide) is used, resistance of the source region and the drain region can be further lowered and the speed of the semiconductor device is increased.

For the semiconductor substrate 2000, silicon (including strained silicon), germanium, silicon germanium, silicon carbide, gallium arsenide, aluminum gallium arsenide, indium phosphide, gallium nitride, or the like is used. The transistor 2100 may be either an n-channel transistor or a p-channel transistor, and an appropriate transistor may be used in accordance with a circuit.

The insulating layer 2301 is a stacked layer of some insulating films. As an insulating film used as the insulating layer 2301, an inorganic insulating film such as silicon oxide, silicon oxynitride, silicon nitride, or silicon nitride oxide or an organic resin film such as an acrylic resin, a polyimide resin, a benzocyclobutene-based resin, a siloxane-based resin, a polyamide resin, or an epoxy resin can be used. In order to form an oxide film 2307 described later, the insulating layer 2301 preferably contains oxygen. In order to prevent diffusion of a metal (e.g., Cu) used for a wiring or a plug, an insulating film of silicon nitride or the like may be provided as necessary.

The plug 2302 in contact with the semiconductor may be formed using W (tungsten) by a CVD method.

The wirings 2303 and 2305 and the plugs 2304 and 2306 each include at least a Cu—X alloy film; for example, it is preferable to use a single-layer structure of a Cu—X alloy film or a stacked-layer structure of a Cu—X alloy film and a conductive film including a low-resistance material such as copper (Cu), aluminum (Al), gold (Au), or silver (Ag), an alloy of any of these materials, or a compound containing any of these materials as its main component.

The interface between the wiring and the plug is preferably formed by bonding between Cu—X alloy films. With the above structure, a wiring and a plug which have low contact resistance can be provided.

By heating the wirings 2303 and 2305 and the plugs 2304 and 2306, the oxide film 2307 is formed between the insulating layer 2301 containing oxygen and the above wirings and plugs. The oxide film 105 in Embodiment 1 may be referred to for the details of the oxide film 2307. For example, in the case where the wirings 2303 and 2305 and the plugs 2304 and 2306 contain a Cu—Mn alloy, the oxide film 2307 contains a manganese oxide. The oxide film 2307 has a function of preventing diffusion of Cu contained in the wirings and the plugs to the outside of the wirings and the plugs.

Since the oxide film 2307 is not formed in a portion where the wiring and the plug are in contact with each other, contact resistance can be kept low even when heat treatment is performed.

For example, the wirings 2303 and 2305 and the plugs 2304 and 2306 each are a stacked film of a Cu—Mn alloy film and a Cu film. The stacked film is preferably formed so that the Cu—Mn alloy film is in contact with the insulating layer 2301. When the insulating layer 2301 and the Cu—Mn alloy film are in contact with each other, adhesion between the insulating layer 2301, and the wirings and plugs can be increased.

With the above structure, a highly reliable semiconductor device in which diffusion of Cu which adversely affects the transistor 2100 is suppressed and wiring delay is suppressed can be provided.

Note that the transistor 2100 can be a transistor of various types without being limited to a planar type transistor. For example, the transistor 2100 can be a FIN-type transistor, a TRI-GATE transistor, or the like. FIG. 32B shows an example of a cross-sectional view in this case. An insulating film 2212 is provided over the semiconductor substrate 2000. The semiconductor substrate 2000 includes a protruding portion with a thin tip (also referred to a fin). Note that an insulating film may be provided over the protruding portion. The insulating film functions as a mask for preventing the semiconductor substrate 2000 from being etched when the protruding portion is formed. Alternatively, the protruding portion may not have the thin tip; a protruding portion with a cuboid-like protruding portion and a protruding portion with a thick tip are permitted, for example. A gate insulating film 2214 is provided over the protruding portion of the semiconductor substrate 2000, and a gate electrode 2213 is provided over the gate insulating film 2214. A sidewall insulating layer 2216 is provided on a sidewall of the gate electrode 2213. Source and drain regions 2215 are formed in the semiconductor substrate 2000. Note that here is shown an example in which the semiconductor substrate 2000 includes the protruding portion; however, a semiconductor device of one embodiment of the present invention is not limited thereto. For example, a semiconductor region having a protruding portion may be formed by processing an SOI substrate.

Embodiment 7

The structure of an oxide semiconductor film included in a semiconductor device of one embodiment of the present invention is described in this embodiment.

In this specification, the term "parallel" indicates that the angle formed by two straight lines is greater than or equal to −10° and less than or equal to 10°, and accordingly also includes the case where the angle is greater than or equal to −5° and less than or equal to 5°. The term "perpendicular" indicates that the angle formed by two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.
<Structure of Oxide Semiconductor>
An oxide semiconductor is classified into a single crystal oxide semiconductor and a non-single-crystal oxide semiconductor.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.
<CAAC-OS>
First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 39A:
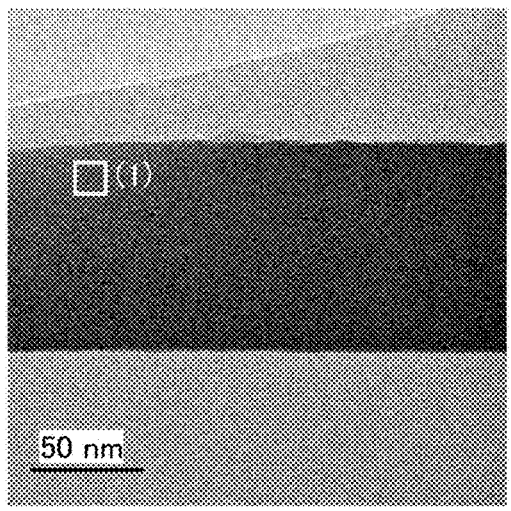
FIGS. 39A to 39D are Cs-corrected high-resolution TEM images of a cross section of a CAAC-OS and a cross-sectional schematic view of the CAAC-OS.

A CAAC-OS observed with TEM is described below. FIG. 39A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 39B:
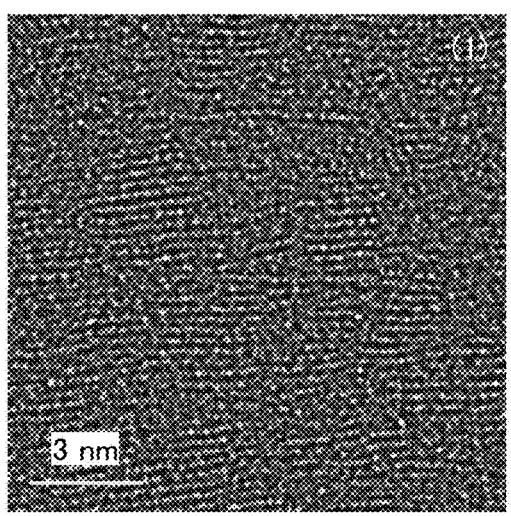

FIG. 39B is an enlarged Cs-corrected high-resolution TEM image of a region (1) in FIG. 39A. FIG. 39B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 39C:
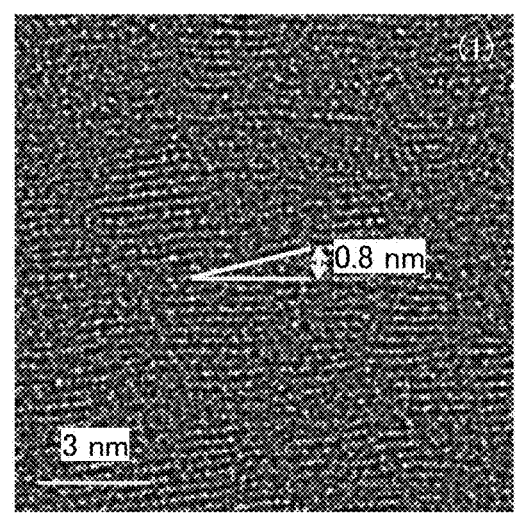

As shown in FIG. 39B, the CAAC-OS has a characteristic atomic arrangement. The characteristic atomic arrangement is denoted by an auxiliary line in FIG. 39C. FIGS. 39B and 39C prove that the size of a pellet is approximately 1 nm to 3 nm, and the size of a space caused by tilt of the pellets is approximately 0.8 nm. Therefore, the pellet can also be referred to as a nanocrystal (nc).

Figure 39D:
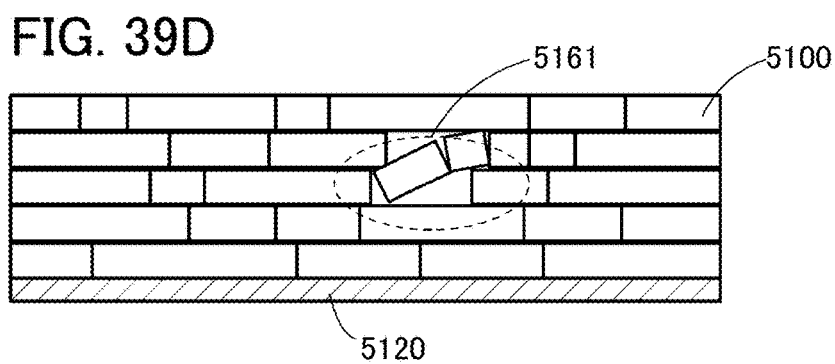

Here, according to the Cs-corrected high-resolution TEM images, the schematic arrangement of pellets 5100 of a CAAC-OS over a substrate 5120 is illustrated by such a structure in which bricks or blocks are stacked (see FIG. 39D). The part in which the pellets are tilted as observed in FIG. 39C corresponds to a region 5161 shown in FIG. 39D.

Figure 40A:
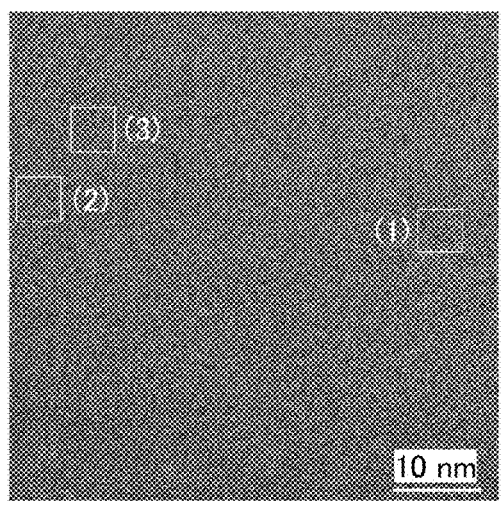
FIGS. 40A to 40D are Cs-corrected high-resolution TEM images of a plane of a CAAC-OS.
Figure 40B:
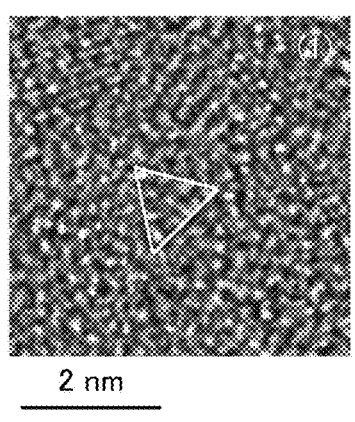
Figure 40C:
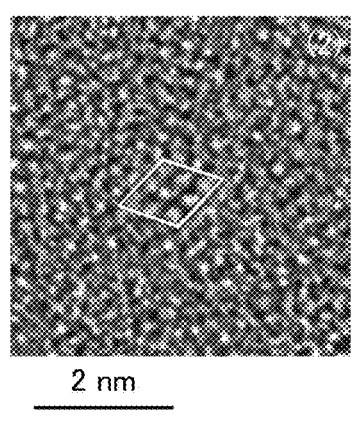
Figure 40D:
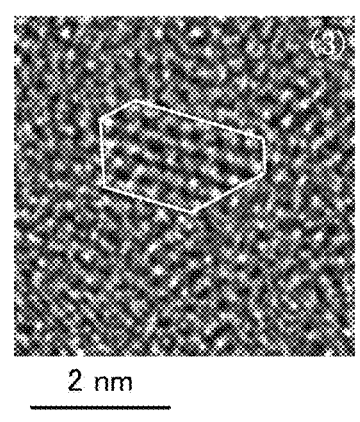

FIG. 40A shows a Cs-corrected high-resolution TEM image of a plane of the CAAC-OS observed from a direction substantially perpendicular to the sample surface. FIGS. 40B, 40C, and 40D are enlarged Cs-corrected high-resolution TEM images of regions (1), (2), and (3) in FIG. 40A, respectively. FIGS. 40B, 40C, and 40D indicate that metal atoms are arranged in a triangular, quadrangular, or hexagonal configuration in a pellet. However, there is no regularity of arrangement of metal atoms between different pellets.

Figure 41A:
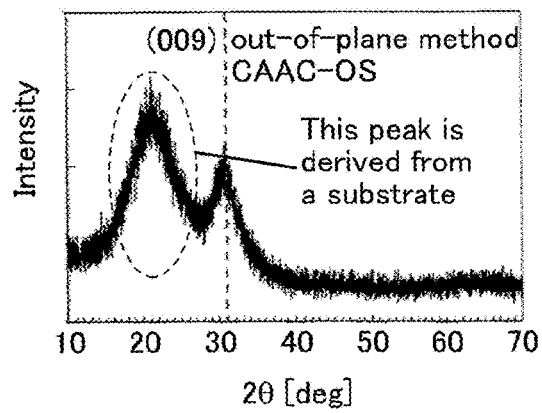
FIGS. 41A to 41C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 41A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 41B:
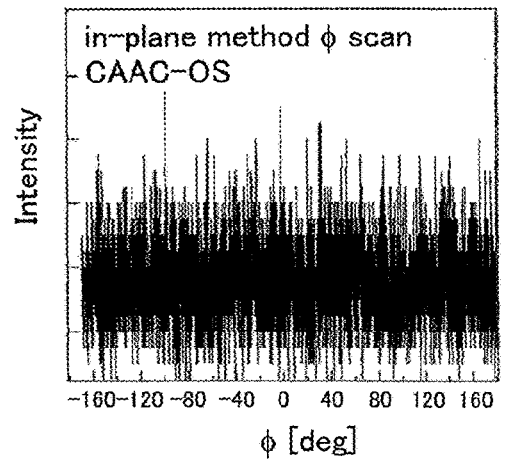
Figure 41C:
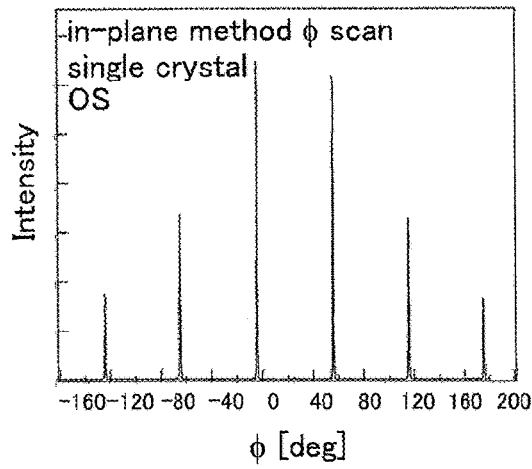

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 41B, a peak is not clearly observed. In contrast, in the case of a single crystal oxide semiconductor of InGaZnO$_4$, when φ scan is performed with 2θ fixed at around 56°, as shown in FIG. 41C, six peaks which are derived from crystal planes equivalent to the (110) plane are observed. Accordingly, the structural analysis using XRD shows that the directions of a-axes and b-axes are different in the CAAC-OS.

Figure 42A:
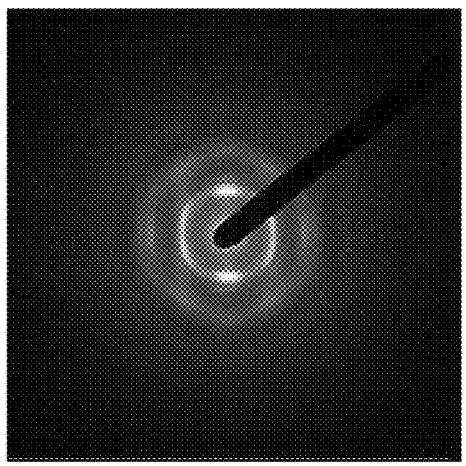
FIGS. 42A and 42B show electron diffraction patterns of a CAAC-OS.
Figure 42B:
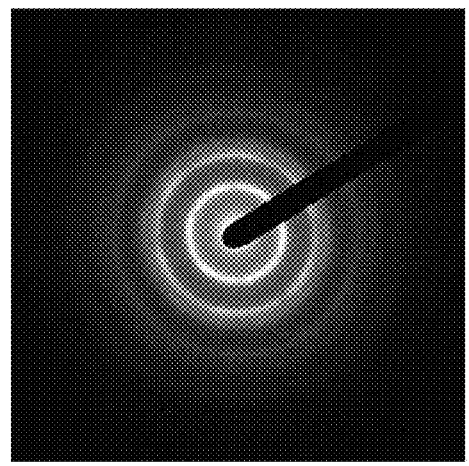

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 42A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 42B shows a diffraction pattern obtained in such a manner that an electron beam with a probe diameter of 300 nm is incident on the same sample in a direction perpendicular to the sample surface. As shown in FIG. 42B, a ring-like diffraction pattern is observed. Thus, the electron diffraction also indicates that the a-axes and b-axes of the pellets included in the CAAC-OS do not have regular alignment. The first ring in FIG. 42B is considered to be derived from the (010) plane, the (100) plane, and the like of the InGaZnO$_4$ crystal. The second ring in FIG. 42B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small amount of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 43:
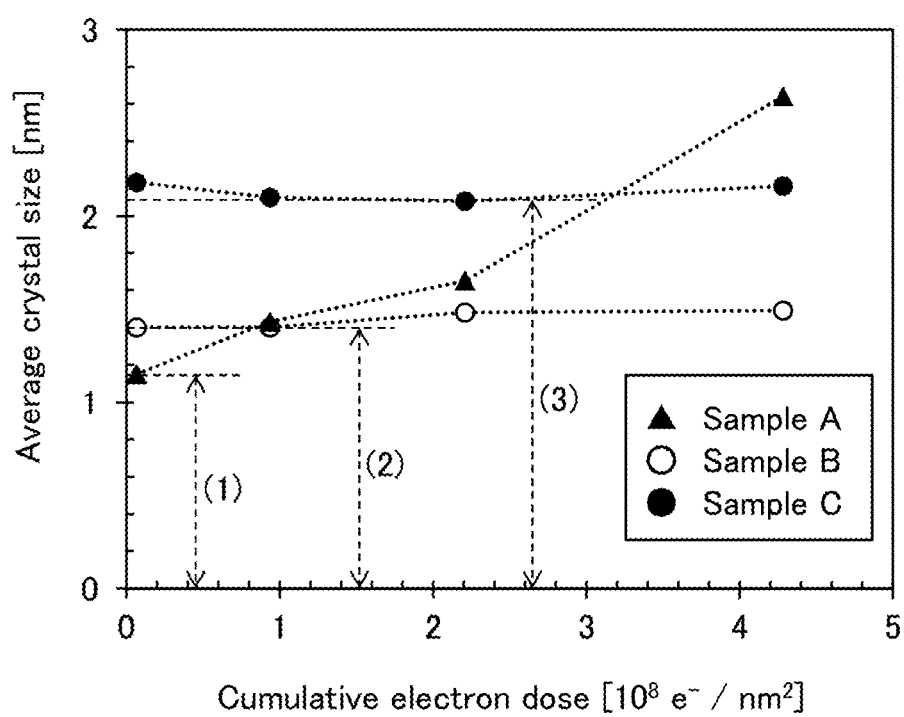
FIG. 43 shows a change in crystal part of an In—Ga—Zn oxide induced by electron irradiation.

FIG. 43 shows change in the average size of crystal parts (at 22 points to 45 points) in each sample. Note that the crystal part size corresponds to the length of a lattice fringe. FIG. 43 indicates that the crystal part size in the a-like OS increases with an increase in the cumulative electron dose. Specifically, as shown by (1) in FIG. 43, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 43, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

Example 1

Figure 33A:
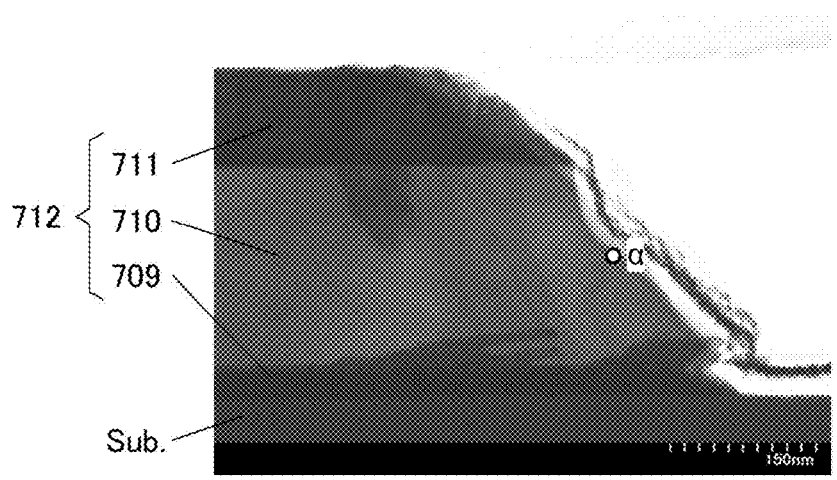
FIGS. 33A and 33B are cross-sectional STEM images in Example 1.
Figure 33B:
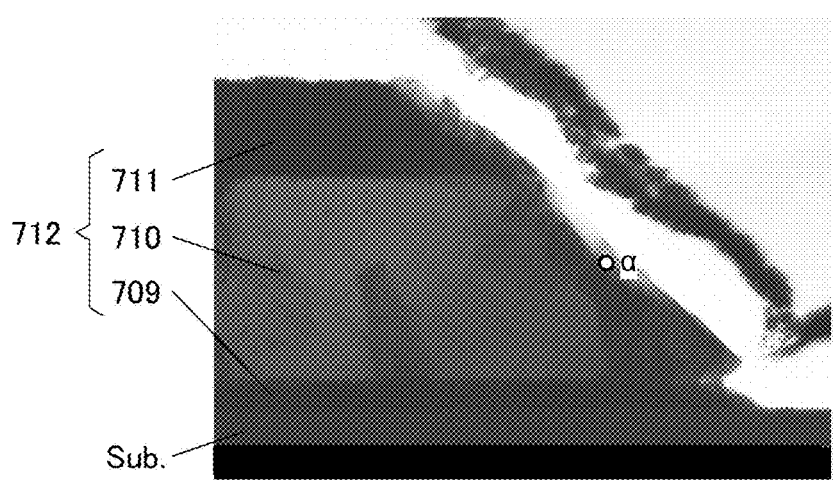
Figure 34A:
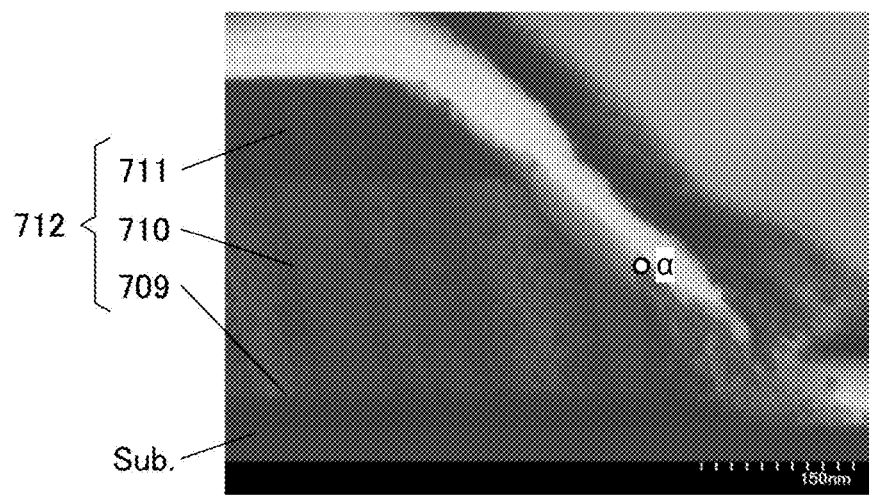
FIGS. 34A and 34B are cross-sectional STEM images in Example 1.
Figure 34B:
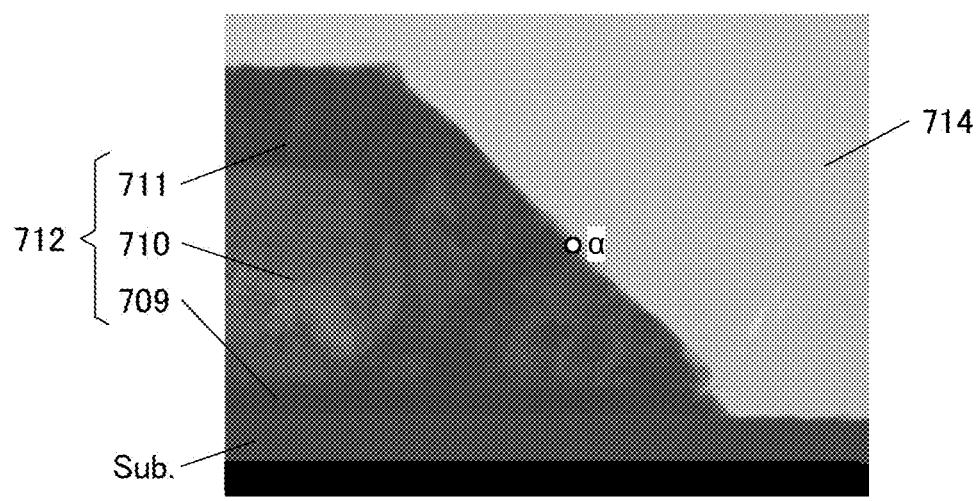
Figure 35:
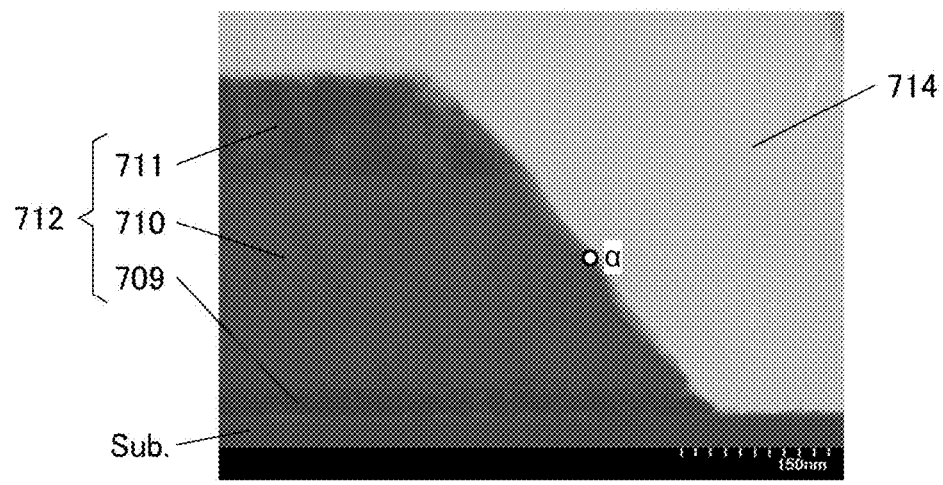
FIG. 35 is a cross-sectional STEM image in Example 1.

In this example, a cross-sectional shape and a composition of a conductive film which is an example of a wiring capable of being used for a semiconductor device of one embodiment of the present invention are analyzed. In this example, five samples were fabricated and taken out during the fabrication process; the resulting samples were referred to as Samples A1 to A5. FIG. 33A shows an observation result of the cross section of Sample A1 of this example, FIG. 33B shows an observation result of the cross section of Sample A2 of this example, FIG. 34A shows an observation result of the cross section of Sample A3 of this example, FIG. 34B shows an observation result of the cross section of Sample A4 of this example, and FIG. 35 shows an observation result of the cross section of Sample A5 of this example. Details of the samples fabricated in this example are described below.

First, a glass substrate was prepared. Next, a conductive film 712 was formed over the glass substrate. The conductive film 712 has a three-layer stacked structure of a conductive film 709, a conductive film 710, and a conductive film 711.

As the conductive film 709, a Cu—Mn alloy film was formed. The Cu—Mn alloy film was formed to a thickness of 30 nm under the following conditions: the substrate temperature was room temperature; the flow rate of an Ar gas supplied to a treatment chamber was 100 sccm; the pressure of the treatment chamber was controlled to 0.4 Pa; and electric power supplied to a target by a direct-current (DC) source was 2000 W. The composition of the target was Cu:Mn=90:10 [atomic %]. As the conductive film 710, a Cu film was formed. The Cu film was formed to a thickness of 200 nm under the following conditions: the substrate temperature was 100° C.; the flow rate of an Ar gas supplied to a treatment chamber was 75 sccm; the pressure of the treatment chamber was controlled to 1.0 Pa; electric power supplied to a target by a direct-current (DC) source was 15 kW. As the conductive film 711, a Cu—Mn alloy film was formed. The Cu—Mn alloy film was formed to a thickness of 100 nm under the following conditions: the substrate temperature was room temperature; the flow rate of an Ar gas supplied to a treatment chamber was 100 sccm; the pressure of the treatment chamber was controlled to 0.4 Pa; and electric power supplied to a target by a direct-current (DC) source was 2000 W. The composition of the target was Cu:Mn=90:10 [atomic %].

Next, a resist mask was formed over the conductive film 711, an etchant was applied over the resist mask, and wet etching treatment was performed, whereby the conductive films 709, 710, and 711 were processed at the same time. A sample subject to the wet etching treatment was referred to as Sample A1.

As the etchant, an etchant containing an organic acid solution and hydrogen peroxide water was used.

Next, the resist mask was removed. A sample from which the resist mask was removed was referred to as Sample A2.

Next, an insulating film 714 was formed to cover the glass substrate and the conductive film 712.

Before the insulating film 714 was formed, the substrate and the conductive film 712 were subjected to first heat treatment by in-situ in a reaction chamber of a plasma CVD apparatus. The first heat treatment was performed under the following conditions: the flow rate of a nitrogen gas supplied to a treatment chamber was 10000 sccm; the pressure was 175 Pa; the substrate temperature was 220° C.; and the heat treatment time was 300 sec.

The insulating film 714 has a stacked structure of a first silicon oxynitride film and a second silicon oxynitride film. The first silicon oxynitride film was formed to a thickness of 50 nm under the following conditions: the substrate temperature was 220° C.; silane at a flow rate of 50 sccm and dinitrogen monoxide at a flow rate of 2000 sccm were supplied to a reaction chamber of the plasma CVD apparatus as a source gas; the pressure in the reaction chamber was controlled to 20 Pa, and power of 100 W was supplied with the use of a 27.12 MHz high-frequency power source. The second silicon oxynitride film was formed to a thickness of 400 nm under the following conditions: the substrate temperature was 220° C.; silane at a flow rate of 160 sccm and dinitrogen monoxide at a flow rate of 4000 sccm were supplied to a reaction chamber of the plasma CVD apparatus as a source gas; the pressure in the reaction chamber was controlled to 200 Pa, and power of 1500 W was supplied with the use of a 27.12 MHz high-frequency power source.

A sample subject to only the first heat treatment before the insulating film 714 was formed was referred to as Sample A3, and a sample in which the insulating film 714 was formed after the first heat treatment was referred to as Sample A4.

Next, second heat treatment was performed. A sample subjected to the second heat treatment was referred to as Sample A5. The second heat treatment was performed under a mixed gas atmosphere containing nitrogen and oxygen at a substrate temperature of 350° C. for an hour.

Through the above process, Samples A1 to A5 of this example were fabricated.

Figure 36:
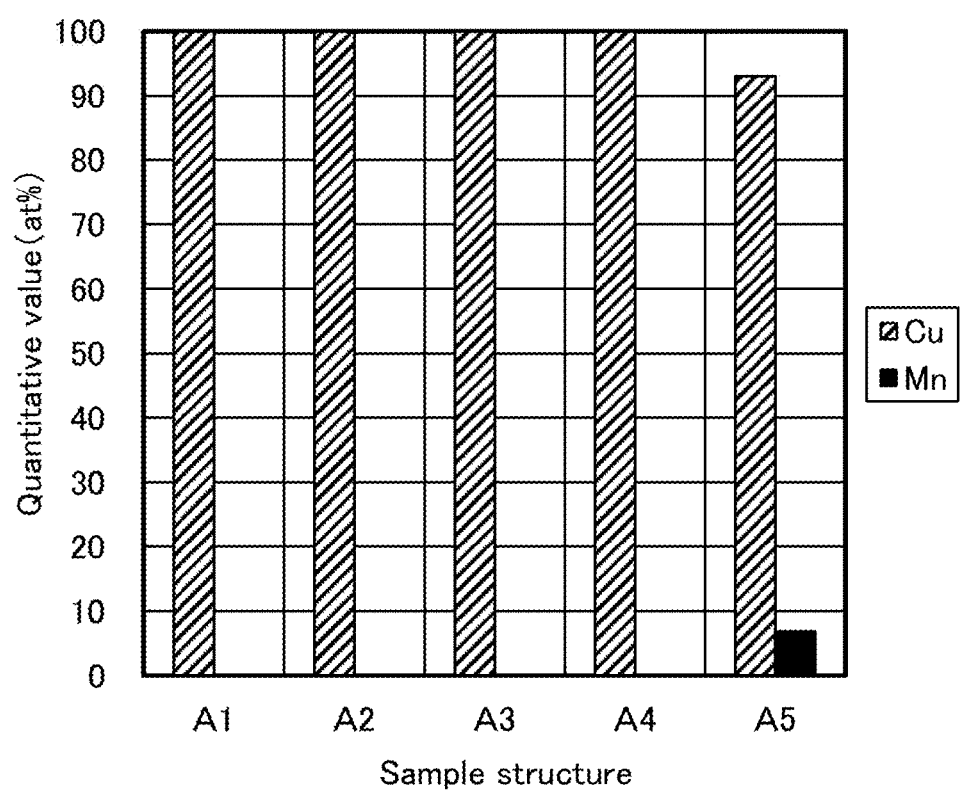
FIG. 36 shows EDX analysis results of conductive films in Example 1.

FIG. 36 shows composition analysis results of the conductive film 712 in Samples A1 to A5.

The cross section was observed with the use of a scanning transmission electron microscope (STEM), and the composition was analyzed with the use of an energy dispersive X-ray spectroscopy (EDX). EDX analysis of the conductive films was performed at white circle points α in FIGS. 33A and 33B, FIGS. 34A and 34B, and FIG. 35. Note that the point α corresponds to a point of a sidewall of the conductive film 710, i.e., a surface of a Cu film used as the conductive film 710. Furthermore, in FIG. 36, the horizontal axis indicates sample structures and the vertical axis indicates quantitative values of the point α.

From results of STEM images in FIGS. 33A and 33B, FIGS. 34A and 34B, and FIG. 35, it was confirmed that the conductive films 712 of the samples fabricated in this example have a favorable cross-sectional shape. The taper angles of the conductive films 712 of Samples A1 to A5 were 49°, 42°, 38°, 47°, and 50°, respectively. When the taper angle of the cross section of the conductive film 712 is greater than or equal to 30° and less than or equal to 70° as mentioned above, the coverage with the insulating film 714 formed on the conductive film 712 is favorable. The taper angle refers to an inclination angle between a surface on which the conductive film 712 is formed and a side surface of the conductive film 712 when the conductive film 712 is observed from the direction perpendicular to its cross section. The taper angle of a side surface with continuous curvature refers to an inclination angle between the surface on which the conductive film 712 is formed and a given point of the side surface with continuous curvature.

From the composition analysis results in FIG. 36, Mn was detected at the point α of Sample A5. Sample A5 was a sample subjected to heat treatment after the insulating film 714 was formed. FIG. 36 shows that by forming the conductive film 712, forming the insulating film 714, and then performing heat treatment, Mn in the Cu—Mn alloy film used as the conductive film 709 or the conductive film 711 was diffused into the insulating film 714 and attached to a sidewall of the copper film used as the conductive film 710.

The structure described in this example can be used as appropriate in combination with any of the structures described in the other embodiments or the other example.

Example 2

In this example, a cross-sectional shape and a composition of a conductive film which is an example of a wiring capable of being used for a semiconductor device of one embodiment of the present invention are analyzed. In this example, two samples were fabricated and taken out during the fabrication process; the resulting samples were referred to as Samples B1 and B2. Details of the samples fabricated in this example are described below.

First, a glass substrate was prepared. Next, a conductive film 713 was formed over the glass substrate. The conductive film 713 has a two-layer stacked structure of the conductive film 709 and the conductive film 710.

As the conductive film 709, a Cu—Mn alloy film was formed. The Cu—Mn alloy film was formed to a thickness of 30 nm under the following conditions: the substrate temperature was room temperature; the flow rate of an Ar gas supplied to a treatment chamber was 100 sccm; the pressure of the treatment chamber was controlled to 0.4 Pa; and electric power supplied to a target by a direct-current (DC) source was 2000 W. The composition of the target was Cu:Mn=90:10 [atomic %]. As the conductive film 710, a Cu film was formed. The Cu film was formed to a thickness of 200 nm under the following conditions: the substrate temperature was 100° C.; the flow rate of an Ar gas supplied to a treatment chamber was 75 sccm; the pressure of the treatment chamber was controlled to 1.0 Pa; and electric power supplied to a target by a direct-current (DC) source was 15 kW.

Next, a resist mask was formed over the conductive film 710, an etchant was applied over the resist mask, and wet etching treatment was performed, whereby the conductive films 709 and 710 were processed at the same time. As the etchant, an etchant containing an organic acid solution and hydrogen peroxide water was used.

Next, the resist mask was removed, and the insulating film 714 was formed to cover the glass substrate and the conductive film 713.

Before the insulating film 714 was formed, the substrate and the conductive film 712 were subjected to first heat treatment by in-situ in a reaction chamber of a plasma CVD apparatus. The first heat treatment was performed under the following conditions: the flow rate of a nitrogen gas supplied to a treatment chamber was 10000 sccm; the pressure was 175 Pa; the substrate temperature was 220° C.; and the heat treatment time was 300 sec.

The insulating film 714 has a stacked structure of a first silicon oxynitride film and a second silicon oxynitride film. The first silicon oxynitride film was formed to a thickness of 50 nm under the following conditions: the substrate temperature was 220° C.; silane at a flow rate of 50 sccm and dinitrogen monoxide at a flow rate of 2000 sccm were supplied to a reaction chamber of the plasma CVD apparatus as a source gas; the pressure in the reaction chamber was controlled to 20 Pa; and power of 100 W was supplied with the use of a 27.12 MHz high-frequency power source. The second silicon oxynitride film was formed to a thickness of 400 nm under the following conditions: the substrate temperature was 220° C.; silane at a flow rate of 160 sccm and dinitrogen monoxide at a flow rate of 4000 sccm were supplied to a reaction chamber of the plasma CVD apparatus as a source gas; the pressure in the reaction chamber was controlled to 200 Pa; and power of 1500 W was supplied with the use of a 27.12 MHz high-frequency power source.

A sample in which the insulating film 714 was formed after the first heat treatment was referred to as Sample B1.

Next, second heat treatment was performed. A sample subjected to the second heat treatment was referred to as Sample B2. The second heat treatment was performed under a mixed gas atmosphere containing nitrogen and oxygen at a substrate temperature of 350° C. for an hour.

Through the above process, Samples B1 and B2 of this example were fabricated.

Figure 37A:
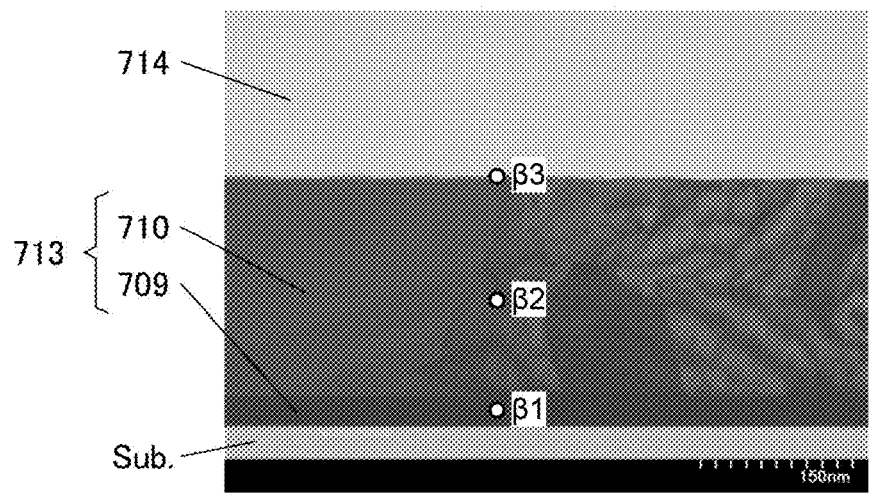
FIGS. 37A and 37B are cross-sectional STEM images in Example 2.
Figure 37B:
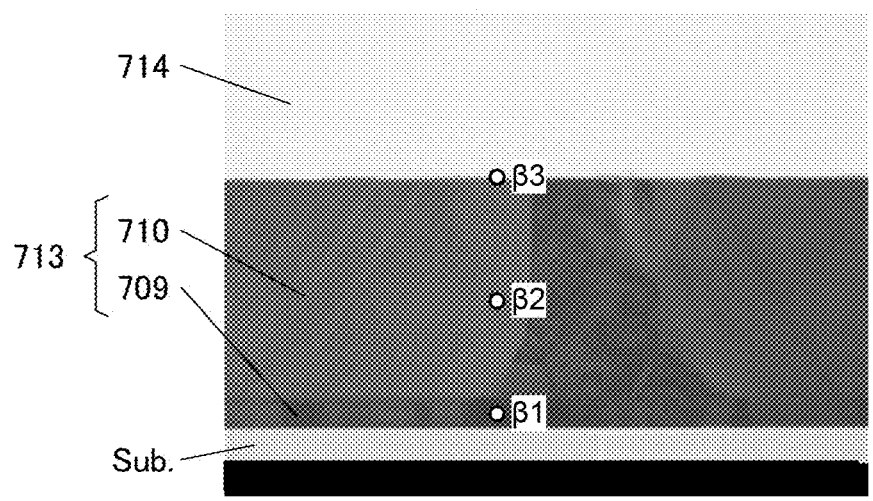
Figure 38:
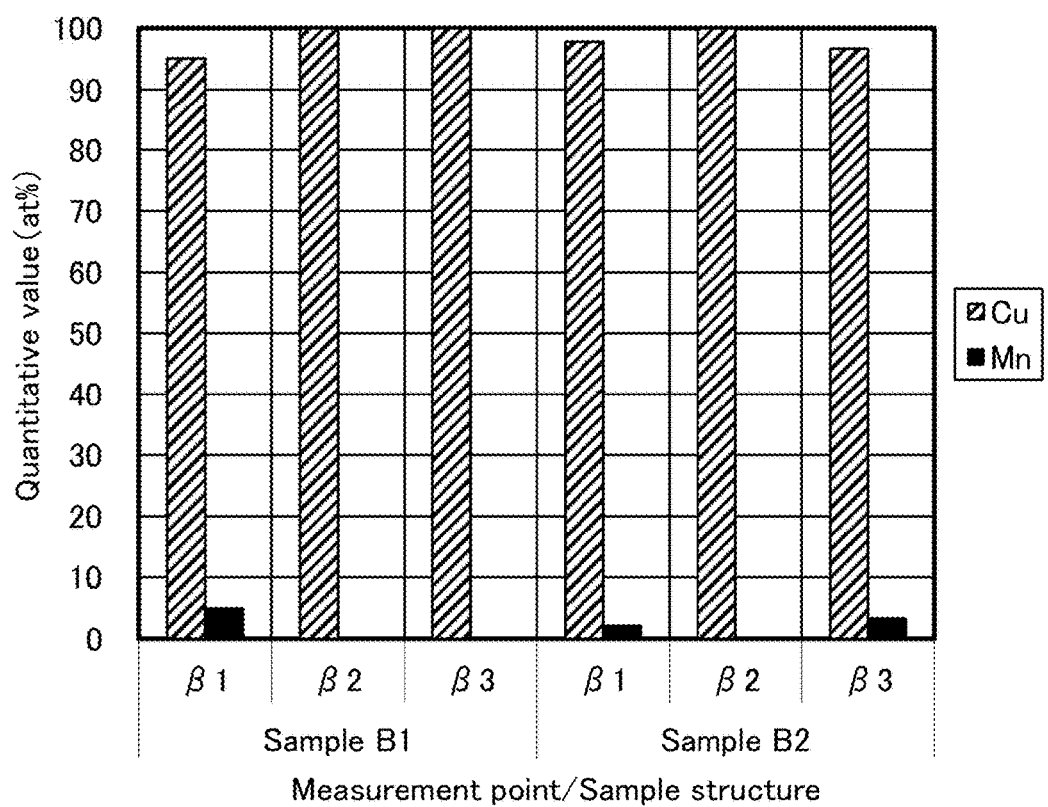
FIG. 38 shows EDX analysis results of conductive films in Example 2.

FIG. 37A shows an observation result of the cross section of Sample B1 of this example, and FIG. 37B shows an observation result of the cross section of Sample B2 of this example. FIG. 38 shows composition analysis results of the conductive film 713.

Cross section observation and composition analysis were performed using an apparatus similar to that in Example 1. EDX analysis of the conductive films was performed at white circle points β1, β2, and β3 in FIGS. 37A and 37B. The point β1 indicates a region of the conductive film 709, the point β2 indicates a region of the conductive film 710, and the point β3 indicates a region in the vicinity of an interface between the conductive film 710 and the insulating film 714. In FIG. 38, the horizontal axis indicates the measurement points/sample structures and the vertical axis indicates quantitative values.

From results of TEM images in FIGS. 37A and 37B, a stacked state of the conductive film 713 and the insulating film 714 of each of the samples fabricated in this example was confirmed.

From the composition analysis results in FIG. 38, Mn was detected at the point β1 of Sample B1, the point β1 of Sample B2, and the point β3 of Sample B2. Mn in the Cu—Mn alloy film was detected at the points β1 of Sample B1 and Sample B2 because the Cu—Mn alloy film was used as the conductive film 709. Mn was detected at the point β3 of Sample B2 because Mn in the Cu—Mn alloy film used as the conductive film 709 was diffused.

As described above, Mn was detected at the point β3 of Sample B2 illustrated in FIG. 38 because by forming the conductive film 713, forming the insulating film 714, and then performing heat treatment, Mn in the Cu—Mn alloy film used as the conductive film 709 is diffused into the conductive film 710 and in the vicinity of the interface between the conductive film 710 and the insulating film 714.

The structure described in this example can be used as appropriate in combination with any of the structures described in the other embodiments or the other example.

EXPLANATION OF REFERENCE

102: substrate, 105: oxide film, 106: insulating film, 106a: insulating film, 106b: insulating film, 108: oxide semiconductor film, 108*a*: oxide semiconductor film, 108*b*: oxide semiconductor film, 109: contact hole, 110*a*: electrode layer, 110*b*: electrode layer, 110*c*: electrode layer, 110*d*: electrode layer, 111: conductive film, 111*a*: conductive film, 111*b*: conductive film, 111*c*: conductive film, 111*d*: conductive film, 111*i*: conductive film, 112: conductive film, 112*a*: conductive film, 112*b*: conductive film, 112*c*: conductive film, 112*d*: conductive film, 112*i*: conductive film, 113: conductive film, 113*a*: conductive film, 113*b*: conductive film, 113*c*: conductive film, 113*d*: conductive film, 113*i*: conductive film, 114: insulating film, 116: insulating film, 118: insulating film, 120*a*: conductive film, 120*b*: conductive film, 121: metal oxide film, 121*a*: metal oxide film, 121*b*: metal oxide film, 122: metal oxide film, 122*a*: metal oxide film, 122*b*: metal oxide film, 140: conductive film, 140*a*: conductive film, 140*b*: conductive film, 141: conductive film, 141*a*: conductive film, 141*b*: conductive film, 141*i*: conductive film, 142: conductive film, 142*a*: conductive film, 142*b*: conductive film, 142*i*: conductive film, 143: conductive film, 143*a*: conductive film, 143*b*: conductive film, 143*i*: conductive film, 150: transistor, 151: transistor, 152: transistor, 153: transistor, 154: transistor, 155: transistor, 156: transistor, 157: transistor, 160: semiconductor device, 161: semiconductor device, 162: semiconductor device, 163: semiconductor device, 170: resist mask, 172: resist mask, 182: etchant, 184: etchant, 200: substrate, 201: insulating film, 202: insulating film, 209: contact hole, 214: impurity region, 215: impurity region, 216: impurity region, 217: impurity region, 222: semiconductor layer, 222*a*: semiconductor layer, 222*b*: semiconductor layer, 225: conductive film, 225*a*: conductive film, 225*b*: conductive film, 225*c*: conductive film, 225*d*: conductive film, 226: conductive film, 226*a*: conductive film, 226*b*: conductive film, 226*c*: conductive film, 226*d*: conductive film, 227: conductive film, 227*a*: conductive film, 227*b*: conductive film, 227*c*: conductive film, 227*d*: conductive film, 228*a*: conductive film, 228*b*: conductive film, 228*c*: conductive film, 228*d*: conductive film, 231: insulating film, 236: insulating film, 237: insulating film, 240*a*: layer, 240*b*: layer, 240*c*: layer, 241: oxide film, 250: transistor, 251: transistor, 252: transistor, 253: transistor, 254: transistor, 255: transistor, 260: semiconductor device, 261: semiconductor device, 262: semiconductor device, 270: conductive film, 270*a*: conductive film, 270*b*: conductive film, 271: conductive film, 271*a*: conductive film, 271*b*: conductive film, 272: conductive film, 272*a*: conductive film, 272*b*: conductive film, 273: conductive film, 273*a*: conductive film, 273*b*: conductive film, 501: pixel circuit, 502: pixel portion, 504: driver circuit portion, 504*a*: gate driver, 504*b*: source driver, 506: protection circuit, 507: terminal portion, 550: transistor, 552: transistor, 554: transistor, 560: capacitor, 562: capacitor, 570: liquid crystal element, 572: light-emitting element, 600: gate driver circuit, 601: shift register unit, 601*a*: shift register unit, 602: shift register unit, 602*a*: shift register unit, 603: demultiplexer circuit, 604: demultiplexer circuit, 605: buffer, 605*a*: buffer, 611: transistor, 612: transistor, 613: transistor, 614: transistor, 615: transistor, 616: transistor, 617: transistor, 618: transistor, 619: capacitor, 621: transistor, 622: transistor, 623: transistor, 624: capacitor, 625: transistor, 709: conductive film, 710: conductive film, 711: conductive film, 712: conductive film, 713: conductive film, 714: insulating film, 2000: semiconductor substrate, 2100: transistor, 2112: insulating layer, 2113: gate electrode, 2114: gate insulating film, 2115: drain region, 2116: sidewall insulating layer, 2207: oxide film, 2212: insulating film, 2213: gate electrode, 2214: gate insulating film, 2215: drain region, 2216: sidewall insulating layer, 2301: insulating layer, 2302: plug, 2303: wiring, 2304: plug, 2305: wiring, 2306: plug, 2307: oxide film, 5000: housing, 5001: display portion, 5002: display portion, 5003: speaker, 5004: LED lamp, 5005: operation keys, 5006: connection terminal, 5007: sensor, 5008: microphone, 5009: switch, 5010: infrared port, 5011: memory medium reading portion, 5012: support, 5013: earphone, 5014: antenna, 5015: shutter button, 5016: image receiving portion, 5017: charger, 5100: pellet, 5120: substrate, 5161: region, 8000: display module, 8001: upper cover, 8002: lower cover, 8003: FPC, 8004: touch panel, 8005: FPC, 8006: display panel, 8007: backlight, 8008: light source, 8009: frame, 8010: printed board, and 8011: battery.

This application is based on Japanese Patent Application serial no. 2013-250449 filed with Japan Patent Office on Dec. 3, 2013, the entire contents of which are hereby incorporated by reference.

The invention claimed is:

1. A semiconductor device comprising:
   a first transistor comprising a first semiconductor film, a source electrode, and a drain electrode; and
   a second transistor comprising a gate electrode,
   wherein each of the source electrode and the drain electrode of the first transistor comprises a first Cu—X alloy film,
   wherein the gate electrode of the second transistor comprises a second Cu—X alloy film,
   wherein X is Mn, Ni, Cr, Fe, Co, Mo, Ta, or Ti,
   wherein the first Cu—X alloy film is covered with a first oxide film comprising X,
   wherein the second Cu—X alloy film is covered with a second oxide film comprising X,
   wherein a part of the first oxide film is directly in contact with the first semiconductor film, and
   wherein another part of the first oxide film is directly in contact with the second oxide film.

2. The semiconductor device according to claim 1, wherein X is Mn.

3. The semiconductor device according to claim 1, wherein a taper angle of one of the source electrode and the drain electrode of the first transistor is greater than or equal to 30° and less than or equal to 70°.

4. A display device comprising the semiconductor device according to claim 1.

5. The semiconductor device according to claim 1,
   wherein the first semiconductor film comprises a first oxide semiconductor film,
   wherein the second transistor further comprises a second oxide semiconductor film, and
   wherein each of the first oxide semiconductor film and the second oxide semiconductor film comprises at least one of indium and zinc.

6. The semiconductor device according to claim 1,
   wherein the first semiconductor film comprises a first oxide semiconductor film, and
   wherein the first transistor further comprises a first metal oxide film over the first oxide semiconductor film, and a second metal oxide film over the first metal oxide film.

7. The semiconductor device according to claim 1,
   wherein the first semiconductor film comprises a first oxide semiconductor film,
   wherein the first transistor further comprises a first gate electrode and a second gate electrode with the first oxide semiconductor film therebetween.

8. A semiconductor device comprising:
a first transistor comprising a first gate electrode and a second gate electrode with a first oxide semiconductor film therebetween, a source electrode, and a drain electrode; and
a second transistor comprising a gate electrode,
wherein each of the source electrode and the drain electrode of the first transistor has a first stacked structure comprising a first Cu—X alloy film,
wherein the gate electrode of the second transistor has a second stacked structure comprising a second Cu—X alloy film,
wherein X is Mn, Ni, Cr, Fe, Co, Mo, Ta, or Ti,
wherein a part of the first Cu—X alloy film is directly in contact with the first oxide semiconductor film, and
wherein another part of the first Cu—X alloy film is directly in contact with the second Cu—X alloy film.

9. The semiconductor device according to claim 8, wherein the first stacked structure further comprises a first Cu film over the first Cu—X alloy film, and a third Cu—X alloy film over the first Cu film.

10. The semiconductor device according to claim 8, wherein the second stacked structure further comprises a second Cu film over the second Cu—X alloy film, and a fourth Cu—X alloy film over the second Cu film.

11. The semiconductor device according to claim 8, wherein X is Mn.

12. The semiconductor device according to claim 8, wherein a taper angle of one of the source electrode and the drain electrode of the first transistor is greater than or equal to 30° and less than or equal to 70°.

13. A display device comprising the semiconductor device according to claim 8.

14. The semiconductor device according to claim 8,
wherein the second transistor further comprises a second oxide semiconductor film, and
wherein each of the first oxide semiconductor film and the second oxide semiconductor film comprises at least one of indium and zinc.

15. The semiconductor device according to claim 8,
wherein the first transistor further comprises a first metal oxide film over the first oxide semiconductor film, and a second metal oxide film over the first metal oxide film.

16. A semiconductor device comprising:
a first transistor comprising a first semiconductor film, a source electrode, and a drain electrode; and
a second transistor comprising a gate electrode,
wherein each of the source electrode and the drain electrode of the first transistor has a first stacked structure comprising a first Cu—X alloy film,
wherein the gate electrode of the second transistor has a second stacked structure comprising a second Cu—X alloy film,
wherein X is Mn, Ni, Cr, Fe, Co, Mo, Ta, or Ti,
wherein the first stacked structure is covered with a first oxide film comprising X,
wherein the second stacked structure is covered with a second oxide film comprising X,
wherein a part of the first oxide film is directly in contact with the first semiconductor film, and
wherein another part of the first oxide film is directly in contact with the second oxide film.

17. The semiconductor device according to claim 16, wherein the first stacked structure further comprises a first Cu film over the first Cu—X alloy film, and a third Cu—X alloy film over the first Cu film.

18. The semiconductor device according to claim 16, wherein the second stacked structure further comprises a second Cu film over the second Cu—X alloy film, and a fourth Cu—X alloy film over the second Cu film.

19. The semiconductor device according to claim 16, wherein X is Mn.

20. The semiconductor device according to claim 16, wherein a taper angle of one of the source electrode and the drain electrode of the first transistor is greater than or equal to 30° and less than or equal to 70°.

21. A display device comprising the semiconductor device according to claim 16.

22. The semiconductor device according to claim 16,
wherein the first semiconductor film comprises a first oxide semiconductor film,
wherein the second transistor further comprises a second oxide semiconductor film, and
wherein each of the first oxide semiconductor film and the second oxide semiconductor film comprises at least one of indium and zinc.

23. The semiconductor device according to claim 16,
wherein the first semiconductor film comprises a first oxide semiconductor film, and
wherein the first transistor further comprises a first metal oxide film over the first oxide semiconductor film, and a second metal oxide film over the first metal oxide film.

24. The semiconductor device according to claim 16,
wherein the first semiconductor film comprises a first oxide semiconductor film, and
wherein the first transistor further comprises a first gate electrode and a second gate electrode with the first oxide semiconductor film therebetween.

* * * * *